United States Patent
Seong et al.

(10) Patent No.: US 12,382,813 B2
(45) Date of Patent: Aug. 5, 2025

(54) COLOR CONVERTING SUBSTRATE AND DISPLAY DEVICE INCLUDING SAME

(71) Applicant: Samsung Display Co., LTD., Yongin-si (KR)

(72) Inventors: Jae Min Seong, Suwon-si (KR); In Ok Kim, Osan-si (KR); Keun Chan Oh, Hwaseong-si (KR); Gak Seok Lee, Hwaseong-si (KR); Sun Kyu Joo, Suwon-si (KR); Byung Chul Kim, Yongin-si (KR); In Seok Song, Pocheon-si (KR); You Sik Shin, Suwon-si (KR); Ji Eun Jang, Suwon-si (KR); Chang Soon Jang, Seoul (KR); Ha Lim Ji, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 402 days.

(21) Appl. No.: 17/797,076

(22) PCT Filed: Jun. 24, 2020

(86) PCT No.: PCT/KR2020/008109
§ 371 (c)(1),
(2) Date: Aug. 2, 2022

(87) PCT Pub. No.: WO2021/157787
PCT Pub. Date: Aug. 12, 2021

(65) Prior Publication Data
US 2023/0051958 A1 Feb. 16, 2023

(30) Foreign Application Priority Data
Feb. 3, 2020 (KR) .......... 10-2020-0012711

(51) Int. Cl.
H10K 59/38 (2023.01)
H10H 20/851 (2025.01)
H10H 29/14 (2025.01)
H10K 59/12 (2023.01)
H10K 59/80 (2023.01)

(52) U.S. Cl.
CPC ......... *H10K 59/38* (2023.02); *H10H 20/8514* (2025.01); *H10H 29/142* (2025.01);
(Continued)

(58) Field of Classification Search
None
See application file for complete search history.

(56) References Cited

U.S. PATENT DOCUMENTS 10,281,767 B2  5/2019 Yoon et al.
10,361,259 B2  7/2019 Choi et al.
(Continued)

FOREIGN PATENT DOCUMENTS

CN  108346681 A  7/2018
JP  2012173459  9/2012
(Continued)

OTHER PUBLICATIONS

International Search Report—PCT/KR2020/008109 dated Oct. 20, 2020.

*Primary Examiner* — Bo B Jang
(74) *Attorney, Agent, or Firm* — CANTOR COLBURN LLP

(57) ABSTRACT

Provided are a color converting substrate and a display device including same. The color converting substrate includes: a base portion in which a first light transmission area, a first light blocking area, and a second light transmission area, which are sequentially and closely arranged in a first direction, are defined; a first wavelength converting pattern located on the base portion and configured to wavelength-covert a first color light into a second color light; a
(Continued)

second wavelength converting pattern located on the base portion and configured to wavelength-convert the first color light into a third color light; and a light transmission pattern located on the base portion and configured to transmit the first color light.

33 Claims, 42 Drawing Sheets

(52) U.S. Cl.
CPC ......... *H10K 59/8792* (2023.02); *H10K 59/12* (2023.02); *H10K 59/8731* (2023.02)

(56) References Cited

U.S. PATENT DOCUMENTS

| | | | |
|---|---|---|---|
| 10,373,978 | B2 | 8/2019 | Lee et al. |
| 10,725,333 | B2 | 7/2020 | Kim et al. |
| 10,866,457 | B2 | 12/2020 | Yoon et al. |
| 11,442,309 | B2 | 9/2022 | Yoon et al. |
| 12,061,390 | B2 | 8/2024 | Yoon et al. |
| 2018/0122869 | A1 | 5/2018 | Jiang |
| 2018/0331316 | A1* | 11/2018 | Lee ........................ H10K 59/124 |
| 2019/0049779 | A1* | 2/2019 | Lee ........................... G02B 5/22 |
| 2019/0320517 | A1 | 10/2019 | Nakanishi et al. |
| 2021/0175291 | A1 | 6/2021 | Joo et al. |
| 2024/0361635 | A1 | 10/2024 | Yoon et al. |

FOREIGN PATENT DOCUMENTS

| | | |
|---|---|---|
| KR | 1020170031613 | 3/2017 |
| KR | 1020180018969 A | 2/2018 |
| KR | 1020180092326 A | 8/2018 |
| KR | 1020180114979 A | 10/2018 |
| KR | 1020180125673 | 11/2018 |
| KR | 1020190016631 | 2/2019 |
| KR | 1020190058130 | 5/2019 |
| KR | 1020190111177 | 10/2019 |

* cited by examiner

BA : BA1, BA2, BA3, BA4, BA5, BA6, BA7

BA : BA1, BA2, BA3, BA4, BA5, BA6, BA7

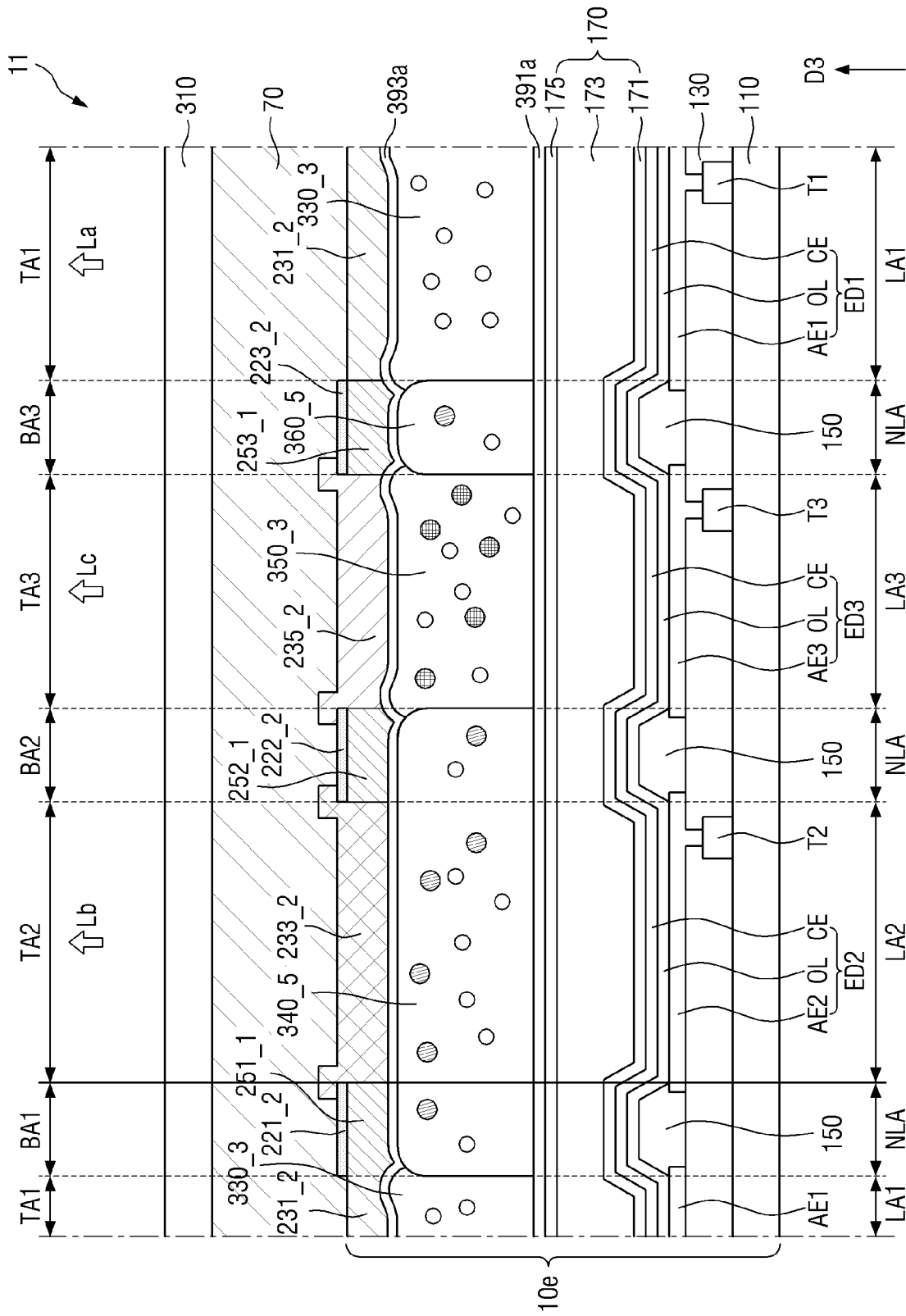

COLOR CONVERTING SUBSTRATE AND DISPLAY DEVICE INCLUDING SAME

TECHNICAL FIELD

The present disclosure relates to a color converting substrate and a display device including the same.

BACKGROUND ART

Display devices are becoming more important with developments in multimedia technology. Accordingly, various display devices such as a liquid crystal display ("LCD") device, an organic light-emitting diode ("OLED") display device, and the like have been used.

A self-luminous display device, which is a type of display device, includes self-luminous elements such as OLEDs. Each of the self-luminous elements may include two electrodes facing each other and an emission layer interposed between the two electrodes. In a case where the self-luminous elements are OLEDs, electrons and holes from the two electrodes may recombine together in the emission layer to generate excitons, and light may be emitted in response to the transition of the excitons from an excited state to a ground state.

The self-luminous display device does not need a separate light source and can thus be implemented as a low-power consumption, thin, light-weight display device with high-quality characteristics such as wide viewing angles, high luminance and contrast, and a fast response speed, drawing attention as a next-generation display device.

As a method to allow each pixel of a display device to display a single primary color, color converting pattern or a wavelength converting pattern may be disposed in each pixel, on the path of light from a light source to a viewer.

DISCLOSURE

Technical Problems

To address the aforementioned problems, exemplary embodiments of the present invention provide a color converting substrate with an improved color mixing prevention.

Exemplary embodiments of the present invention also provide a display device with an improved color mixing prevention Additional advantages, subjects, and features of the invention will be set forth in part in the description which follows and in part will become apparent to those having ordinary skill in the art upon examination of the following or may be learned from practice of the invention.

Technical Solutions

According to an aspect of the present disclosure, a color converting substrate includes: a base portion having, defined thereon, a first light transmission area, a first light blocking area, and a second light transmission area, which are sequentially arranged along a first direction; a first wavelength converting pattern positioned on the base portion and configured to wavelength-convert light of a first color into light of a second color; a second wavelength converting pattern positioned on the base portion and configured to wavelength-convert the light of the first color into light of a third color; and a light transmission pattern positioned on the base portion and configured to transmit the light of the first color therethrough. One of the first wavelength converting pattern, the second wavelength converting pattern, and the light transmission pattern is disposed in the first light-blocking area, another one of the first wavelength converting pattern, the second wavelength converting pattern, and the light transmission pattern is disposed in the first light transmission area, and yet another one of the first wavelength converting pattern, the second wavelength converting pattern, and the light transmission pattern is disposed in the second light transmission area.

The first wavelength converting pattern may be disposed in the first light blocking area, the second wavelength converting pattern is disposed in the first light transmission area, and the light transmission pattern is disposed in the second light transmission area.

The color converting substrate may further include an upper light blocking member disposed in the first light blocking area of the base portion to overlap with the first wavelength converting pattern in a plan view, where the first wavelength converting pattern may be disposed between the upper light blocking member and the base portion.

A third light transmission area, which is spaced apart, along the first direction, from the first light blocking area with the first light transmission area interposed therebetween, may further be defined on the base portion, and the first wavelength converting pattern may be disposed in the third light transmission area of the base portion.

A second light blocking area may further be defined on the base portion, between the third light transmission area and the first light transmission area, the first wavelength converting pattern may further be disposed in the second light blocking area of the base portion, and the upper light blocking member may be disposed to overlap with the first wavelength converting pattern, in the second light blocking area of the base portion.

A third light blocking area, which is spaced apart, along the first direction, from the second light blocking area with the third light transmission area interposed therebetween, may further be defined on the base portion, and the first wavelength converting pattern may be disposed in the third light blocking area of the base portion.

Each of the light transmission areas and each of the light blocking areas may be formed as stripes extending in a second direction intersecting the first direction.

The first color may be blue, the second color may be red, and the third color may be green.

The color converting substrate may further include a lower light blocking member disposed in the first, second, and third light blocking areas of the base portion to overlap with the first wavelength converting pattern in a plan view, in each of the light blocking areas, where the lower light blocking member may be disposed between the base portion and the first wavelength converting pattern.

The lower light blocking member may be disposed directly on the base portion.

The color converting substrate may further include a color filter layer disposed between the base portion and the lower light blocking member, where the color filter layer may include a blue color filter, which is disposed in the first light transmission area, a green color filter, which is disposed in the second light transmission area, and a red color filter, which is disposed in the third light transmission area.

The blue color filter may be further disposed in the first, second, and third light blocking areas and be in direct contact with the lower light blocking member, in each of the light blocking areas.

The first and second wavelength converting patterns may be in contact with each other, and the first wavelength converting pattern and the light transmission pattern may be in contact with each other.

The second wavelength converting pattern and the light transmission pattern may partially cover a bottom surface of the first wavelength converting pattern.

The first wavelength converting pattern may partially cover a bottom surface of the second wavelength converting pattern, and the light transmission pattern may partially cover a bottom surface of the first wavelength converting pattern.

The first wavelength converting pattern may partially cover bottom surfaces of the light transmission pattern and the second wavelength converting pattern.

The first wavelength converting pattern may partially cover a bottom surface of the light transmission pattern, and the second wavelength converting pattern may partially cover a bottom surface of the first wavelength converting pattern.

A fourth light blocking area, which extends in a second direction intersecting the first direction and is arranged along the first direction, may be further defined on the base portion, the first wavelength converting pattern and the upper light blocking member may further be disposed in the fourth light blocking area of the base portion, and each of the first wavelength converting pattern and the upper light blocking member may form a lattice shape in the plan view.

The light transmission pattern may be disposed in the first light blocking area, the first wavelength converting pattern may be disposed in the first light transmission area, and the second wavelength converting pattern may be disposed in the second light transmission area.

The color converting substrate may further include: an upper light blocking member disposed in the first light blocking area of the base portion to overlap with the light transmission pattern, where the light transmission pattern may be disposed between the upper light blocking member and the base portion, a third light transmission area, which is spaced apart, in the first direction, from the first light blocking area with the first light transmission area interposed therebetween, may further be defined on the base portion, and the light transmission pattern may be disposed in the third light transmission area of the base portion.

A second light blocking area, which is between the third light transmission area and the first light transmission area, and a third light blocking area, which is spaced apart, in the first direction, from the first light blocking area with the second light transmission area interposed therebetween, may further be defined on the base portion, the light transmission pattern may further be disposed in the second light blocking area of the base portion, and the upper light blocking member may be disposed to overlap with the first wavelength converting pattern, in the second light blocking area of the base portion.

According to another aspect of the present disclosure, a display device includes: a display substrate; a color converting substrate facing the display substrate; and a filler disposed between the color converting substrate and the display substrate. The display substrate includes a first base portion and light-emitting elements disposed on the first base portion, the color converting substrate includes a second base portion having, defined thereon, a first light transmission area, a first light blocking area, and a second light transmission area, which are sequentially arranged along a first direction, a first wavelength converting pattern positioned on the second base portion and configured to wavelength-convert light of a first color into light of a second color, a second wavelength converting pattern positioned on the second base portion and configured to wavelength-convert the light of the first color into light of a third color, and a light transmission pattern positioned on the second base portion and configured to transmit the light of the first color therethrough, the first wavelength converting pattern is disposed in the first light blocking area, the second wavelength converting pattern is disposed in the first light transmission area, and the light transmission pattern is disposed in the second light transmission area.

The display device may further include an upper light blocking member disposed in the first light blocking area of the base portion to overlap with the first wavelength converting pattern in a plan view, where the first wavelength converting pattern may be disposed between the upper light blocking member and the base portion, a third light transmission area, which is spaced apart, along the first direction, from the first light blocking area with the first light transmission area interposed therebetween, may further be defined on the base portion, and the first wavelength converting pattern may be disposed in the third light transmission area of the base portion.

The display device may further include a thin-film encapsulation layer disposed between the light-emitting elements and the filler.

According to still another aspect of the present disclosure, a display device includes: a base portion having, defined thereon, a first light transmission area, a first light blocking area, and a second light transmission area, which are sequentially arranged along a first direction; light-emitting elements disposed on the base portion; a first wavelength converting pattern positioned on the base portion and configured to wavelength-convert light of a first color into light of a second color; a second wavelength converting pattern positioned on the base portion and configured to wavelength-convert the light of the first color into light of a third color; and a light transmission pattern positioned on the base portion and configured to transmit the light of the first color therethrough, where the first wavelength converting pattern is disposed in the first light blocking area, the second wavelength converting pattern is disposed in the first light transmission area, and the light transmission pattern is disposed in the second light transmission area.

A third light transmission area, which is spaced apart, in the first direction, from the first light blocking area with the first light transmission area interposed therebetween, may further be defined on the base portion, and the first wavelength converting pattern is disposed in the third light transmission area of the base portion.

A second light blocking area, which is between the third light transmission area and the first light transmission area, may further be defined on the base portion, and the first wavelength converting pattern may further be disposed in the second light blocking area of the base portion.

A third light transmission area, which is spaced apart, in the first direction, from the second light blocking area with the third light transmission area interposed therebetween, may further be defined on the base portion, and the first wavelength converting pattern is disposed in the third light blocking area of the base portion.

Each of the light transmission areas and each of the light blocking areas may be formed as stripes extending in a second direction intersecting the first direction.

The first color may be blue, the second color may be red, and the third color may be green.

The display device may further include a first color filter spaced apart from the light-emitting elements with the first wavelength converting pattern interposed therebetween, in the first light blocking area, a second color filter spaced apart from the light-emitting elements with the second wavelength converting patterns interposed therebetween, in the first light transmission area, and a third color filter spaced apart from the light-emitting elements with the light transmission pattern interposed therebetween, in the second light transmission area, where the third color filter may extend into the first light blocking area and is disposed to overlap with the first color filter in a plan view.

In the second light blocking area, the third color filter may be disposed on the first color filter to overlap with the first color filter in the plan view.

A third light blocking area, which is spaced apart, along the first direction, from the second light blocking area with the third light transmission area interposed therebetween, may further be defined on the base portion, and in the third light blocking area, the third color filter may be disposed on the first color filter to overlap with the first color filter in the plan view.

The third light blocking area, the third light transmission area, the second light blocking area, the first light transmission area, the first light blocking area, and the second light transmission area may be repeatedly arranged, and the third color filter in the third light blocking area and the third color filter in the second light transmission area adjacent to the third light blocking area may be physically connected.

The third light blocking area, the third light transmission area, the second light blocking area, the first light transmission area, the first light blocking area, and the second light transmission area may be repeatedly arranged, the first color filter in the third light blocking area may extend into the second light transmission area adjacent to the third light blocking area, and the third color filter in the third light blocking area and the third color filter in the second light transmission area adjacent to the third light blocking area may be physically spaced apart from each other.

Detailed contents of other embodiments are described in a detailed description and are illustrated in the drawings.

Advantageous Effects

According to the color conversion substrate and the display device according to the embodiment of the present invention, sagging or inclination of the upper light blocking member for preventing color mixing is prevented, so that color mixing can be prevented.

The effects of the present disclosure are not limited to the aforementioned effects, and various other effects are included in the present specification.

BRIEF DESCRIPTION OF DRAWINGS

FIG. 42 is a cross-sectional view of a display device according to another embodiment of the present disclosure.

BEST MODES FOR CARRYING OUT THE INVENTION

Figure 1:
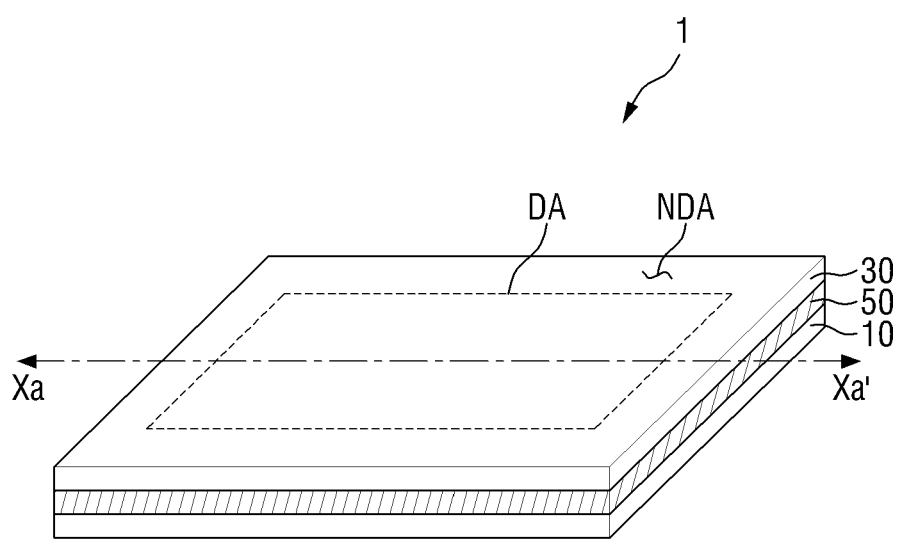
FIG. 1 is a perspective view of a display device according to an embodiment of the present disclosure.
Figure 1:
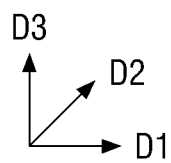

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein; rather, these exemplary embodiments are provided so that this invention will be thorough and complete and will fully convey the concept of the invention to those skilled in the art, and the present invention will only be defined by the appended claims.

When an element or layer is disposed "on" another element or layer, it may be directly disposed on another element or layer, or another layer or another element may be interposed therebetween.

Spatially relative terms 'below', 'beneath', 'lower', 'above', 'upper', etc. It can be used to easily describe a correlation between an element or components and other elements or components. A spatially relative term should be understood as a term that includes different directions of the device when used in addition to the directions shown in the drawings. For example, when an element shown in the drawing is turned over, an element described as 'below or beneath' of another element may be placed 'above' of the other element. Accordingly, the exemplary term 'below' may include both the downward and upward directions.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The embodiments described herein will be described with reference to plan and cross-sectional views, which are ideal schematic views of the present invention. Accordingly, the shape of the illustrative drawing may be modified due to manufacturing technology and/or tolerance. Accordingly, the embodiments of the present invention are not limited to the specific form shown, but also include changes in the form generated according to the manufacturing process. Accordingly, the regions illustrated in the drawings have schematic properties, and the shapes of the regions illustrated in the drawings are intended to illustrate specific shapes of regions of the device, and not to limit the scope of the invention.

Hereinafter, embodiments of the present disclosure will be described with reference to the attached drawings.

Figure 2:
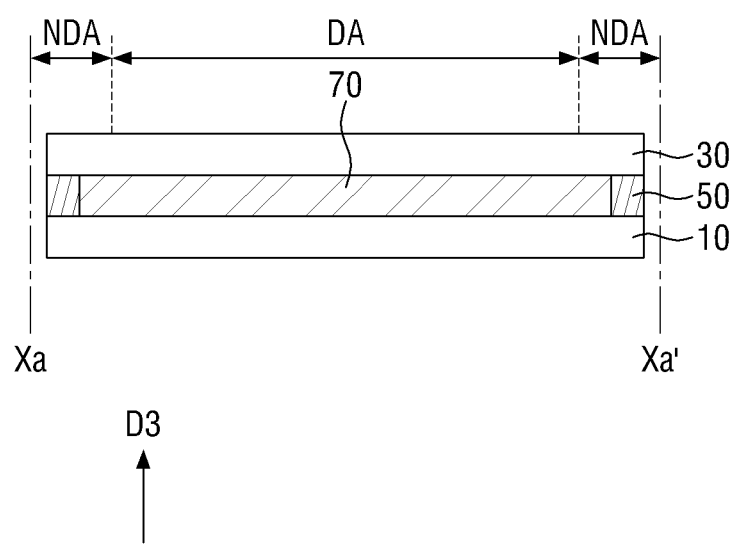
FIG. 2 is a schematic cross-sectional view taken along line Xa-Xa' of FIG. 1.
Figure 3:
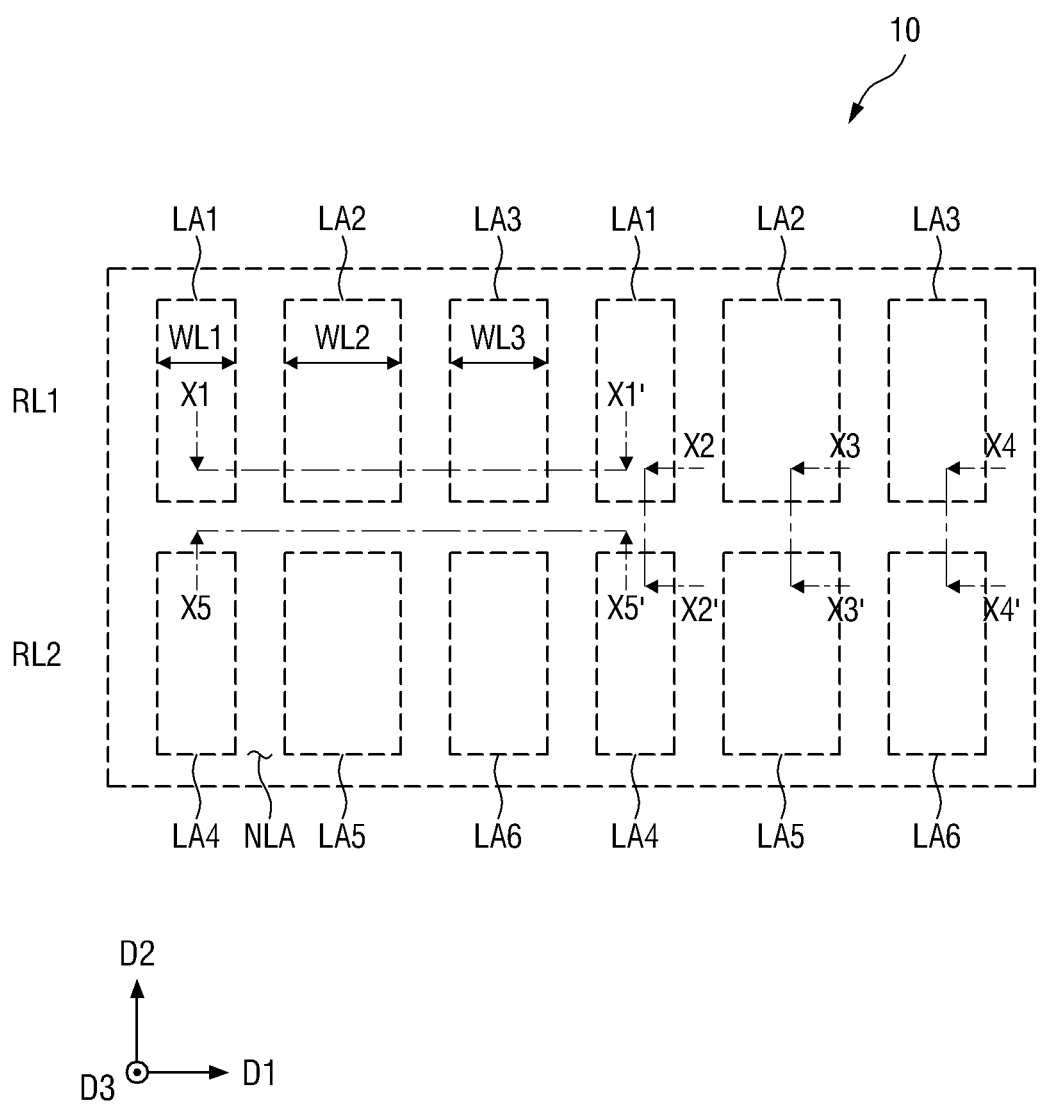
FIG. 3 is a schematic plan view of a display substrate in a display area of the display device of FIGS. 1 and 2.

FIG. 1 is a perspective view of a display device according to an embodiment of the present disclosure, FIG. 2 is a schematic cross-sectional view taken along line Xa-Xa' of FIG. 1, and FIG. 3 is a schematic plan view of a display substrate of FIGS. 1 and 2, particularly, a display substrate in a display area of the display device of FIGS. 1 and 2. As used herein, the "plan view" may be defined as a view from the third direction D3.

Referring to FIGS. 1 through 3, a display device 1 may be applicable to various electronic devices, for example, a mid- to small-size electronic device such as a tablet personal computer ("PC"), a smartphone, a vehicular navigation unit, a camera, the center information display ("CID") of a vehicle, a wristwatch-type electronic device, a personal digital assistant ("PDA"), a portable multimedia player ("PMP"), or a gaming console and a mid- to large-size electronic device such as a television ("TV"), an electronic billboard, a monitor, a PC, or a notebook computer, but the present disclosure is not limited thereto. That is, the display device 1 may also be applicable to various other electronic devices without departing from the concept of the present invention.

In some embodiments, the display device 1 may have a rectangular shape in a plan view. The display device 1 may have two first sides extending in a first direction D1 and two second sides extending in a second direction D2. The corners where the first sides and the second sides of the display device 1 meet may be right-angled, but the present disclosure is not limited thereto. Alternatively, the corners where the first sides and the second sides of the display device 1 meet may be curved. In some embodiments, each of the first sides may be shorter than each of the second sides, but the present disclosure is not limited thereto. The planar shape of the display device 1 is not particularly limited, and the display device 1 may have a circular shape or another shape.

The display device 1 may include a display area DA, which displays an image, and a non-display area NDA, which does not display an image. In some embodiments, the non-display area NDA may be positioned around the display area DA and may surround the display area DA.

Unless specified otherwise, the terms "on," "upper," "above," "top," and "top surface," as used herein, may refer to a third direction D3, which intersects first and second directions D1 and D2, and the terms "below," "lower," "bottom," and "bottom surface," as used herein, may refer to the opposite direction of the third direction D3. "A covers a bottom surface of B" may mean that A covers a bottom surface of B under B.

In some embodiments, the display device 1 may include a display substrate 10, a color converting substrate 30, which faces the display substrate 10, a sealing portion 50, which couples the display substrate 10 and the color converting substrate 30, and a filler 70, which is filled between the display substrate 10 and the color converting substrate 30.

The display substrate 10 may include elements and circuits for displaying an image, such as, for example, pixel circuits (e.g., switching elements), a pixel defining film, which defines, in the display area DA, light-emitting areas and a non-light-emitting area that will be described later, and self-light-emitting elements. For example, the self-light-emitting elements may include organic light-emitting diodes, quantum-dot light-emitting diodes, inorganic material-based micro-light-emitting diodes (microLEDs), and/or inorganic material-based nano-light-emitting diodes (nanoLEDs). For convenience, the self-light-emitting elements will hereinafter be described as being, for example, OLEDs.

The color converting substrate 30 may be positioned on the display substrate 10 and may face the display substrate 10. In some embodiments, the color converting substrate 30 may include color converting patterns for converting the color of incident light. In some embodiments, the color converting patterns may include color filters and/or wavelength converting patterns.

The sealing portion 50 may be positioned between the display substrate 10 and the color converting substrate 30, in the non-display area NDA. The sealing portion 50 may be disposed along the edges of each of the display substrate 10 and the color converting substrate 30, in the non-display area NDA, to surround the display area DA in a plan view. The display substrate 10 and the color converting substrate 30 may be coupled to each other via the sealing portion 50.

In some embodiments, the sealing portion 50 may be formed of or include an organic material. For example, the sealing portion 50 may be formed of or include an epoxy resin, but the present disclosure is not limited thereto.

The filler 70 may be positioned in the space between the display substrate 10 and the color converting substrate 30, surrounded by the sealing portion 50. The filler 70 may fill the gap between the display substrate 10 and the color converting substrate 30.

In some embodiments, the filler 70 may be formed of or include a material capable of transmitting light therethrough. In some embodiments, the filler 70 may be formed of or include an organic material. For example, the filler 70 may be formed of or include a silicone-based organic material or an epoxy-based organic material, but the present disclosure is not limited thereto. In some embodiments, the filler 70 may not be provided.

Figure 4:
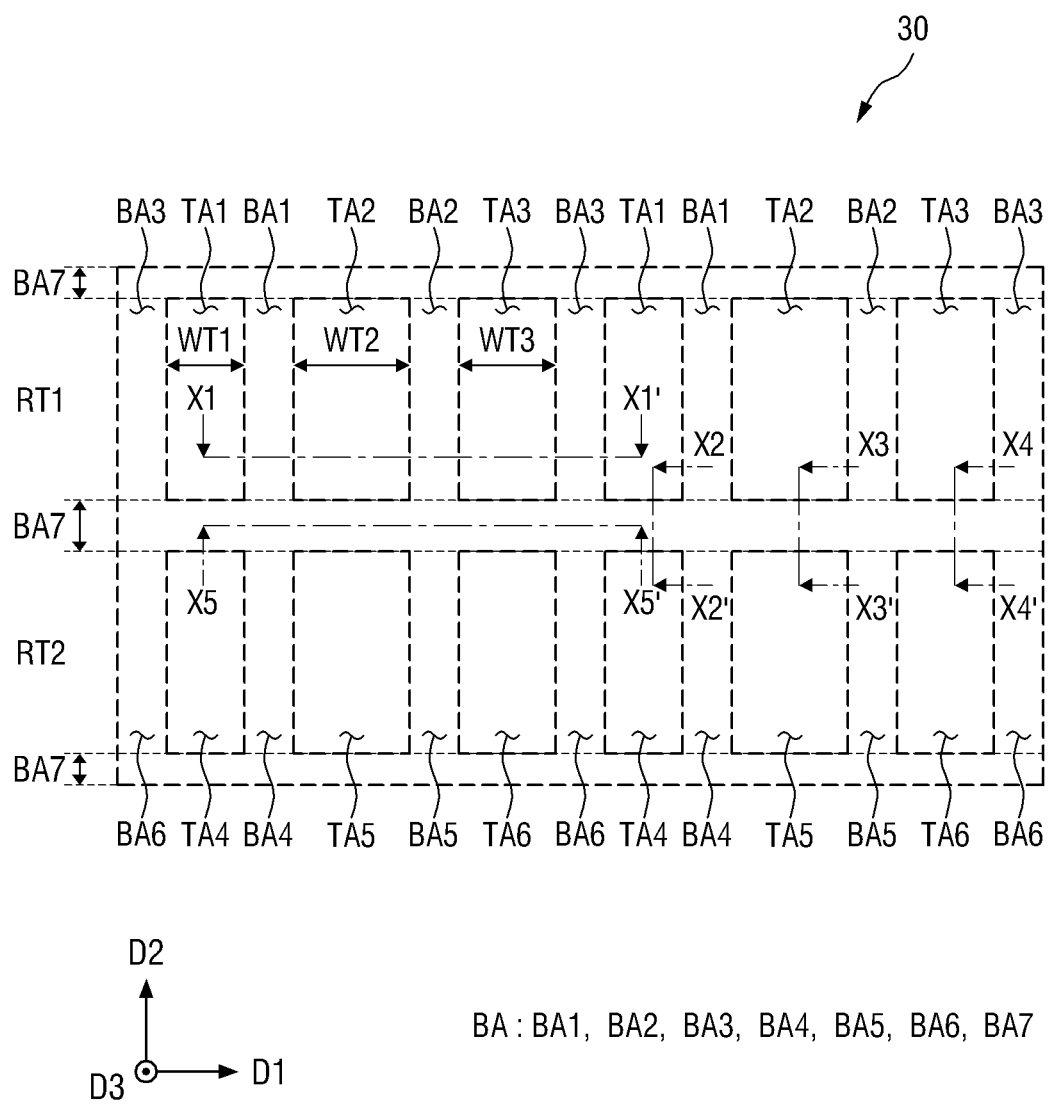
FIG. 4 is a schematic plan view of a color converting substrate in the display area of the display device of FIGS. 1 and 2.

FIG. 3 is a plan view of the display substrate in the display area of the display device of FIGS. 1 and 2, and FIG. 4 is a plan view of a color converting substrate in the display area of the display device of FIGS. 1 and 2.

Referring to FIGS. 3 and 4 and further to FIGS. 1 and 2, a plurality of light-emitting areas (LA1, LA2, LA3, LA4, LA5, and LA6) and non-light-emitting areas NLA may be defined in the display area DA of the display substrate 10. The light-emitting areas (LA1, LA2, LA3, LA4, LA5, and LA6) may be regions where light generated by light-emitting elements is released to the outside of the display substrate 10, and the non-light-emitting areas NLA may be regions where light is not released to the outside of the display substrate 10.

In some embodiments, light emitted from the light-emitting areas (LA1, LA2, LA3, LA4, LA5, and LA6) to the outside of the display substrate 10 may be light of a first color. In some embodiments, light of the first color may be blue light and may have a peak wavelength of about 440 nanometers (nm) to about 480 nm.

In some embodiments, in a first row RL1 of a display substrate 10, in the display area DA, first light-emitting areas LA1, second light-emitting areas LA2, and third light-emitting areas LA3 may be sequentially arranged along the first direction D1. Also, in a second row RL2, which is adjacent to the first row RL1 in the second direction D2, fourth light-emitting areas LA4, fifth light-emitting areas LA5, and sixth light-emitting areas LA6 may be sequentially arranged along the first direction D1.

In some embodiments, a first width WL1, in the first direction D1, of the first light-emitting areas LA1 may be less than each of a second width WL2, in the first direction D1, of the second light-emitting areas LA2 and a third width WL3, in the first direction D1, of the third light-emitting areas LA3. In some embodiments, the second width WL2 of the second light-emitting areas LA2 and the third width WL3 of the third light-emitting areas LA3 may differ from each other. For example, the second width WL2 of the second light-emitting areas LA2 may be greater than the third width WL3 of the third light-emitting areas LA3. Also, in some embodiments, the size of the first light-emitting areas LA1 may be less than each of the sizes of the second light-emitting areas LA2 and the third light-emitting areas LA3. The size of the second light-emitting areas LA2 may be less than, or greater than, the size of the third light-emitting areas LA3. However, the present disclosure is not limited to these examples. In other embodiments, the first width WL1, in the first direction D1, of the first light-emitting areas LA1, the second width WL2, in the first direction D1, of the second light-emitting areas LA2, and the third width WL3, in the first direction D1, of the third light-emitting areas LA3 may be substantially the same. In other embodiments, the first light-emitting areas LA1, the second light-emitting areas LA2, and the third light-emitting areas LA3 may all have substantially the same size.

The fourth light-emitting areas LA4 may have substantially the same width, size, and configuration as the first light-emitting areas LA1, which are adjacent to the fourth light-emitting areas LA4 in the second direction D2, except that they are positioned in the second row RL2.

Similarly, the second light-emitting areas LA2 and the fifth light-emitting areas LA5, which are adjacent to the second light-emitting areas LA2 in the second direction D2, may have substantially the same configuration, and the third light-emitting areas LA3 and the sixth light-emitting areas LA6, which are adjacent to the third light-emitting areas LA3 in the second direction D2, may have substantially the same configuration.

In the display area DA, a plurality of light transmission areas (TA1, TA2, TA3, TA4, TA5, and TA6) and light blocking areas BA may be defined on the color converting substrate 30. The light transmission areas (TA1, TA2, TA3, TA4, TA5, and TA6) may be areas that provide light emitted from the display substrate 10 to the outside of the display device 1 through the color converting substrate 30. The light blocking areas BA may be areas that block the transmission of the light emitted from the display substrate 10 therethrough.

In some embodiments, in a first row RT1 of the color converting substrate 30, in the display area DA, first light transmission areas TA1, second light transmission areas TA2, and third light transmission areas TA3 may be sequentially arranged along the first direction D1. The first light transmission areas TA1 may correspond to, or overlap with, the first light-emitting areas LA1 in a plan view. Similarly, the second light transmission areas TA2 may correspond to, or overlap with, the second light-emitting areas LA2 in a plan view, and the third light transmission areas TA3 may correspond to, or overlap with, the third light-emitting areas LA3 in a plan view.

In some embodiments, light of the first color provided by the display substrate 10 may be provided to the outside of the display device 1 through the first light transmission areas TA1, the second light transmission areas TA2, and the third light transmission areas TA3. When light emitted from the first light transmission areas TA1 to the outside of the display device 1 is referred to as first emission light, light emitted from the second light transmission areas TA2 to the outside of the display device 1 is referred to as second emission light, and light emitted from the third light transmission areas TA3 to the outside of the display device 1 is referred to as third emission light. The third emission light may be light of the first color, the second emission light may be light of a second color, which is different from the first color, and the first emission light may be light of a third color, which is different from the first and second colors. As already mentioned above, in some embodiments, light of the first color may be blue light having a peak wavelength of about 440 nm to about 480 nm, light of the second color may be red light having a peak wavelength of about 610 nm to about 650 nm, and light of the third color may be green light having a peak wavelength of about 510 nm to about 550 nm.

In a second row RT2, which is adjacent to the first row RT1 in the second direction D2, fourth light transmission areas TA4, fifth light transmission areas TA5, and sixth light transmission areas TA6 may be sequentially arranged along the first direction D1. The fourth light transmission areas TA4 may correspond to, or overlap with, the fourth light-emitting areas LA4 in a plan view, the fifth light transmission areas TA5 may correspond to, or overlap with, the fifth light-emitting areas LA5 in a plan view, and the sixth light transmission areas TA6 may correspond to, or overlap with, the sixth light-emitting areas LA6 in a plan view.

In some embodiments, similarly to the relationship between the widths of the first light-emitting areas LA1, the second light-emitting areas LA2, and the third light-emitting areas LA3, a first width WT1, in the first direction D1, of the first light transmission areas TA1 may be greater than each of a second width WT2, in the first direction D1, of the second light transmission areas TA2 and a third width WT3, in the first direction D1, of the third light transmission areas TA3. In some embodiments, the second width WT2 of the second light transmission areas TA2 and the third width WT3 of the third light transmission areas TA3 may differ from each other. For example, the second width WT2 of the second light transmission areas TA2 may be greater than the third width WT3 of the third light transmission areas TA3. Also, in some embodiments, the size of the first light transmission areas TA1 may be less than, or greater than, each of the sizes of the second light transmission areas TA2 and the third light transmission areas TA3.

The width, size, and configuration of the first light transmission areas TA1 and the color of light emitted out of the display device 1 through the first light transmission areas TA1 may be substantially the same as the width, size, and configuration of the fourth light transmission areas TA4, which are adjacent to the first light transmission areas TA1 in the second direction D2 and the color of light emitted out of the display device 1 through the fourth light transmission areas TA4.

Similarly, the width, size, and configuration of the second light transmission areas TA2 and the color of light emitted out of the display device 1 through the second light transmission areas TA2 may be substantially the same as the width, size, and configuration of the fifth light transmission areas TA5, which are adjacent to the second light transmission areas TA2 in the second direction D2 and the color of light emitted out of the display device 1 through the fifth light transmission areas TA5. Also, similarly, the width, size, and configuration of the third light transmission areas TA3 and the color of light emitted out of the display device 1 through the third light transmission areas TA3 may be substantially the same as the width, size, and configuration of the sixth light transmission areas TA6, which are adjacent to the third light transmission areas TA3 in the second direction D2 and the color of light emitted out of the display device 1 through the sixth light transmission areas TA6.

The light blocking areas BA may be positioned around the light transmission areas (TA1, TA2, TA3, TA4, TA5, and TA6), in the display area DA of the color converting substrate 30. In some embodiments, the light blocking areas BA may include first light blocking areas BA1, second light blocking areas BA2, third light blocking areas BA3, fourth light blocking areas BA4, fifth light blocking areas BA5, sixth light blocking areas BA6, and seventh light blocking areas BA7.

The first light blocking areas BA1 may be positioned between the first light transmission areas TA1 and the second light transmission areas TA2, along the first direction D1, the second light blocking areas BA2 may be positioned between the second light transmission areas TA2 and the third light transmission areas TA3, along the first direction D1, and the third light blocking areas BA3 may be positioned between the third light transmission areas TA3 and the first light transmission areas TA1, along the first direction D1.

The fourth light blocking areas BA4 may be positioned between the fourth light transmission areas TA4 and the fifth light transmission areas TA5, along the first direction D1, the fifth light blocking areas BA5 may be positioned between the fifth light transmission areas TA5 and the sixth light transmission areas TA6, along the first direction D1, and the sixth light blocking areas BA6 may be positioned between the sixth light transmission areas TA6 and the fourth light transmission areas TA4, along the first direction D1.

One of the seventh light blocking areas BA7 may be positioned between the first and second rows RT1 and RT2, which are adjacent to each other in the second direction D2.

The structure of the display device 1 will hereinafter be described in detail.

Figure 5:
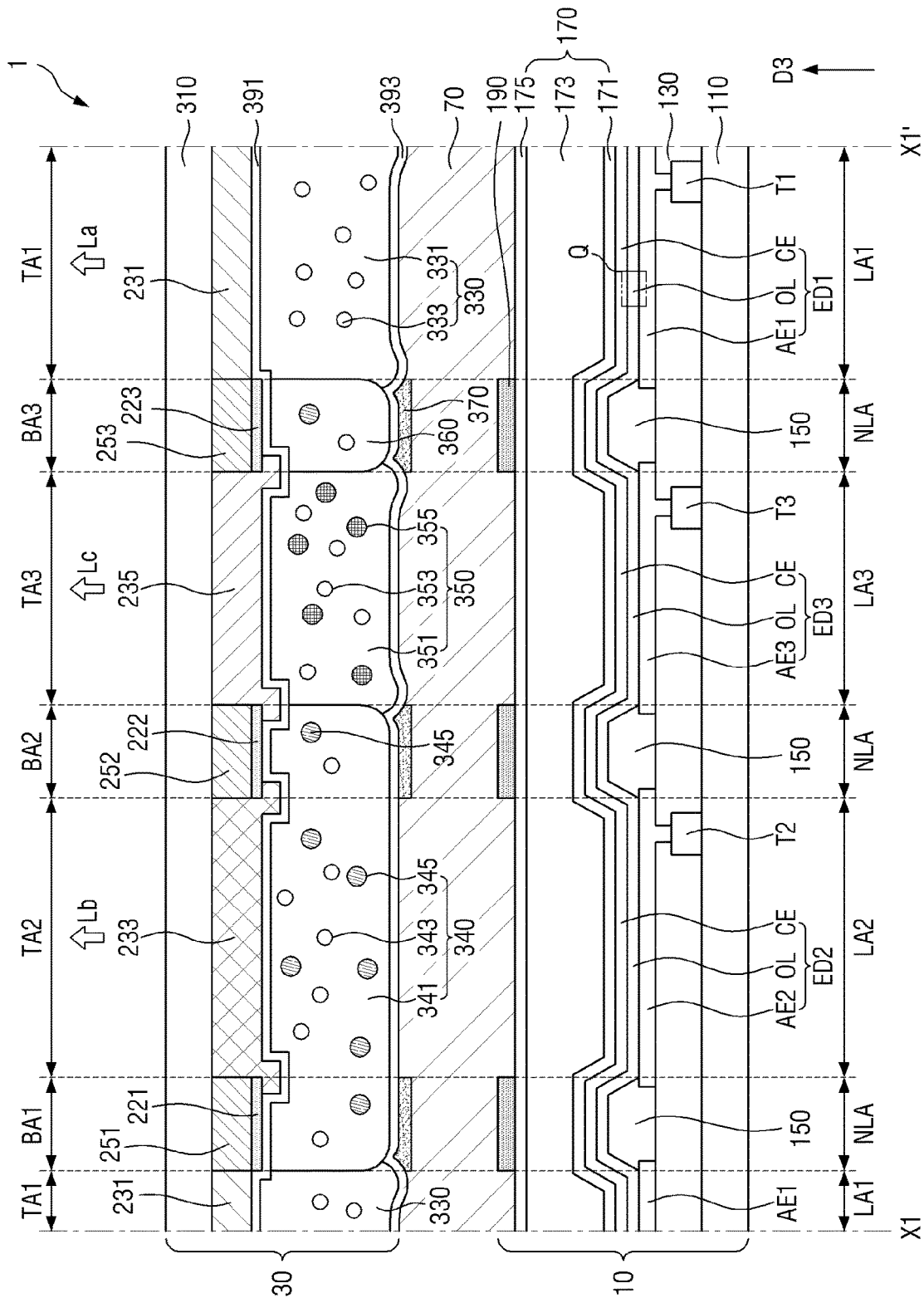
FIG. 5 is a cross-sectional view taken along line X1-X1' of FIGS. 3 and 4.
Figure 6:
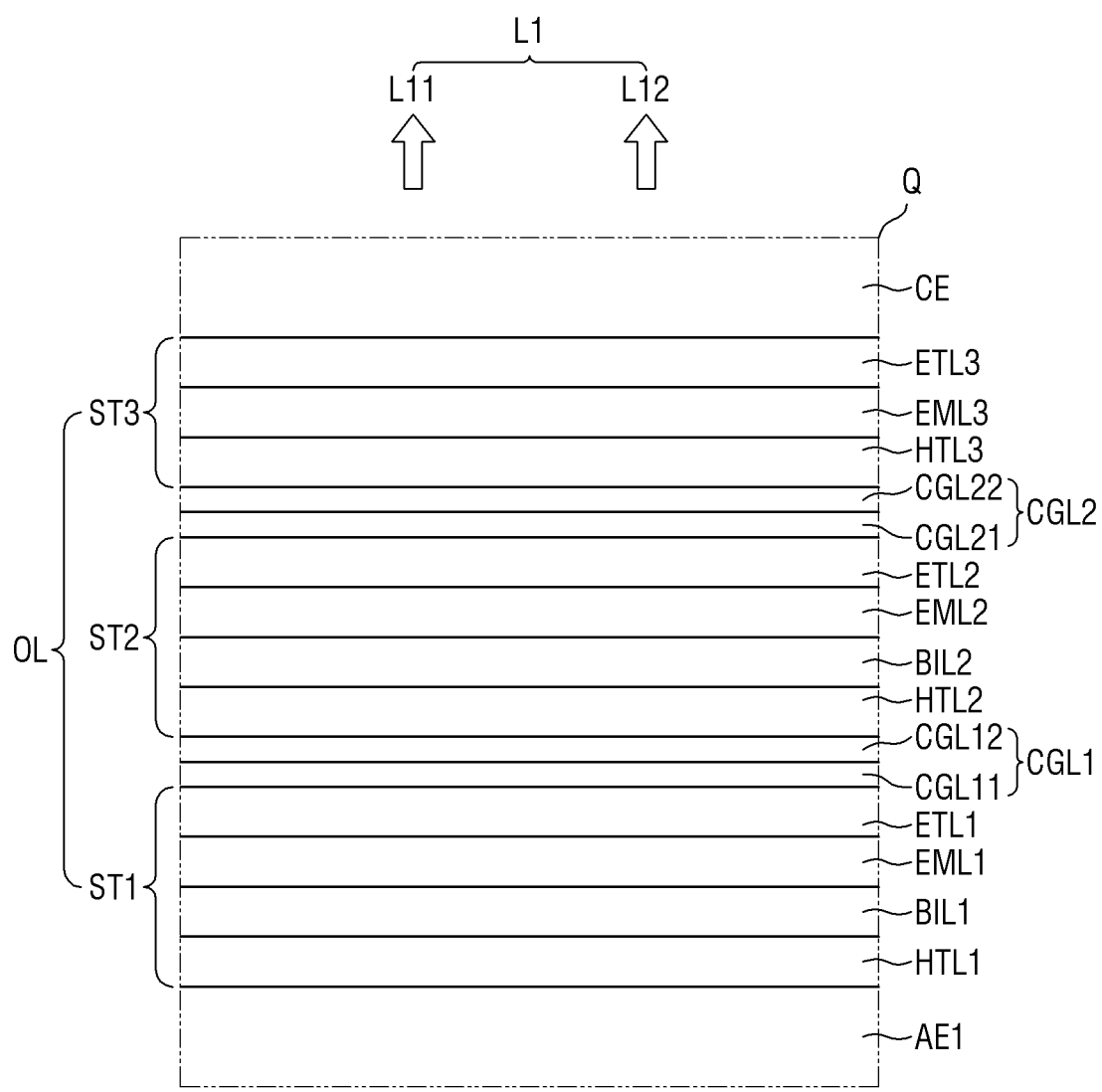
FIG. 6 is an enlarged cross-sectional view of part Q of FIG. 5.
Figure 7:
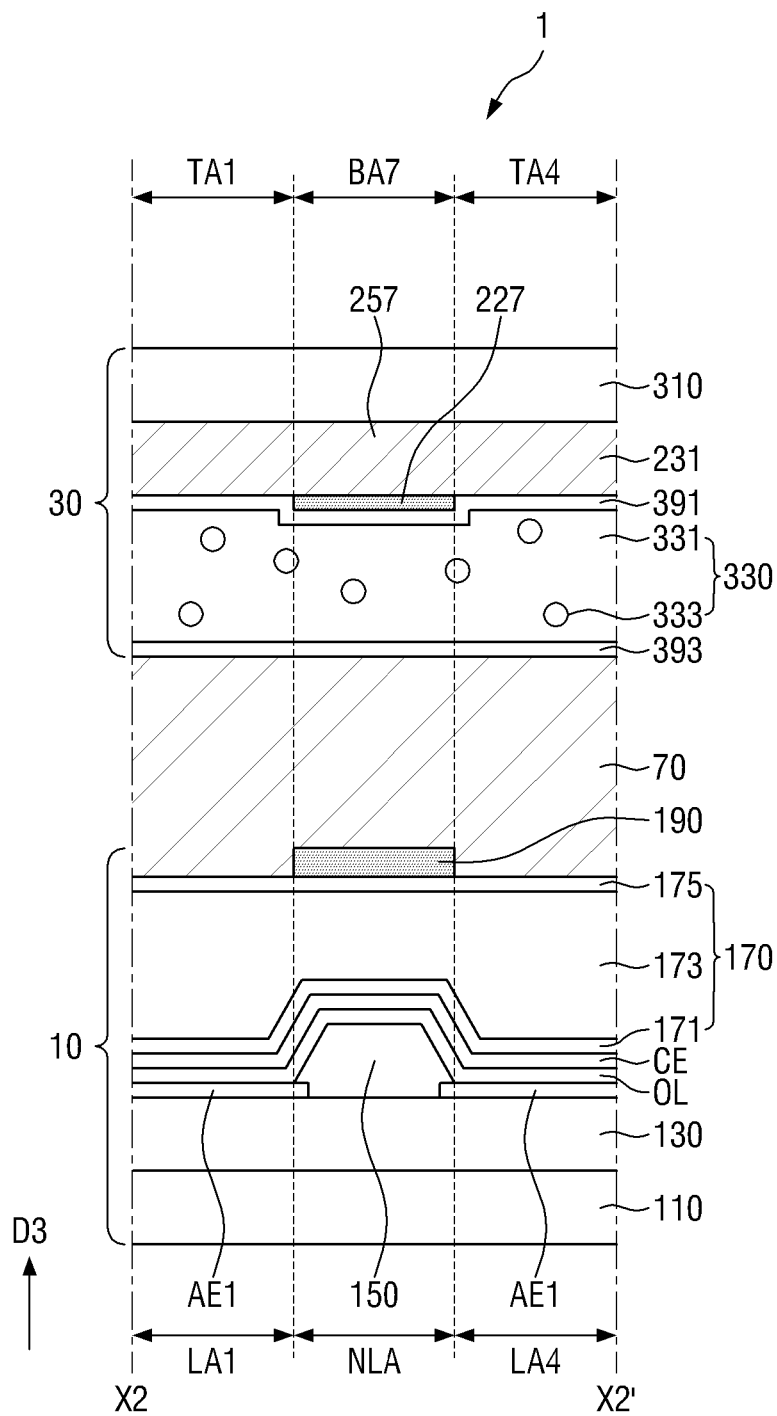
FIG. 7 is a cross-sectional view taken along line X2-X2' of FIGS. 3 and 4.
Figure 8:
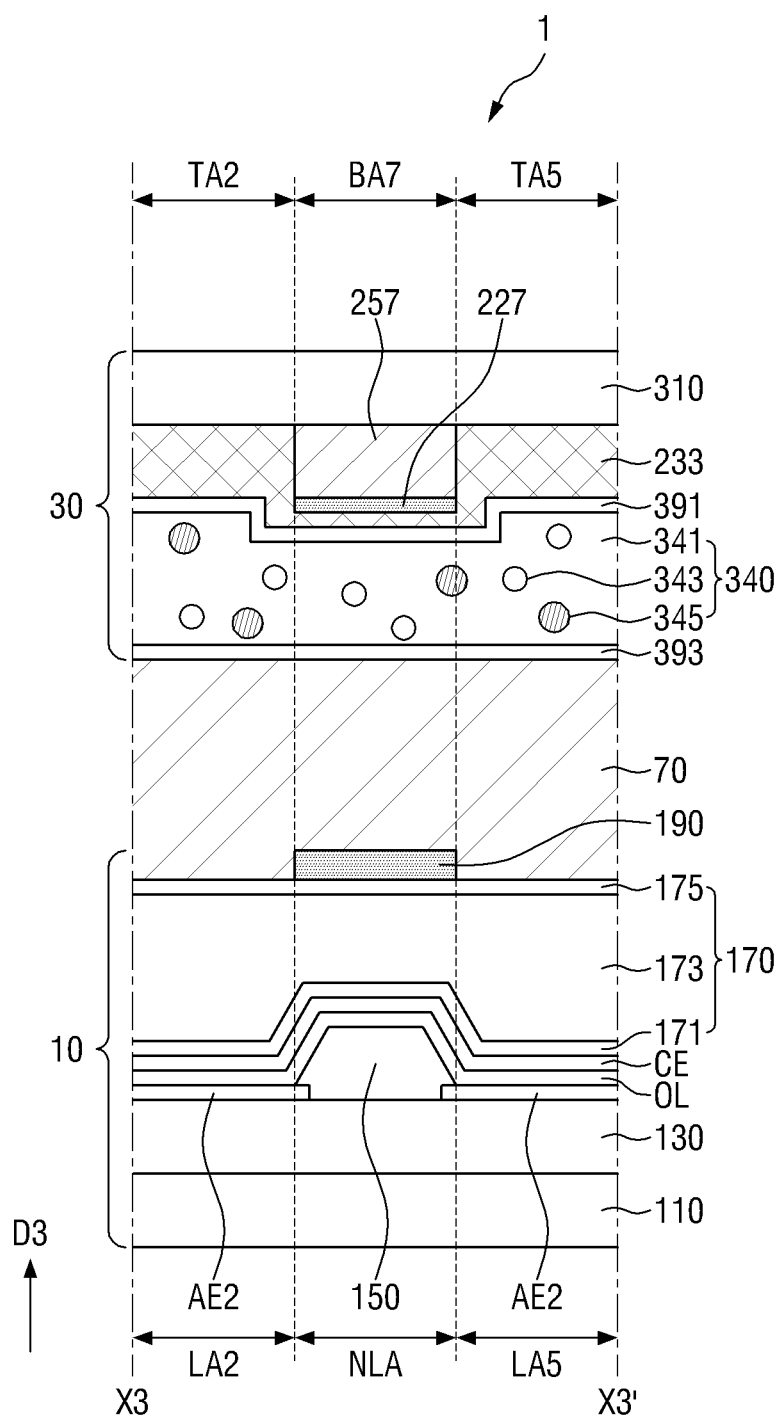
FIG. 8 is a cross-sectional view taken along line X3-X3' of FIGS. 3 and 4.
Figure 9:
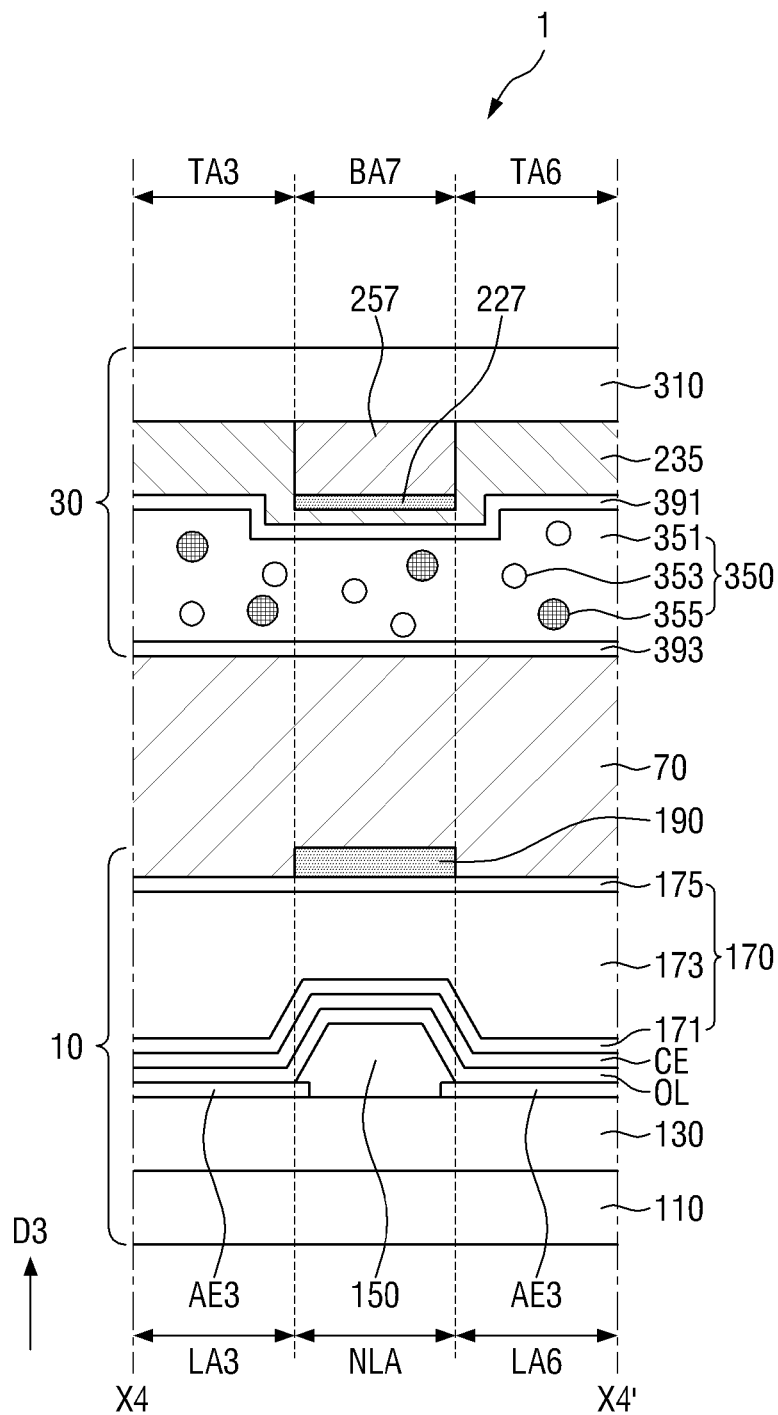
FIG. 9 is a cross-sectional view taken along line X4-X4' of FIGS. 3 and 4.
Figure 10:
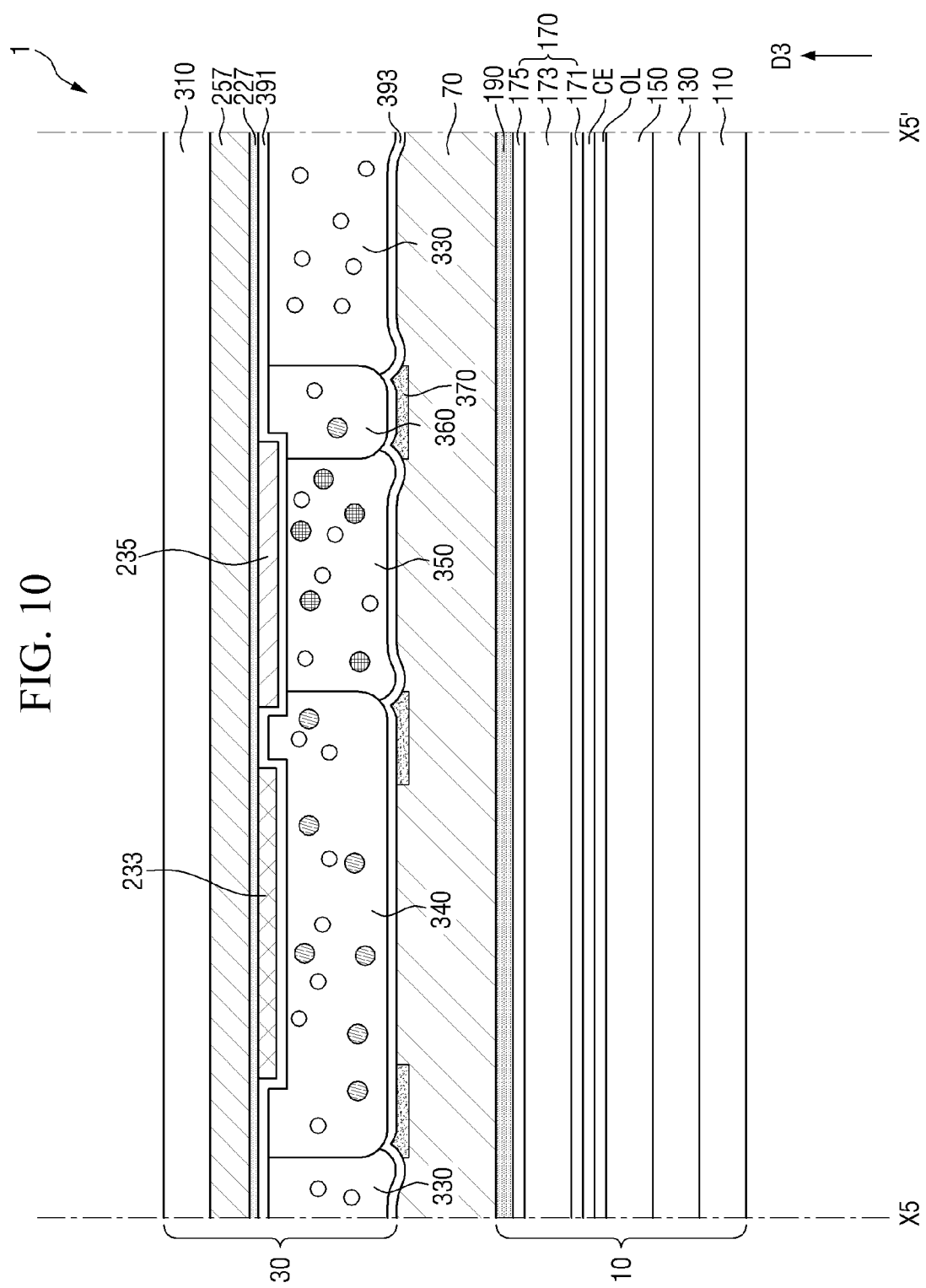
FIG. 10 is a cross-sectional view taken along line X5-X5' of FIGS. 3 and 4.

FIG. 5 is a cross-sectional view taken along line X1-X1' of FIGS. 3 and 4. FIG. 6 is an enlarged cross-sectional view of part Q of FIG. 5. FIG. 7 is a cross-sectional view taken along line X2-X2' of FIGS. 3 and 4. FIG. 8 is a cross-sectional view taken along line X3-X3' of FIGS. 3 and 4. FIG. 9 is a cross-sectional view taken along line X4-X4' of FIGS. 3 and 4. FIG. 10 is a cross-sectional view taken along line X5-X5' of FIGS. 3 and 4.

Referring to FIGS. 5 through 10 and further to FIGS. 3 and 4, the display device 1 may include the display substrate 10 and the color converting substrate 30, as described above, and may further include the filler 70, which is positioned between the display substrate 10 and the color converting substrate 30.

The display substrate 10 will hereinafter be described in detail. The display substrate 10 may include a first base portion 110, an insulating film 130, a pixel defining film 150, a thin-film encapsulation layer 170, and display light blocking members 190.

The first base portion 110 may be formed of or include a material having a light-transmitting property. In some embodiments, the first base portion 110 may be a glass substrate or a plastic substrate. In a case where the first base portion 110 is a plastic substrate, the first base portion 110 may have flexibility. In some embodiments, the first base portion 110 may include a glass or plastic substrate and may further include a separate layer such as, for example, a buffer layer or an insulating layer.

In some embodiments, as already mentioned above, the light-emitting areas (LA1, LA2, LA3, LA4, LA5, and LA6) and the non-light-emitting areas NLA may be defined on the first base portion 110.

As illustrated in FIG. 5, the switching elements (T1, T2, and T3) may be disposed on the first base portion 110. In some embodiments, first switching elements T1 may be positioned in the first light-emitting areas LA1, second switching elements T2 may be positioned in the second light-emitting areas LA2, and third switching elements T3 may be positioned in the third light-emitting areas LA3. However, the present disclosure is not limited to this. In other embodiments, the first switching elements T1, the second switching elements T2, and/or the third switching elements T3 may be positioned in the non-light-emitting areas NLA.

In some embodiments, the first switching elements T1, the second switching elements T2, and the third switching elements T3 may be thin-film transistors including polysilicon or an oxide semiconductor.

Although not specifically illustrated, a plurality of signal lines (e.g., gate lines, data lines, and power lines) for transmitting signals to each switching element may be further disposed on the first base portion 110.

The insulating film 130 may be disposed on the first switching elements T1, the second switching elements T2, and the third switching elements T3. In some embodiments, the insulating film 130 may be a planarization film. In some embodiments, the insulating film 130 may be formed as an organic film. For example, the insulating film 130 may include an acrylic resin, an epoxy resin, an imide resin, or an ester resin. In some embodiments, the insulating film 130 may include a positive photosensitive material or a negative photosensitive material.

As illustrated in FIGS. 5 and 7 through 9, first anode electrodes AE1, second anode electrodes AE2, and third anode electrodes AE3 may be disposed on the insulating film 130. The first anode electrodes AE1 may be positioned in the first light-emitting areas LA1 and may extend at least in part into the non-light-emitting areas NLA. The second anode electrodes AE2 may be positioned in the second light-emitting areas LA2 and may extend at least in part into the non-light-emitting areas NLA, and the third anode electrodes AE3 may be positioned in the third light-emitting areas LA3 and may extend at least in part into the non-light-emitting areas NLA. The first anode electrodes AE1 may be connected to the first switching elements T1 through the insulating film 130, the second anode electrodes AE2 may be connected to the second switching elements T2 through the insulating film 130, and the third anode electrodes AE3 may be connected to the third switching elements T3 through the insulating film 130.

In some embodiments, the first anode electrodes AE1, the second anode electrodes AE2, and the third anode electrodes AE3 may have different widths or areas. For example, the width of the first anode electrodes AE1 may be less than the width of the second anode electrodes AE2, and the width of the third anode electrodes AE3 may be less than the width of the second anode electrodes AE2, but greater than the width of the first anode electrodes AE1. Also, the area of the first anode electrodes AE1 may be less than the area of the second anode electrodes AE2, and the area of the third anode electrodes AE3 may be less than the area of the second anode electrodes AE2, but greater than the area of the first anode electrodes AE1. Alternatively, the area of the first anode electrodes AE1 may be less than the area of the second anode electrodes AE2, and the area of the third anode electrodes AE3 may be greater than the area of the second anode electrodes AE2 and the area of the first anode electrodes AE1. However, the present disclosure is not limited to these examples. That is, the first anode electrodes AE1, the second anode electrodes AE2, and the third anode electrodes AE3 may have substantially the same width or the same area.

The first anode electrodes AE1, the second anode electrodes AE2, and the third anode electrodes AE3 may be reflective electrodes, in which case, the first anode electrodes AE1, the second anode electrodes AE2, and the third anode electrodes AE3 may be metal layers including a metal such as Ag, Mg, Al, Pt, Pd, Au, Ni, Nd, Ir, or Cr. In some embodiments, the first anode electrodes AE1, the second anode electrodes AE2, and the third anode electrodes AE3 may further include metal oxide layers deposited on the metal layers. For example, the first anode electrodes AE1, the second anode electrodes AE2, and the third anode electrodes AE3 may have a double-layer structure such as ITO/Ag, Ag/ITO, ITO/Mg, or ITO/MgF or a multilayer structure such as ITO/Ag/ITO.

The pixel defining film 150 may be disposed on the first anode electrodes AE1, the second anode electrodes AE2, and the third anode electrodes AE3. The pixel defining film 150 may include openings that expose the first anode electrodes AE1, openings that expose the second anode electrodes AE2, and openings that expose the third anode electrodes AE3 and may define the first light-emitting areas LA1, the second light-emitting areas LA2, the third light-emitting areas LA3, and the non-light-emitting areas NLA. That is, parts of the first node electrodes AE1 not covered, but exposed by the pixel defining film 150 may be the first light-emitting areas LA1. Similarly, parts of the second node electrodes AE2 not covered, but exposed by the pixel defining film 150 may be the second light-emitting areas LA2, and parts of the third node electrodes AE3 not covered, but exposed by the pixel defining film 150 may be the third light-emitting areas LA3. The pixel defining film 150 may be positioned in the non-light-emitting areas NLA.

In some embodiments, the pixel defining film 150 may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene ("BCB").

In some embodiments, the pixel defining film 150 may overlap with color patterns 250 and lower light blocking members 220 that will be described later in a plan view. For example, as illustrated in FIG. 5, the pixel defining film 150 may overlap with first lower light blocking members 221, second lower light blocking members 222, and third lower light blocking members 223 in a plan view. Also, the pixel defining film 150 may overlap with first color patterns 251, second color patterns 252, and third color patterns 253 in a plan view.

The pixel defining film 150 may also overlap with planarization patterns 360 that will be described later in a plan view.

As illustrated in FIGS. 5 and 7 through 9, an emission layer OL may be positioned on the first anode electrodes AE1, the second anode electrodes AE2, and the third anode electrodes AE3.

In some embodiments, the emission layer OL may be in the shape of a continuous film formed across the light-emitting areas (LA1, LA2, LA3, LA4, LA5, and LA6) and the non-light-emitting areas NLA. The emission layer OL will be described later in detail.

As illustrated in FIGS. 5 and 7 through 10, a cathode electrode CE may be disposed on the emission layer OL.

In some embodiments, the cathode electrode CE may have a transflective or transmissive characteristic. In a case where the cathode electrode CE has a transflective characteristic, the cathode electrode CE may include Ag, Mg, Cu, Al, Pt, Pd, Au, Ni, Nd, Ir, Cr, Li, Ca, LiF/Ca, LiF/Al, Mo, Ti, or a compound or mixture thereof (e.g., the mixture of Ag and Mg). Also, in a case where the cathode electrode CE has a thickness of several tens to hundreds of angstroms, the cathode electrode CE may have semi-transmissivity.

In a case where the cathode electrode CE has a transmissive characteristic, the cathode electrode CE may include a transparent conductive oxide ("TCO"). For example, the cathode electrode CE may include tungsten oxide ($W_xO_x$), titanium oxide ($TiO_2$), indium tin oxide ("ITO"), indium zinc oxide ("IZO"), zinc oxide (ZnO), indium tin zinc oxide ("ITZO"), or magnesium oxide (MgO).

The first anode electrodes AE1, the emission layer OL, and the cathode electrode CE may form first light-emitting elements ED1, the second anode electrodes AE2, the emission layer OL, and the cathode electrode CE may form second light-emitting elements ED2, and the third anode electrodes AE3, the emission layer OL, and the cathode electrode CE may form third light-emitting elements ED3. The first light-emitting elements ED1, the second light-emitting elements ED2, and the third light-emitting elements ED3 may emit emission light L1, and the emission light L1 may be provided to the color converting substrate 30.

As illustrated in FIG. 6, the emission light L1, which is finally emitted from the emission layer OL, may be mixed light having first and second components L11 and L12 mixed therein. The first and second components L11 and L12 may have a peak wavelength of about 440 nm to about 480 nm. That is, the emission light L1 may be blue light.

In some embodiments, the emission layer OL may have, for example, a tandem structure in which a plurality of light-emitting layers are laid over one another. For example, the emission layer OL may include a first stack ST1, which includes a first light-emitting layer EML1, a second stack ST2, which is positioned on the first stack ST1 and includes a second light-emitting layer EML2, a third stack ST3, which is positioned on the second stack ST2 and includes a third light-emitting layer EML3, a first charge generation layer CGL1, which is positioned between the first and second stacks ST1 and ST2, and a second charge generation layer CGL2, which is positioned between the second and third stacks ST2 and ST3. The first, second, and third stacks ST1, ST2, and ST3 may be disposed to overlap with one another in a plan view.

The first, second, and third light-emitting layers EML1, EML2, and EML3 may be disposed to overlap with each other in a plan view.

In some embodiments, the first, second, and third light-emitting layers EML1, EML2, and EML3 may all emit the first-color light, for example, blue light. The first, second, and third light-emitting layers EML1, EML2, and EML3 may all be blue light-emitting layers and may include an organic material.

In some embodiments, at least one of the first, second, and third light-emitting layers EML1, EML2, and EML3 may emit first blue light having a first peak wavelength, and at least another one of the first, second, and third light-emitting layers EML1, EML2, and EML3 may emit second blue light having a second peak wavelength, which is different from the first peak wavelength. For example, one of the first, second, and third light-emitting layers EML1, EML2, and EML3 may emit the first blue light having the first peak wavelength, and the other two light-emitting layers may emit the second blue light having the second peak wavelength. That is, the emission light L1, which is finally emitted from the emission layer OL, may be mixed light having the first and second components L11 and L12 mixed therein, the first component L11 may be the first blue light having the first peak wavelength, and the second component L12 may be the second blue light having the second peak wavelength.

In some embodiments, one of the first and second peak wavelengths may range between 440 nm and 460 nm, and the other peak wavelength may range between 460 nm and 480 nm. However, the present disclosure is not limited to this. In some embodiments, the first and second peak wavelengths may both include 460 nm. In some embodiments, one of the first blue light and the second blue light may be deep-blue light, and the other blue light may be sky-blue light.

In some embodiments, the emission light L1 is blue light and includes long- and short-wavelength components. Thus, the emission layer OL can emit blue light with a broad emission peak as the emission light L1. Accordingly, color visibility at side viewing angles can be improved, as compared to conventional light-emitting elements emitting blue light with a sharp emission peak.

In some embodiments, each of the first, second, and third light-emitting layers EML1, EML2, and EML3 may include a host and a dopant. The material of the host is not particularly limited. For example, tris(8-hydroxyquinolino)aluminum ($Alq_3$), 4,4'-bis(N-carbazolyl)-1,1'-biphenyl ("CBP"), poly(n-vinylcarbazole) ("PVK"), 9,10-di(naphthalene-2-yl)anthracene ("ADN"), 4,4',4"-Tris(carbazol-9-yl)-triphenylamine ("TCTA"), 1,3,5-tris(N-phenylbenzimidazole-2-yl)benzene (TPBi), 3-tert-butyl-9,10-di(naphth-2-yl)anthracene ("TBADN"), distyrylarylene ("DSA"), 4,4'-bis(9-carbazolyl)-2,2'-dimethyl-biphenyl ("CDBP"), or 2-methyl-9,10-bis(naphthalen-2-yl)anthracene ("MADN") may be used as the host.

For example, first, second, and third light-emitting layers EML1, EML2, and EML3 emitting blue light may include a fluorescent material selected from the group consisting of spiro-DPVBi, spiro-6P, distyryl benzene ("DSB"), distyryl arylene ("DSA"), a polyfluorene ("PFO")-based polymer, and poly(p-phenylene vinylene ("PPV"). In another example, the first, second, and third light-emitting layers EML1, EML2, and EML3 may include a phosphorescent material including an organometallic complex such as (4,6-F2ppy)$_2$Irpic.

As already mentioned above, at least one of the first, second, and third light-emitting layers EML1, EML2, and EML3 may emit blue light having a different wavelength range from at least another one of the first, second, and third light-emitting layers EML1, EML2, and EML3. To emit blue light of different wavelength ranges, the first, second, and third light-emitting layers EML1, EML2, and EML3 may include the same material, and a method of controlling a resonance distance may be used. Alternatively, to emit blue light of different wavelength ranges, at least two of the first, second, and third light-emitting layers EML1, EML2, and EML3 may include different materials.

However, the present disclosure is not limited to this. Alternatively, the first, second, and third light-emitting layers EML1, EML2, and EML3 may all emit blue light having a peak wavelength of 440 nm to 480 nm and may be formed of or include the same material.

Alternatively, one of the first, second, and third light-emitting layers EML1, EML2, and EML3 may emit the first blue light having the first peak wavelength, another one of the first, second, and third light-emitting layers EML1, EML2, and EML3 may emit the second blue light having the second peak wavelength, which is different from the first peak wavelength, and the other light-emitting layer may emit third blue light having a third peak wavelength, which is different form the first and second peak wavelengths. In some embodiments, one of the first, second, and third peak wavelengths may range between 440 nm and 460 nm, and another one of the first, second, and third peak wavelengths may range between 460 nm and 470 nm, and the other peak wavelength may range between 470 nm and 480 nm.

In other embodiments, the emission light L1, which is emitted from the emission layer OL, may be blue light and may include long-, intermediate-, and short-wavelength components. Thus, the emission layer OL can emit blue light having a broad emission peak as the emission light L1 and can improve color visibility at side viewing angles.

The light-emitting elements of the display device 1 can improve an optical efficiency as compared to conventional light-emitting elements not employing a tandem structure in which multiple light-emitting layers are stacked, and can lengthen the life of a display device.

The first charge generation layer CGL1 may be positioned between the first and second stacks ST1 and ST2. The first charge generation layer CGL1 may inject charges into each light-emitting layer adjacent thereto. The first charge generation layer CGL1 may control the charge balance between the first and second stacks ST1 and ST2. The first charge generation layer CGL1 may include an n-type charge generation layer CGL11 and a p-type charge generation layer CGL12. The p-type charge generation layer CGL12 may be disposed on the n-type charge generation layer CGL11, between the n-type charge generation layer CGL11 and the second stack ST2.

The first charge generation layer CGL1 may have a structure in which the n-type charge generation layer CGL11 and the p-type charge generation layer CGL12 are bonded together. The n-type charge generation layer CGL11 may be disposed closer to an anode electrode (AE1, AE2, or AE3 of FIG. 5) than to the cathode electrode CE. The p-type charge generation layer CGL12 may be disposed closer to the cathode electrode CE than to the anode electrode (AE1, AE2, or AE3 of FIG. 5). The n-type charge generation layer CGL11 may provide electrons the first light-emitting layer EML1, which is adjacent to the anode electrode (AE1, AE2, or AE3 of FIG. 5), and the p-type charge generation layer CGL12 may provide holes to the second light-emitting layer EML2, which is included in the second stack ST2. As the first charge generation layer CGL1 is disposed between the first and second stacks ST1 and ST2 and provides charge to each light-emitting layer, an emission efficiency can be improved, and a driving voltage can be lowered.

The first stack ST1 may be positioned on a first, second, or third anode electrode AE1, AE2, and AE3 (of FIG. 5) and may further include a first hole transport layer HTL1, a first electron blocking layer BIL1, and a first electron transport layer ETL1.

The first hole transport layer HTL1 may be positioned on the first, second, or third anode electrode AE1, AE2, and AE3 (of FIG. 5). The first hole transport layer HTL1 may facilitate the transport of holes and may include a hole transport material. The hole transport material may include a carbazole derivative such as N-phenylcarbazole or polyvinylcarbazole, a fluorene derivative, a triphenylamine derivative such as N,N'-bis(3-methylphenyl)-N,N'-diphenyl-[1,1-biphenyl]-4,4'-diamine ("TPD") or TCTA, N,N'-di(1-naphthyl)-N,N'-diphenylbenzidine ("NPB"), or 4,4'-Cyclohexylidene bis[N,N-bis(4-methylphenyl)benzenamine] ("TAPC"), but the present disclosure is not limited thereto. In some embodiments, the first hole transport layer HTL1 may be formed as a single-layer film. In some embodiments, the first transport layer HTL1 may be formed as a multilayer film. In a case where the first transport layer HTL1 is formed as a multilayer film, layers of the first transport layer HTL1 may include different materials.

The first electron blocking layer BIL1 may be positioned on the first hole transport layer HTL1, between the first hole transport layer HTL1 and the first light-emitting layer EML1. The first electron blocking layer BIL1 may include a hole transport material and a metal (or a metal compound) to prevent electrons generated in the first light-emitting layer EML1 from spilling over to the first hole transport layer HTL1. In some embodiments, the first hole transport layer HTL1 and the first electron blocking layer BIL1 may be incorporated into a single layer, but the present disclosure is not limited thereto. In some embodiments, the first electron blocking layer BIL1 may not be provided.

The first electron transport layer ETL1 may be positioned on the first light-emitting layer EML1, between the first charge generation layer CGL1 and the first light-emitting layer EML1. In some embodiments, the first electron transport layer ETL1 may include an electron transport material such as Alq$_3$, TPBi, 2,9-Dimethyl-4,7-diphenyl-1,10-phenanthroline ("BCP"), 4,7-Diphenyl-1,10-phenanthroline (Bphen), 3-(4-Biphenylyl)-4-phenyl-5-tert-butylphenyl-1,2,4-triazole ("TAZ"), 4-(Naphthalen-1-yl)-3,5-diphenyl-4H-1,2,4-triazole ("NTAZ"), (2-(4-Biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum) (BAlq), berylliumbis(benzoquinolin-10-olate) (Bebg2), AND, or a mixture thereof, but the present disclosure is not limited thereto. In some embodiments, the first electron transport layer ETL1 may be formed as a single-layer film. In some embodiments, the first electron transport layer ETL1 may be formed as a multilayer film. In a case where the first electron transport layer ETL1 is formed as a multilayer film, layers of the first electron transport layer ETL1 may include different materials. The second stack ST2 may be positioned on the first charge generation layer CGL1 and may further include a second hole transport layer HTL2, a second electron blocking layer BIL2, and a second electron transport layer ETL2.

The second hole transport layer HTL2 may be positioned on the first charge generation layer CGL1. The second hole transport layer HTL2 may be formed of or include the same material as the first hole transport layer HTL1 and may include at least one selected from among the above-described exemplary materials that may be included in the first hole transport layer HTL1. The second hole transport layer HTL2 may be formed as a single- or multilayer film. In a case where the second hole transport layer HTL2 is formed as a multilayer film, layers of the second hole transport layer HTL2 may include different materials.

The second electron blocking layer BIL2 may be positioned on the second hole transport layer HTL2, between the second hole transport layer HTL2 and the first light-emitting layer EML1. The second electron blocking layer BIL2 may be formed of or include the same material as, and have the same structure as, the first electron blocking layer BIL1 and may include at least one selected from among the above-described exemplary materials that may be included in the first electron blocking layer BIL1. In some embodiments, the second electron blocking layer BIL2 may not be provided.

The second electron transport layer ETL2 may be positioned on the second light-emitting layer EML2, between the second charge generation layer CGL2 and the second light-emitting layer EML2. The second electron transport layer ETL2 may be formed of or include the same material as, and have the same structure as, the first electron transport layer ETL1 and may include at least one selected from among the above-described exemplary materials that may be included in the first electron transport layer ETL1. The second electron transport layer ETL2 may be formed as a single- or multilayer film. In a case where the second electron transport layer ETL2 is formed as a multilayer film, layers of the second electron transport layer ETL2 include different materials.

The second charge generation layer CGL2 may be positioned on the second stack ST2, between the second and third stacks ST2 and ST3.

The second charge generation layer CGL2 may have the same structure as the first charge generation layer CGL1. For example, the second charge generation layer CGL2 may include an n-type charge generation layer CGL21, which is adjacent to the second stack ST2, and a p-type charge generation layer CGL22, which is adjacent to the cathode electrode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are bonded together. The first and second charge generation layers CGL1 and CGL2 may be formed of or include different materials or of the same material.

The second stack ST2 may be positioned on the second charge generation layer CGL2 and may further include a third hole transport layer HTL3 and a third electron transport layer ETL3.

The third hole transport layer HTL3 may be positioned on the second charge generation layer CGL2. The third hole transport layer HTL3 may be formed of or include the same material as the first hole transport layer HTL1 or may include at least one selected from among the above-described exemplary materials that may be included in the first hole transport layer HTL1. The third hole transport layer HTL3 may be formed as a single- or multilayer film. In a case where the third hole transport layer HTL3 consists of multiple layers, the multiple layers may include different materials.

The third electron transport layer ETL3 may be positioned on the third light-emitting layer EML3, between the cathode electrode CE and the third light-emitting layer EML3. The third electron transport layer ETL3 may be formed of or include the same material as, and have the same structure as, the first electron transport layer ETL1 and may include at least one selected from among the above-described exemplary materials that may be included in the first electron transport layer ETL1. The third electron transport layer ETL3 may be formed as a single- or multilayer film. In a case where the third electron transport layer ETL3 consists of multiple layers, the multiple layers may include different materials.

Although not specifically illustrated, a hole injection layer ("HIL") may be further positioned between the first stack ST1 and the first, second, or third anode electrodes AE1, AE2, or AE3 (of FIG. 5), between the second stack ST2 and the first charge generation layer CGL1, and/or between the third stack ST3 and the second charge generation layer CGL2. The HIL may facilitate the injection of holes into the first, second, and third light-emitting layers EML1, EML2, and EML3. In some embodiments, the HIL may be formed of or include at least one selected from the group consisting of copper phthalocyanine (CuPc), poly(3,4)-ethylenedioxythiophene ("PEDOT"), polyaniline ("PANI"), and N,N-di-naphthyl-N,N'-diphenyl benzidine ("NPD"), but the present disclosure is not limited thereto. In some embodiments, multiple HILs may be positioned between the first stack ST1 and the first, second, or third anode electrode AE1, AE2, or AE3 (of FIG. 5), between the second stack ST2 and the first charge generation layer CGL1, and between the third stack ST3 and the second charge generation layer CGL2.

Although not specifically illustrated, an electron injection layer ("EIL") may be further positioned between the third electron transport layer ETL3 and the cathode electrode CE, between the second charge generation layer CGL2 and the second stack ST2, and/or between the first charge generation layer CGL1 and the first stack ST1. The EIL may facilitate the injection of electrons and may be formed of or include $Alq_3$, PBD, TAZ, spiro-PBD, BAlq, or SAlq, but the present disclosure is not limited thereto. Also, the EIL may include a metal halide compound, for example, at least one selected from the group consisting of $MgF_2$, LiF, NaF, KF, RbF, CsF, FrF, LiI, NaI, KI, RbI, CsI, FrI, and $CaF_2$, but the present disclosure is not limited thereto. Also, the EIL may include a lanthanum (La)-based material such as Yb, Sm, or Eu or may include both a metal halide material such as RbI:Yb or KI:Yb and the La-based material. In a case where the EIL includes both the metal halide material and the La-based material, the EIL may be formed by co-depositing the metal halide material and the La-based material. In some embodiments, multiple EILs may be positioned between the third electron transport layer ETL3 and the cathode electrode CE, between the second charge generation layer CGL2 and the second stack ST2, and between the first charge generation layer CGL1 and the first stack ST1.

The structure of the emission layer OL may vary. For example, the emission layer OL may include only two stacks or four or more stacks.

As illustrated in FIGS. 5 and 7 through 10, the thin-film encapsulation layer 170 is disposed on the cathode electrode CE. The thin-film encapsulation layer 170 may be disposed in common in the first light-emitting areas LA1, the second light-emitting areas LA2, the third light-emitting areas LA3, and the non-light-emitting areas NLA. In some embodiments, the thin-film encapsulation layer 170 may directly cover the cathode electrode CE. In some embodiments, a capping layer (not illustrated), which covers the cathode electrode CE, may be further disposed between the thin-film encapsulation layer 170 and the cathode electrode CE, in which case, the thin-film encapsulation layer 170 may directly cover the capping layer.

In some embodiments, the thin-film encapsulation layer 170 may include a first encapsulation inorganic film 171, an encapsulation organic film 173, and a second encapsulation inorganic film 175, which are sequentially deposited on the cathode electrode CE.

In some embodiments, the first and second encapsulation inorganic films 171 and 175 may be formed of or include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

In some embodiments, the encapsulation organic film 173 may be formed of or include an acrylic resin, a methacrylic resin, polyisoprene, a vinyl-based resin, an epoxy-based resin, a urethane-based resin, a cellulose-based resin, or a perylene-based resin.

The structure of the thin-film encapsulation layer 170 is not particularly limited and may vary.

The display light blocking members 190 may be positioned on the thin-film encapsulation layer 170. The display light blocking members 190 may be positioned on the thin-film encapsulation layer 170, in the non-light-emitting areas NLA. The display light blocking members 190 can prevent light from infiltrating between adjacent light-emitting areas to cause color mixing, and as a result, color reproducibility can be further improved.

In some embodiments, the display light blocking members 190 may be positioned in the non-light-emitting areas NLA and may be disposed to surround the light-emitting areas (LA1, LA2, LA3, LA4, LA5, and LA6) in a plan view.

The display light blocking members 190 may include an organic light blocking material and may be formed by coating an organic light blocking material and subjecting the organic light blocking material to an exposure process.

The color converting substrate 30 will hereinafter be described with reference to FIGS. 11 through 14 and further to FIGS. 5 and 7 through 10.

Figure 11:
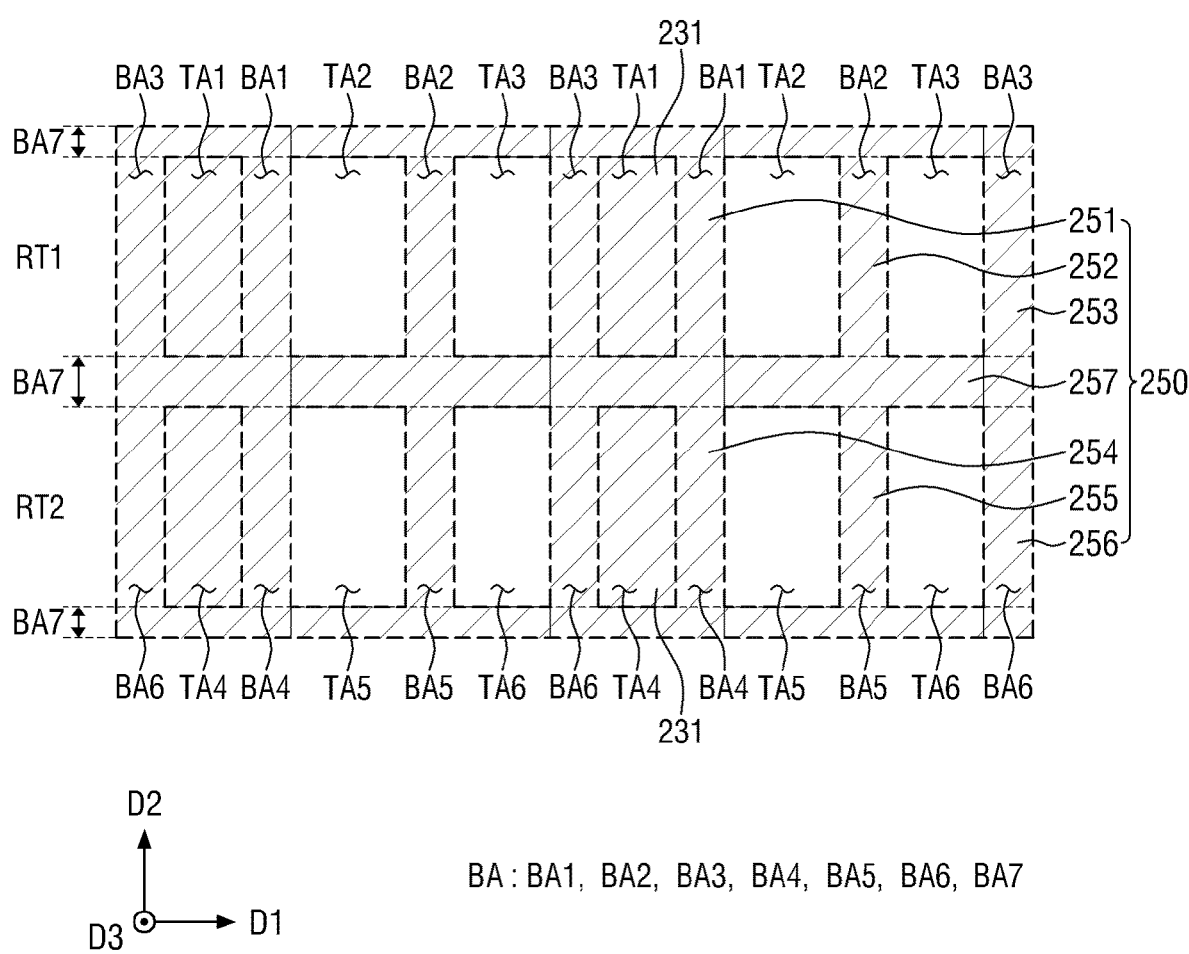
FIG. 11 is a plan view illustrating the layout of first color filters and color patterns in the color converting substrate of the display device according to an embodiment of the present disclosure.
Figure 12:
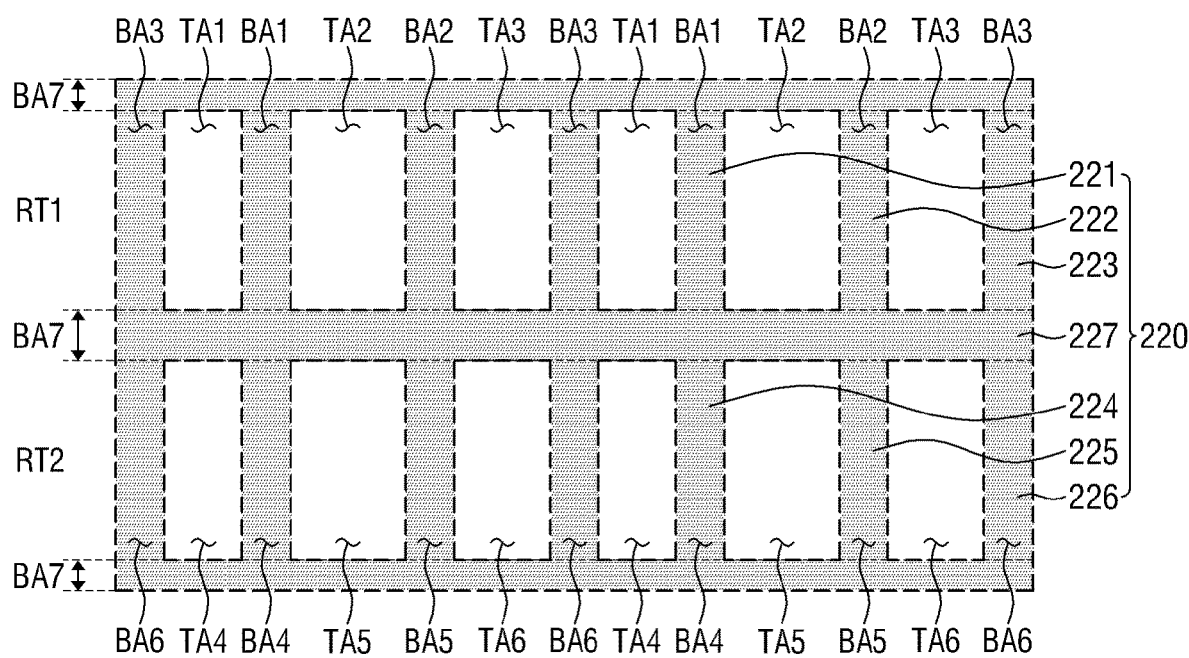
FIG. 12 is a plan view illustrating the layout of lower light blocking members in the color converting substrate of the display device according to an embodiment of the present disclosure.
Figure 13:
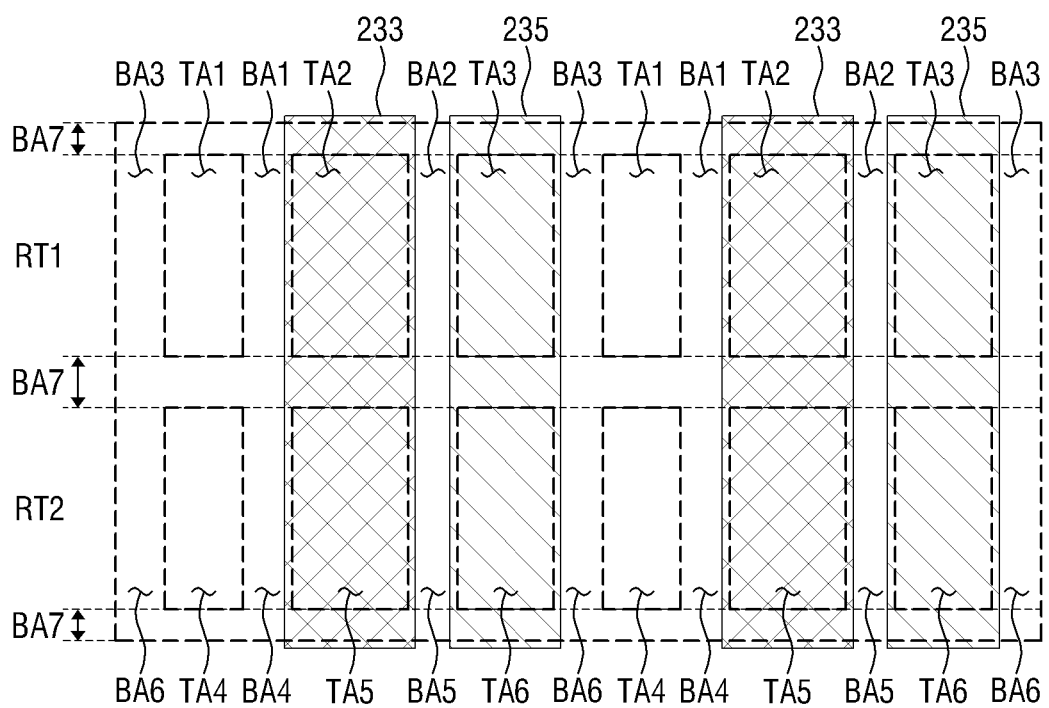
FIG. 13 is a plan view illustrating the layout of second color filters and third color filters in the color converting substrate of the display device according to an embodiment of the present disclosure.
Figure 14:
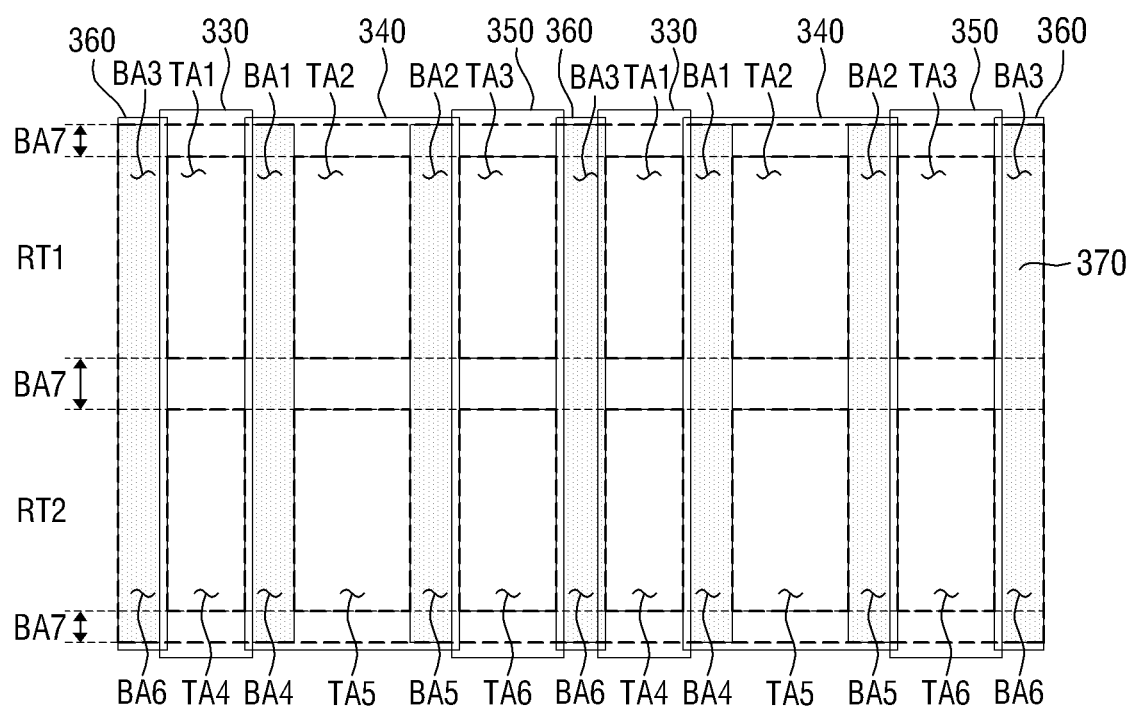
FIG. 14 is a plan view illustrating the layout of first wavelength converting patterns, second wavelength converting patterns, light transmission patterns, planarization patterns, and upper light blocking members in the color converting substrate of the display device according to an embodiment of the present disclosure.

FIG. 11 is a plan view illustrating the layout of first color filters and color patterns in the color converting substrate of the display device according to an embodiment of the present disclosure, FIG. 12 is a plan view illustrating the layout of lower light blocking members in the color converting substrate of the display device according to an embodiment of the present disclosure, FIG. 13 is a plan view illustrating the layout of second color filters and third color filters in the color converting substrate of the display device according to an embodiment of the present disclosure, and FIG. 14 is a plan view illustrating the layout of first wavelength converting patterns, second wavelength converting patterns, light transmission patterns, planarization patterns, and upper light blocking members in the color converting substrate of the display device according to an embodiment of the present disclosure.

Referring to FIGS. 5 and 7 through 14, a second base portion 310, illustrated in FIGS. 5 and 7 through 10, may be formed of or include a light-transmitting material. In some embodiments, the second base portion 310 may include a glass substrate or a plastic substrate. In some embodiments, the second base portion 310 may further include a separate layer (e.g., an insulating layer such as an inorganic film) positioned on the glass substrate or the plastic substrate.

In some embodiments, the light transmission areas (TA1, TA2, TA3, TA4, TA5, and TA6) and the light blocking areas BA may be defined on the second base portion 310, as illustrated in FIG. 4.

Referring to FIGS. 5 and 7 through 11, first color filters 231 and color patterns 250 may be positioned on a surface of the second base portion 310 that faces the display substrate 10.

The first color filters 231 may be positioned on the surface of the second base portion 310, in the first light transmission areas TA1 and the fourth light transmission areas TA4. In some embodiments, first color filters 231 disposed in the first light transmission areas TA1 and first color filters 231 disposed in the fourth light transmission areas TA4 may be spaced apart from one another in the second direction D2. In some embodiments, seventh color patterns 257 that will be described later may be positioned between the first color filters 231 disposed in the disposed in the first light transmission areas TA1 and the first color filters 231 disposed in the fourth light transmission areas TA4. The seventh color patterns 257 may be connected to the first color filters 231 disposed in the first light transmission areas TA1 and the first color filters 231 disposed in the fourth light transmission areas TA4.

The first color filters 231 may selectively transmit light of the first color (e.g., blue light) therethrough and may block or absorb light of the second color (e.g., red light) and light of the third color (e.g., green light). In some embodiments, the first color filters 231 may be blue color filters and may include a blue colorant such as a blue dye or a blue pigment. The term "colorant," as used herein, encompasses both a dye and a pigment.

The color patterns 250 may reduce reflected light from external light by absorbing some of the external light introduced into the color converting substrate 30 from the outside of the display device 1. Most of the external light is reflected and may thus distort the color reproducibility of the color converting substrate 30. However, as the color patterns 250 are positioned above the second base portion 310, the distortion of colors by the reflection of the external light can be reduced by the color patterns 250.

In some embodiments, the color patterns 250 may include a blue colorant such as a blue dye or a blue pigment. In some embodiments, the color patterns 250 may be formed of or include the same material as the first color filters 231, and the color patterns 250 and the first color filters 231 may be formed at the same time. That is, the first color filters 231 and the color patterns 250 may be formed at the same time by applying a photosensitive organic material including a blue colorant on the surface of the second base portion 310 and exposing and developing the photosensitive organic material.

The color patterns 250 may be disposed on the surface of the second base portion 310 and may be positioned in the light blocking areas BA. Also, the color patterns 250 may be disposed to overlap with the non-light-emitting areas NLA in a plan view. In some embodiments, the color patterns 250 may be in direct contact with the surface of the second base portion 310. Alternatively, in a case where a buffer layer for preventing the inflow of impurities is disposed on the surface of the second base portion 310, the color patterns 250 may be in direct contact with the buffer layer rather than the surface of the second base portion 310.

In some embodiments, the color patterns 250 may be disposed in all the light blocking areas BA. In some embodiments, the color patterns 250 may include first color patterns 251, which are disposed in the first light blocking areas BA1, second color patterns 252, which are disposed in the second light blocking areas BA2, third color patterns 253, which are disposed in the third light blocking areas BA3, fourth color patterns 254, which are disposed in the fourth light blocking areas BA4, fifth color patterns 255, which are disposed in the fifth light blocking areas BA5, sixth color patterns 256, which are disposed in the sixth light blocking areas BA6, and seventh color patterns 257, which are disposed in the seventh light blocking areas BA7. In some embodiments, the seventh color patterns 257 may be connected to the first color patterns 251, the second color patterns 252, the third color patterns 253, the fourth color patterns 254, the fifth color patterns 255, and the sixth color patterns 256.

The color patterns 250 may be connected to the first color filters 231.

As illustrated in FIGS. 5, 7 through 10, and 12, the lower light blocking members 220 may be disposed on the surface of the second base portion 310 that faces the display substrate 10. The lower light blocking members 220 may be positioned in the light blocking areas BA to block the transmission of light. In some embodiments, as illustrated in FIG. 12, the lower light blocking members 220 may be arranged substantially in a lattice shape in a plan view.

In some embodiments, the lower light blocking members 220 may include an organic light-blocking material and may be formed by coating and exposing an organic light-blocking material.

As already mentioned above, external light may cause problems such as distortion of color reproducibility of a color converting substrate. However, as the lower light blocking members 220 are positioned under the second base portion 310, at least some of the external light is absorbed by the lower light blocking members 220, and thus, the distortion of colors by the reflection of the external light can be effectively reduced. In some embodiments, the lower light blocking members 220 can prevent light from infiltrating between adjacent light transmission areas to cause color mixing, and as a result, color reproducibility can be further improved.

In some embodiments, the lower light blocking members 220 may include first lower light blocking members 221, which are disposed in the first light blocking areas BA1, second lower light blocking members 222, which are disposed in the second light blocking areas BA2, third lower light blocking members 223, which are disposed in the third light blocking areas BA3, fourth lower light blocking members 224, which are disposed in the fourth light blocking areas BA4, fifth lower light blocking members 225, which are disposed in the fifth light blocking areas BA5, sixth lower light blocking members 226, which are disposed in the sixth light blocking areas BA6, and seventh lower light blocking members 227, which are disposed in the seventh light blocking areas BA7. In some embodiments, the first lower light blocking members 221, the second lower light blocking members 222, and the third lower light blocking members 223 may be connected to the seventh lower light blocking members 227, and the fourth lower light blocking members 224, the fifth lower light blocking members 225, and the sixth lower light blocking members 226 may also be connected to the seventh lower light blocking members 227.

The lower light blocking members 220 may be positioned on the color patterns 250. In some embodiments, the first lower light blocking members 221 may be positioned on the first color patterns 251, the second lower light blocking members 222 may be positioned on the second color patterns 252, the third lower light blocking members 223 may be positioned on the third color patterns 253, the fourth lower light blocking members 224 may be positioned on the fourth color patterns 254, the fifth lower light blocking members 225 may be positioned on the fifth color patterns 255, the sixth lower light blocking members 226 may be positioned on the sixth color patterns 256, and the seventh lower light blocking members 227 may be positioned on the seventh color patterns 257.

As the color patterns 250 are positioned between the lower light blocking members 220 and the second base portion 310, the lower light blocking members 220 may not be in contact with the second base portion 310.

As illustrated in FIGS. 5, 8 through 10, and 13, the second color filters 233 and the third color filters 235 may be positioned on the surface of the second base portion 310 that faces the display substrate 10. Here, the first color filters 231, the second color filters 233, and the third color filters 235 may be collectively called as "color filter layer".

The second color filters 233 may be positioned in the second light transmission areas TA2 and the fifth light transmission areas TA5, and the third color filters 235 may be positioned in the third light transmission areas TA3 and the sixth light transmission areas TA6.

As illustrated in FIG. 5, first sides of the second color filters 233 may be positioned in the first light blocking areas BA1, on the first color patterns 251 and the first lower light blocking members 221. Second sides of the second color filters 233 may be positioned in the second light blocking areas BA2, on the second color patterns 252 and the second lower light blocking members 222.

As illustrated in FIG. 5, in some embodiments, first sides of the third color filters 235 may be positioned in the second light blocking areas BA2, on the second color patterns 252 and the second lower light blocking members 222. Also, in some embodiments, second sides of the third color filters 235 may be positioned in the third light blocking areas BA3, on the third color patterns 253 and the third lower light blocking members 223.

As illustrated in FIG. 13, in some embodiments, the second color filters 233 and the third color filters 235 may be formed as stripes extending in the second direction D2 and may extend across the seventh light blocking area BA7 between the first and second rows RT1 and RT2. Accordingly, in the seventh light blocking areas BA7, the second color filters 233 and the third color filters 235 may be positioned on the seventh lower light blocking members 227 and may cover the seventh color patterns 237 and the seventh lower light blocking members 227 along the second direction D2. However, the present disclosure is not limited to this. In other embodiments, the second color filters 233 and/or the third color filters 235 may be formed as, for example, islands that are spaced apart from one another in the second direction D2.

In some embodiments, the second color filters 233 may block or absorb light of the first color (e.g., blue light). That is, the second color filters 233 may function as blue light-blocking filters. In some embodiments, the second color filters 233 may selectively transmit light of the second color (e.g., red light) therethrough and may block or absorb light of the first color (e.g., blue light) and light of the third color (e.g., green light). For example, the second color filters 233 may be red color filters and may include a red colorant such as a red dye or a red pigment.

The third color filters 235 may block or absorb light of the first color (e.g., blue light). That is, the third color filters 235 may also function as blue light-blocking filters. In some embodiments, the third color filters 235 may selectively transmit light of the third color (e.g., green light) therethrough and may block or absorb light of the first color (e.g., blue light) and light of the second color (e.g., red light). For example, the third color filters 235 may be green color filters and may include a green colorant such as a green dye or a green pigment.

As illustrated in FIGS. 5 and 7 through 10, a first capping layer 391, which covers the lower light blocking members 220, the color patterns 250, the first color filters 231, the second color filters 233, and the third color filters 235, may be positioned on the surface of the second base portion 310. In some embodiments, the first capping layer 391 may be in direct contact with the first color filters 231, the second color filters 233, and the third color filters 235.

The first capping layer 391 may be further in contact with the lower light blocking members 220. For example, as illustrated in FIG. 5, the first lower light blocking members 221 may be in direct contact with the first capping layer 391, in the first light blocking areas BA1. Also, the second lower light blocking members 222 may be in contact with the first capping layer 391, in the second light blocking areas BA2, and the third lower light blocking members 223 may be in contact with the first capping layer 391, in the third light blocking areas BA3. As illustrated in FIG. 7, the seventh lower light blocking members 227 may be in direct contact with the first capping layer 391, in the seventh light blocking areas.

The first capping layer 391 may prevent impurities from the outside, such as moisture or the air, from infiltrating into, and damaging or contaminating, the lower light blocking members 220, the color patterns 250, the first color filters 231, the second color filters 233, and the third color filters 235. Also, the first capping layer 391 may prevent the colorants of the first color filters 231, the second color filters 233, and the third color filters 235 from diffusing into other members such as, for example, first wavelength converting patterns 340 and second wavelength converting patterns 350. In some embodiments, the first capping layer 391 may be formed of or include an inorganic material. For example, the first capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

As illustrated in FIGS. 5, 8 through 10, and 14, light transmission patterns 330, the first wavelength converting patterns 340, and the second wavelength converting patterns 350 may be positioned on the first capping layer 391.

In some embodiments, the light transmission patterns 330, the first wavelength converting patterns 340, and the second wavelength converting patterns 350 may be formed by applying a photosensitive material and exposing and developing the photosensitive material, but the present disclosure is not limited thereto. Alternatively, the second wavelength converting patterns 350 and the light transmission patterns 330 may be formed by inkjet printing.

The light transmission patterns 330 may be positioned on the first capping layer 391, in the first light transmission areas TA1 and the fourth light transmission areas TA4. The light transmission patterns 330 may extend further into the first light blocking areas BA1, the fourth light blocking areas BA4, the third light blocking areas BA3, and the sixth light blocking areas BA6. Light transmission patterns 330 that extend further into the first light blocking areas BA1 and the fourth light blocking areas BA4 may partially cover the bottom surfaces of planarization patterns 360 disposed in the third light blocking areas BA3 and the sixth light blocking areas BA6. In the first light blocking areas BA1 and the fourth light blocking areas BA4, the light transmission patterns 330 may be disposed to overlap with the first wavelength converting patterns 340 in a plan view, and in the third light blocking areas BA3 and the sixth light blocking areas BA6, the light transmission patterns 330 may be disposed to overlap with the planarization patterns 360 in a plan view.

The light transmission patterns 330 that extend further into the first light blocking areas BA1 and the fourth light blocking areas BA4 may be partially in contact with the bottom surfaces of first wavelength converting patterns 340 that extend into the first light blocking areas BA1 and the fourth light blocking areas BA4, and light transmission patterns 330 that extend further into the third light blocking areas BA3 and the sixth light blocking areas BA6 may be partially in contact with the bottom surfaces of the planarization patterns 360, which are disposed in the third light blocking areas BA3 and the sixth light blocking areas BA6.

In some embodiments, as illustrated in FIG. 14, the light transmission patterns 330 may be formed as stripes extending in the second direction D2 and may extend across the seventh light blocking area BA7 between the first and second rows RT1 and RT2, but the present disclosure is not limited thereto. In other embodiments, the light transmission patterns 330 may be formed as, for example, islands, so that parts thereof disposed in the first light transmission areas TA1 and parts thereof disposed in the fourth light transmission areas TA4 may be spaced apart from one another.

The light transmission patterns 330 may transmit incident light therethrough. Emission light L1 provided by the first light-emitting elements ED1 may be the mixture of sky-blue light and deep-blue light or the mixture of blue light and green light. A blue-wavelength component of the emission light L1 may be emitted out of the display device 1 through the light transmission patterns 330 and the first color filters 231. That is, first light La, which is emitted from the first light transmission areas TA1, may be blue light.

In some embodiments, each of the light transmission patterns 330 may include a first base resin 331, and may further include a first scatterer 333, which is dispersed in the first base resin 331.

The first base resin 331 may be formed of or include a material having a high light transmittance. In some embodiments, the first base resin 331 may be formed of or include an organic material. In some embodiments, the first base resin 331 may include an organic material such as an epoxy resin, an acrylic resin, a cardo resin, or an imide resin.

The first scatterer 333 may have a different refractive index from the first base resin 331 and may form an optical interface with the first base resin 331. For example, the first scatterer 333 may include light-scattering particles. The material of the first scatterer 333 is not particularly limited as long as it can scatter at least some light, and the first scatterer 333 may include, for example, particles of a metal oxide or particles of an organic material. The metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin. The first scatterer 333 may scatter light in random directions, regardless of the incident direction of the light, without substantially changing the wavelength of light passing through the light transmission patterns 330.

The first wavelength converting patterns 340 may be positioned on the first capping layer 391, in the second light transmission areas TA2 and the fifth light transmission areas TA5. The first wavelength converting patterns 340 may extend further into the first light blocking areas BA1, the second light blocking areas BA2, the fourth light blocking areas BA4, and the fifth light blocking areas BA5, which are adjacent to the second light transmission areas TA2 or the fifth light transmission areas TA5.

In the first light blocking areas BA1 and the fourth light blocking areas BA4, the bottom surfaces of the first wavelength converting patterns 340 may be partially covered by light transmission patterns 330 disposed in the first light blocking areas BA1 and the fourth light blocking areas BA4. In the second light blocking areas BA2 and the fifth light blocking areas BA5, the bottom surfaces of the first wavelength converting patterns 340 may be partially covered by second wavelength converting patterns 350 disposed in the second light blocking areas BA2 and the fifth light blocking areas BA5.

In the second light blocking areas BA2 and the fifth light blocking areas BA5, the first wavelength converting patterns 340 and the second wavelength converting patterns 350 may be disposed to overlap with one another in a thickness direction (i.e., plan view).

In the first light blocking areas BA1 and the fourth light blocking areas BA4, the bottom surfaces of the first wavelength converting patterns 340 may be partially in contact with the light transmission patterns 330 disposed in the first light blocking areas BA1 and the fourth light blocking areas BA4. In the second light blocking areas BA2 and the fifth light blocking areas BA5, the bottom surfaces of the first wavelength converting patterns 340 may be partially in contact with the second wavelength converting patterns 350 disposed in the second light blocking areas BA2 and the fifth light blocking areas BA5.

In some embodiments, as illustrated in FIG. 14, the first wavelength converting patterns 340 may be formed as stripes extending in the second direction D2 and may extend across the seventh light blocking area BA7 between the first and second rows RT1 and RT2, but the present disclosure is not limited thereto. In other embodiments, the first wavelength converting patterns 340 may be formed as, for example, islands, so that parts thereof disposed in the second light transmission areas TA2 and parts thereof disposed in the fifth light transmission areas TA5 may be spaced apart from one another.

The first wavelength converting patterns 340 may convert or shift the peak wavelength of incident light into a particular peak wavelength. In some embodiments, the first wavelength converting patterns 340 may convert emission light L1 provided by the second light-emitting elements ED2 into red light having a peak wavelength of about 610 nm to about 650 nm and may emit the red light.

In some embodiments, each of the first wavelength converting patterns 340 may include a second base resin 341 and a first wavelength shifter 345, which is dispersed in the second base resin 341, and may further include a second scatterer 343, which is dispersed in the second base resin 341.

The second base resin 341 may be formed of or include a material having a high light transmittance. In some embodiments, the second base resin 341 may be formed of or include an organic material. In some embodiments, the second base resin 341 may be formed of or include the same material as the first base resin 331 or may include at least one of the above-described exemplary materials for forming the first base resin 331.

The first wavelength shifter 345 may convert or shift the peak wavelength of incident light into a particular peak wavelength. In some embodiments, the first wavelength shifter 345 may convert the emission light L1 provided by the second light-emitting elements ED2 into red light having a single peak wavelength of about 610 nm to about 650 nm and may emit the red light.

Examples of the first wavelength shifter 345 include quantum dots, quantum rods, and a phosphor. For example, the quantum dots may be a particulate material that emits light of a particular color in response to the electrons transitioning from the conduction band to the valance band.

The quantum dots may be a semiconductor nanocrystal material. Since the quantum dots have a predetermined band gap depending on their composition and size, the quantum dots absorb light and emit light of a predetermined wavelength. The semiconductor nanocrystal material may include a group IV element, a group II-VI compound, a group III-V compound, a group IV-VI compound, or a combination thereof.

The group II-VI compound may be selected from the group consisting of: a binary compound selected from among CdSe, CdTe, ZnS, ZnSe, ZnTe, ZnO, HgS, HgSe, HgTe, MgSe, MgS, and a mixture thereof, a ternary compound selected from among InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, or a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound selected from among GaN, GaP, GaAs, GaSb, AlN, AlP, AlAs, AlSb, InN, InP, InAs, InSb, and a mixture thereof, a ternary compound selected from among GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and a mixture thereof, and a quaternary compound selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from among SnS, SnSe, SnTe, PbS, PbSe, PbTe, and a mixture thereof, a ternary compound selected from among SnSeS, SnSeTe, SnSTe, PbSeS, PbSeTe, PbSTe, SnPbS, SnPbSe, SnPbTe, and a mixture thereof, and a quaternary compound selected from among SnPbSSe, SnPbSeTe, SnPbSTe, and a mixture thereof. The group IV element may be selected from the group consisting of Si, Ge, and a mixture thereof. The group IV compound may be a binary compound selected from among SiC, SiGe, and a mixture thereof.

These binary, ternary, or quaternary compounds may exist in a uniform concentration or in a partially different concentration in particles. The quantum dots may have a core-shell structure in which one quantum dot surrounds another quantum dot. The interfaces between the cores and the shells of the quantum dots may have a concentration gradient in which the concentration of the element(s) in the shells of the quantum dots gradually decreases toward the centers of the shells of the quantum dots.

In some embodiments, the quantum dots may have a core-shell structure consisting of a core including the above-described semiconductor nanocrystal material and a shell surrounding the core. The shells of the quantum dots may serve as protective layers for maintaining the semiconductor characteristics of the quantum dots by preventing chemical denaturation of the cores of the quantum dots and/or as charging layers for imparting electrophoretic characteristics to the quantum dots. The shells of the quantum dots may have a single-layer structure or a multilayer structure. The interfaces between the cores and the shells of the quantum dots may have a concentration gradient in which the concentration of the element(s) at the shells of the quantum dots gradually decreases toward the centers of the shells of the quantum dots. The shells of the quantum dots may include a metal or non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or NiO or a ternary compound such as $MgAl_2O_4$, $CoFe_2O_4$, $NiFe_2O_4$, or $CoMn_2O_4$, but the present disclosure is not limited thereto.

For example, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but the present disclosure is not limited thereto.

Light emitted by the first wavelength shifter 345 may have a full width at half maximum ("FMHM") of about 45 nm or less, about 40 nm or less, or about 30 nm or less, and thus, the purity of colors displayed by the display device 1 and the color reproducibility of the display device 1 can be further improved. Also, the first wavelength shifter 345 can emit light in various directions regardless of the incidence direction of the light. The side visibility of the second color displayed in the second light transmission areas TA2 can be improved.

Some of the emission light L1 provided by the second light-emitting elements ED2 may not be converted into red light by the first wavelength shifter 345, but may be emitted through the first wavelength converting patterns 340. Components of the emission light L that are incident upon the second color filters 232 without being converted by the first wavelength converting patterns 340 may be blocked by the second color filters 232. On the contrary, red light obtained from the emission light L by the first wavelength converting patterns 340 may be emitted to the outside through the second color filters 232. That is, second light Lb, which is emitted from the second light transmission areas TA2, may be red light.

The second scatterer 343 may have a different refractive index from the second base resin 341 and may form an optical interface with the second base resin 341. For example, the second scatterer 343 may include light-scattering particles. The second scatterer 343 is substantially the same as the first scatterer 333, and thus, a detailed description thereof will be omitted.

The second wavelength converting patterns 350 may be positioned on the first capping layer 391, in the third light transmission areas TA3 and the sixth light transmission areas TA6. The second wavelength converting patterns 350 may extend further into the second light blocking areas BA2, the fifth light blocking areas BA5, the third light blocking areas BA3, and the sixth light blocking areas BA6. Second wavelength converting patterns 350 that extend further into the second light blocking areas BA2 and the fifth light blocking areas BA5 may partially cover the bottom surfaces of the first wavelength converting patterns 340 disposed in the second light blocking areas BA2 and the fifth light blocking areas BA5. Second wavelength converting patterns 350 that extend further into the third light blocking areas BA3 and the sixth light blocking areas BA6 may partially cover the bottom surfaces of the planarization patterns 360 that will be described later.

In the second light blocking areas BA2 and the fifth light blocking areas BA5, the first wavelength converting patterns 340 and the second wavelength converting patterns 350 may be disposed to overlap with one another in the thickness direction (i.e., third direction D3), and in the third light blocking areas BA3 and the sixth light blocking areas BA6, the second wavelength converting patterns 350 and the planarization patterns 360 may be disposed to overlap with one another in the thickness direction.

The second wavelength converting patterns 350 that extend further into the second light blocking areas BA2 and the fifth light blocking areas BA5 may be partially in contact with the bottom surfaces of the first wavelength converting patterns 340 disposed in the second light blocking areas BA2 and the fifth light blocking areas BA5. The second wavelength converting patterns 350 that extend further into the third light blocking areas BA3 and the sixth light blocking areas BA6 may be partially in contact with the bottom surfaces of the planarization patterns 360.

In some embodiments, as illustrated in FIG. 14, the second wavelength converting patterns 350 may be formed as stripes extending in the second direction D2 and may extend across the seventh light blocking area BA7 between the first and second rows RT1 and RT2, but the present disclosure is not limited thereto. In other embodiments, the second wavelength converting patterns 350 may be formed as, for example, islands, so that parts thereof disposed in the third light transmission areas TA3 and parts thereof disposed in the sixth light transmission areas TA6 may be spaced apart from one another.

The second wavelength converting patterns 350 may convert or shift the peak wavelength of incident light into a particular peak wavelength. In some embodiments, the second wavelength converting patterns 350 may convert emission light L1 provided by the third light-emitting elements ED3 into green light having a wavelength of about 510 nm to about 550 nm and may emit the green light.

In some embodiments, each of the second wavelength converting patterns 350 may include a third base resin 351 and a second wavelength shifter 355, which is dispersed in the third base resin 351, and may further include a second scatterer 353, which is dispersed in the third base resin 351.

The third base resin 351 may be formed of or include a material having a high light transmittance. In some embodiments, the third base resin 351 may be formed of or include an organic material. In some embodiments, the third base resin 351 may be formed of or include the same material as the first base resin 331 or may include at least one of the above-described exemplary materials for forming the first base resin 331.

The second wavelength shifter 355 may convert or shift the peak wavelength of incident light into a particular peak wavelength. In some embodiments, the second wavelength shifter 355 may convert blue light having a peak wavelength of 440 nm to 480 nm into green light having a wavelength of 510 nm to 550 nm.

Examples of the second wavelength shifter 355 may include quantum dots, quantum rods, or a phosphor. The second wavelength shifter 355 is substantially the same as, or similar to, the first wavelength shifter 345, and thus, a detailed description thereof will be omitted.

In some embodiments, the first and second wavelength shifters 345 and 355 may be formed of or include quantum dots. In this case, the particle size of the first wavelength shifter 345 may be greater than the particle size of the second wavelength shifter 355.

The second scatterer 353 may have a different refractive index from the third base resin 351 and may form an optical interface with the third base resin 351. For example, the second scatterer 353 may include light-scattering particles. The second scatterer 353 is substantially the same as the second scatterer 343, and thus, a detailed description thereof will be omitted.

The emission light L1 emitted from the third light-emitting elements ED3 may be provided to the second wavelength converting patterns 350, and the second wavelength shifters 355 of the second wavelength converting patterns 350 may convert the emission light L1 provided by the third light-emitting elements ED3 into green light having a peak wavelength of about 510 nm to about 550 nm and may emit the green light.

In a case where the emission light L1 is blue light, some of the emission light L1 may not be converted into green light by the second wavelength shifters 355 of the second wavelength converting patterns 350, but may be emitted through the second wavelength converting patterns 350 and blocked by the third color filters 235. On the contrary, the green light obtained from the emission light L1 of the first color by the second wavelength converting patterns 350 is emitted to the outside through the third color filters 235. Accordingly, third light Lc, which is emitted from the third light transmission areas TA3 to the outside of the display device 1, may be green light.

Referring to FIGS. 5, 10, and 14, the color converting substrate 30 of the display device 1 may further include the planarization patterns 360. The planarization patterns 360 may be positioned on the first capping layer 391, in the third light blocking areas BA3 and the sixth light blocking areas BA6. In some embodiments, as illustrated in FIG. 14, the planarization patterns 360 may be formed as stripes extending in the second direction D2 and may extend across the seventh light blocking area BA7 between the first and second rows RT1 and RT2.

As already mentioned above, the bottom surfaces of the planarization patterns 360 may be partially covered by the light transmission patterns 330 and the second wavelength converting patterns 350 and may be in contact with the light transmission patterns 330 and the second wavelength converting patterns 350.

The planarization patterns 360 may be formed of or include the same material as the first wavelength converting patterns 340, and the planarization patterns 360 and the first wavelength converting patterns 340 may be formed at the same time. That is, the planarization patterns 360 may be formed by the same processes, and at the same time, as the first wavelength converting patterns 340, i.e., the processes of applying, exposing, and developing a photosensitive material. As the first wavelength converting patterns 340 and the planarization patterns 360 include the same material, each of the planarization patterns 360, like each of the first wavelength converting patterns 340, may include a second base resin 341 and a first wavelength shifter 345, which is dispersed in the second base resin 341, and may further include a second scatterer 343, which is dispersed in the second base resin 341. The configuration of the planarization patterns 360 is the same as the configuration of the first wavelength converting patterns 340, and thus, a detailed description thereof will be omitted.

In an embodiment, for example, the planarization patterns 360, which include the first wavelength converting patterns 340, may also be referred to as "first wavelength converting patterns". That is, first wavelength converting patterns (340 and 360) may be understood as being disposed in the second light transmission areas TA2, the first light blocking areas BA1, the second light blocking areas BA2, the fifth light transmission areas TA5, the fourth light blocking areas BA4, and the fifth light blocking areas BA5 and further being disposed in the third light blocking areas BA3 and the sixth light blocking areas BA6. For convenience, first wavelength converting patterns (340 and 360) disposed in the second light transmission areas TA2, the first light blocking areas BA1, the second light blocking areas BA2, the fifth light transmission areas TA5, the fourth light blocking areas BA4, and the fifth light blocking areas BA5 will hereinafter be referred to as the first wavelength converting patterns 340, and first wavelength converting patterns (340 and 360) disposed in the third light blocking areas BA3 and the sixth light blocking areas BA6 will hereinafter be referred to as the planarization patterns 360.

The first wavelength converting patterns 340 and the planarization patterns 360 may be formed at the same time, then, the light transmission patterns 330 may be formed, and then, the second wavelength converting patterns 350 may be formed. In some embodiments, the first wavelength converting patterns 340 and the planarization patterns 360 may be formed at the same time, then, the second wavelength converting patterns 350 may be formed, and then, the light transmission patterns 330 may be formed. Accordingly, the bottom surfaces of the first wavelength converting patterns 340 and the bottom surfaces of the planarization patterns 360 may be covered by, and may thus be in direct contact with, their respective neighboring light transmission patterns 330 and their respective neighboring second wavelength converting patterns 350. Here, the color converting substrate 30 may be manufactured at bottom-up state and then attached to the filler 70.

The planarization patterns 360 may support the upper light blocking members 370, from below the upper light blocking members 370 (in a view from the second base portion 310) and may thus prevent the upper light blocking members 370 from collapsing or tilting.

As illustrated in FIGS. 5 and 7 through 10, a second capping layer 393 may be positioned on the light transmission patterns 330, the first wavelength converting patterns 340, the second wavelength converting patterns 350, and the planarization patterns 360. The second capping layer 393 may cover the light transmission patterns 330, the first wavelength converting patterns 340, the second wavelength converting patterns 350, and the planarization patterns 360. The second capping layer 393 may not be in contact with the first capping layer 391 and may seal the light transmission patterns 330, the first wavelength converting patterns 340, the second wavelength converting patterns 350, and the planarization patterns 360. As a result, the light transmission patterns 330, the first wavelength converting patterns 340, the second wavelength converting patterns 350, and the planarization patterns 360 can be prevented from being damaged or contaminated by impurities from the outside, such as moisture or the air. In some embodiments, the second capping layer 393 may be formed of or include an inorganic material. In some embodiments, the second capping layer 393 may be formed of or include the same material as the first capping layer 391 and may include at least one of the above-described exemplary materials for forming the first capping layer 391. In a case where the first and second capping layers 391 and 393 are both formed of or include an inorganic material, an inorganic-inorganic bonding may be formed in parts that are in direct contact with the first or second capping layer 391 or 392, and as a result, the inflow of moisture or the air from the outside can be effectively blocked.

The color converting substrate 30 of the display device 1 may further include the upper light blocking members 370. The upper light blocking members 370 may be positioned on the second capping layer 393, in the first light blocking areas BA1, the second light blocking areas BA2, the third light blocking areas BA3, the fourth light blocking areas BA4, the fifth light blocking areas BA5, and the sixth light blocking areas BA6. The upper light blocking members 370 may be in contact with the second capping layer 393. The upper light blocking members 370 may be disposed to overlap with the first wavelength converting patterns 340, which extend into the first light blocking areas BA1, the second light blocking areas BA2, the third light blocking areas BA3, the fourth light blocking areas BA4, and the fifth light blocking areas BA5, in the thickness direction and to overlap with the planarization patterns 360, which are disposed in the third light blocking areas BA3 and the sixth light blocking areas BA6, in the thickness direction.

In some embodiments, the upper light blocking members 370 may be in direct contact with the first wavelength converting patterns 340, which extend into the first light blocking areas BA1, the second light blocking areas BA2, the third light blocking areas BA3, the fourth light blocking areas BA4, and the fifth light blocking areas BA5, and with the planarization patterns 360, which are disposed in the third light blocking areas BA3 and the sixth light blocking areas BA6. In this case, parts of the second capping layer 393 disposed between the upper light blocking members 370, the first wavelength converting patterns 340, and the planarization patterns 360 may be positioned on the upper light blocking members 370, between the upper light blocking members 370 and the filler 70.

The upper light blocking members 370 may include an organic light-blocking material and may be formed by coating and exposing an organic light-blocking material.

As illustrated in FIG. 14, the upper light blocking members 370 may be formed as stripes extending in the second direction D2 and may extend across the seventh light blocking area BA7 between the first and second rows RT1 and RT2.

The upper light blocking members 370 may be positioned in the light blocking areas BA and may thus block the transmission of light. Specifically, the upper light blocking members 370 may be positioned between the light transmission patterns 330 and the first wavelength converting patterns 340 and between the first wavelength converting patterns 340 and the second wavelength converting patterns 350 to prevent color mixing between adjacent light transmission areas.

The planarization patterns 360 may support the upper light blocking members 370 on, from below the upper light blocking members 370 (in a view from the second base portion 310) and may thus prevent parts of the upper light blocking members 370 from collapsing or tilting. To prevent color mixing between adjacent light transmission areas, the width and thickness of the upper light blocking members 370 may preferably be determined in consideration of the size of neighboring light-emitting areas in the thickness direction and the distance to the neighboring light-emitting areas.

If the width of the upper light blocking members 370 is increased too much for the color mixing prevention function of the upper light blocking members 370, the overlapping area of the upper light blocking members 370 with the light transmission patterns 330, the first wavelength converting patterns 340, and the second wavelength converting patterns 350 may increase, and as a result, the efficiency of the display device 1 may decrease.

If the thickness of the upper light blocking members 370 is increased too much for the color mixing prevention function of the upper light blocking members 370, the thickness of the filler 70 may increase accordingly, and as a result, processing time may increase. That is, the thickness of the upper light blocking member 370 may have an appropriate thickness for properly performing the color mixing prevention function. However, if the first wavelength converting patterns 340, the second wavelength converting patterns 350, and the light transmission patterns 330 are physically spaced apart from one another in the light blocking areas BA where the upper light blocking members 370 are disposed, for example, in the first light blocking areas BA1, the second light blocking areas BA2, and the third light blocking areas BA3, the upper light blocking members 370 may collapse or tilt due to the gaps between the first wavelength converting patterns 340, the second wavelength converting patterns 350, and the light transmission patterns 330.

As in the color converting substrate 30 of the display device 1, the first wavelength converting patterns 340 are disposed to extend into their respective neighboring light blocking areas BA, for example, into the first light blocking areas BA1 and the second light blocking areas BA2, and thus to support their corresponding upper light blocking members 370 in the thickness direction, from below the upper light blocking members 370, and the planarization patterns 360 are disposed in, for example, the third light blocking areas BA3, to support their corresponding upper light blocking members 370 in the thickness direction, from below the upper light blocking members 370, the upper light blocking members 370 can be prevented from collapsing or tilting due to any gaps compared to a case that there is no planarization patterns 360 below the upper light blocking members 370. As a result, the upper light blocking members 370 can properly perform the function of preventing color mixing between adjacent light transmission areas, without the need to increase the width or thickness of the upper light blocking members 370.

As already mentioned above, the filler 70 may be positioned between the color converting substrate 30 and the display substrate 10. In some embodiments, as illustrated in FIGS. 5 and 7 through 10, the filler 70 may be positioned between the second capping layer 393 and the thin-film encapsulation layer 170 and between the upper light blocking members 370 and the thin-film encapsulation layer 170. In some embodiments, the filler 70 may be in direct contact with the second capping layer 393 and the upper light blocking members 370.

Figure 15:
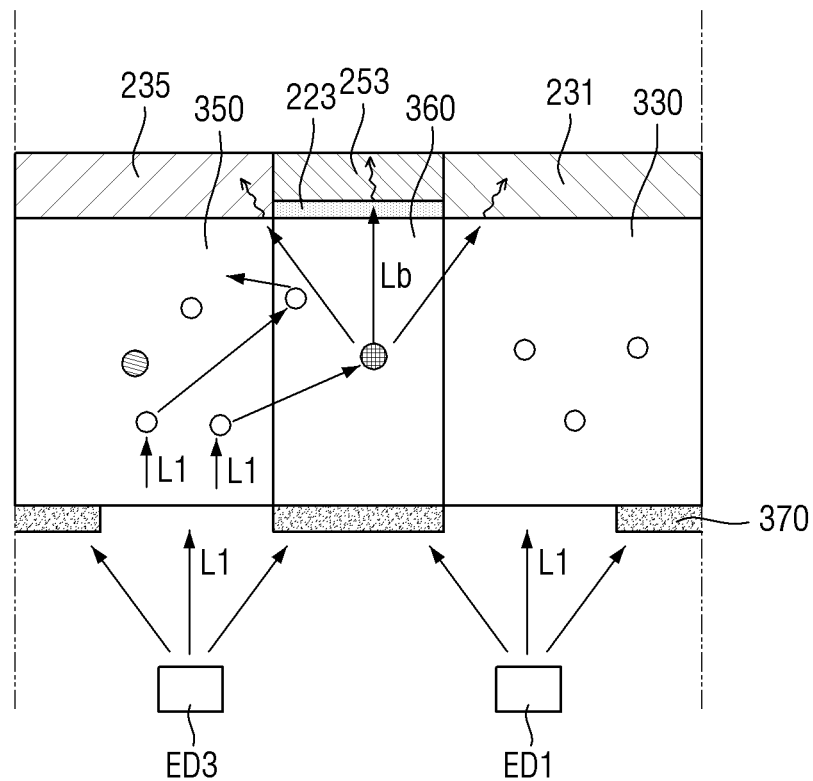
FIG. 15 is a cross-sectional view illustrating the functions of planarization patterns and upper light blocking members according to an embodiment of the present disclosure.

FIG. 15 is a cross-sectional view illustrating the functions of planarization patterns and upper light blocking members according to an embodiment of the present disclosure.

Referring to FIG. 15, some of the emission light L1 emitted from the third light-emitting elements ED3 may be absorbed by the upper light blocking members 370, which are disposed in each light blocking area. Emission light L1 introduced in directions that are not absorbed by the upper light blocking members 370 may be scattered by, for example, the second scatterers (353 of FIG. 5) of the second wavelength converting patterns 350. Some of the scattered light may be incident upon planarization patterns 360 adjacent to the second wavelength converting patterns 350 and may be absorbed, and converted into second light (Lb of FIG. 5), by the first wavelength shifters (345 of FIG. 5) of the planarization patterns 360, as illustrated in FIG. 15. The second light (Lb of FIG. 5) may be absorbed by, for example, the third lower light blocking members 223, the third color filters 235, and the first color filters 231, and thus may not be emitted out of the display device 1, as illustrated in FIG. 15. Also, some of the scattered light incident upon the planarization patterns 360 may be scattered by scatters (352 of FIG. 5) and may thus travel back toward the second wavelength converting patterns 350. That is, the planarization patterns 360 may perform a recycle function. FIG. 15 illustrates only the emission light L1 emitted from the third light-emitting elements ED3. Emission light L1 emitted from the first light-emitting elements ED1 may travel substantially in the same manner as the emission light L1 emitted from the third light-emitting elements ED3, and thus, a detailed description thereof will be omitted.

Display devices according to other embodiments of the present disclosure will hereinafter be described. Like reference numerals indicate like elements throughout the present disclosure, and thus, descriptions thereof will be omitted or simplified.

Figure 16:
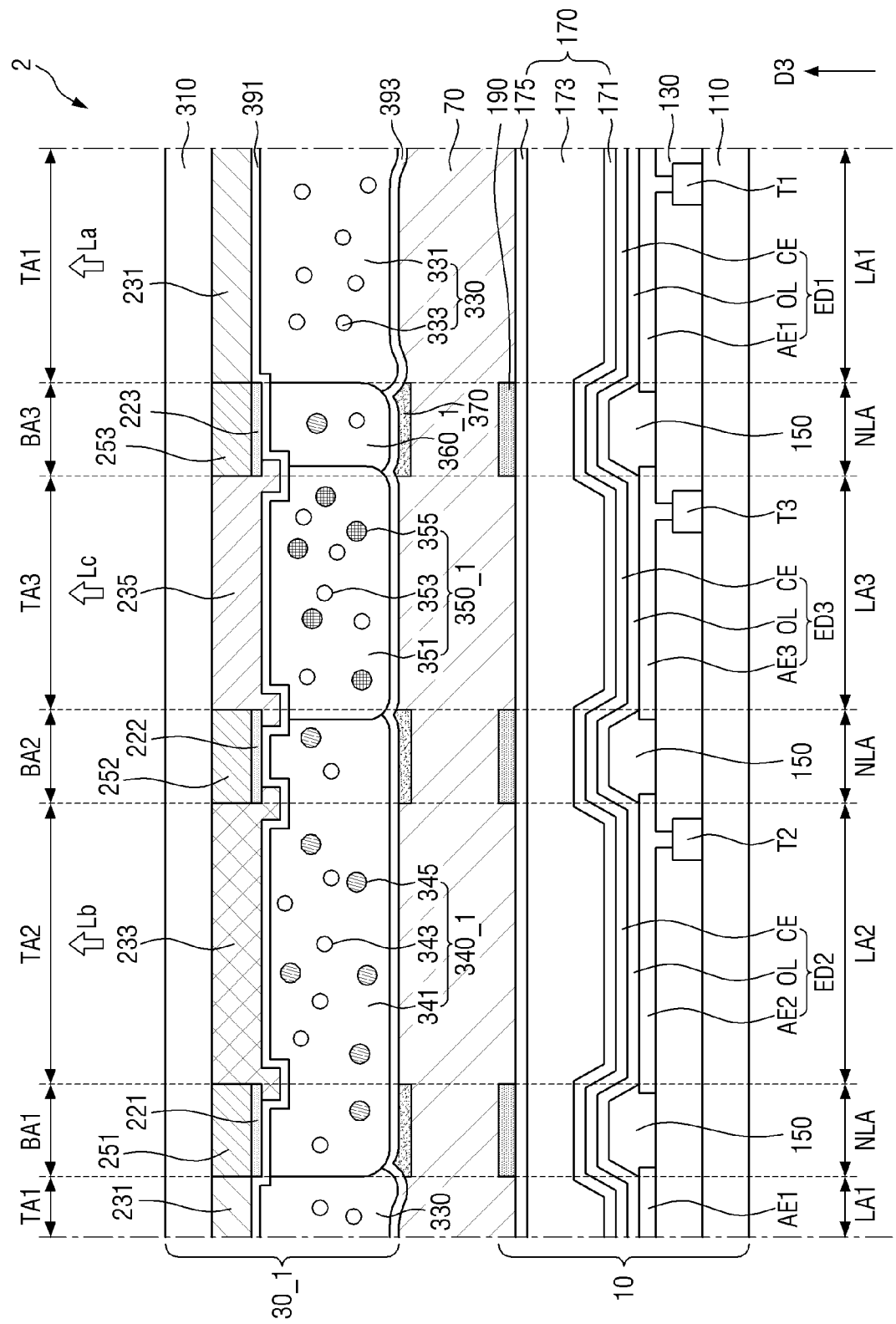
FIG. 16 is a cross-sectional view of a display device according to another embodiment of the present disclosure.

FIG. 16 is a cross-sectional view of a display device according to another embodiment of the present disclosure.

Referring to FIG. 16, a color converting substrate 30_1 of a display device 2 differs from its counterpart of FIG. 5 in that planarization patterns 360_1 partially cover the bottom surfaces of their respective neighboring second wavelength converting patterns 3501, and first wavelength converting patterns 340_1 partially cover the bottom surfaces of their respective neighboring second wavelength converting patterns 350_1.

Specifically, in the color converting substrate 30_1 of the display device 2, the planarization patterns 360_1 may overlap with their respective neighboring second wavelength converting patterns 350_1 in the third light transmission area TA3, and the first wavelength converting patterns 340_1 may overlap with their respective neighboring second wavelength converting patterns 350_1 in the third light transmission area TA3.

The embodiment of FIG. 16 forms the second wavelength converting patterns 350_1 first, then forms the first wavelength converting patterns 340_1 and the planarization patterns 360_1 at the same time, and then forms the light transmission patterns 330.

Figure 17:
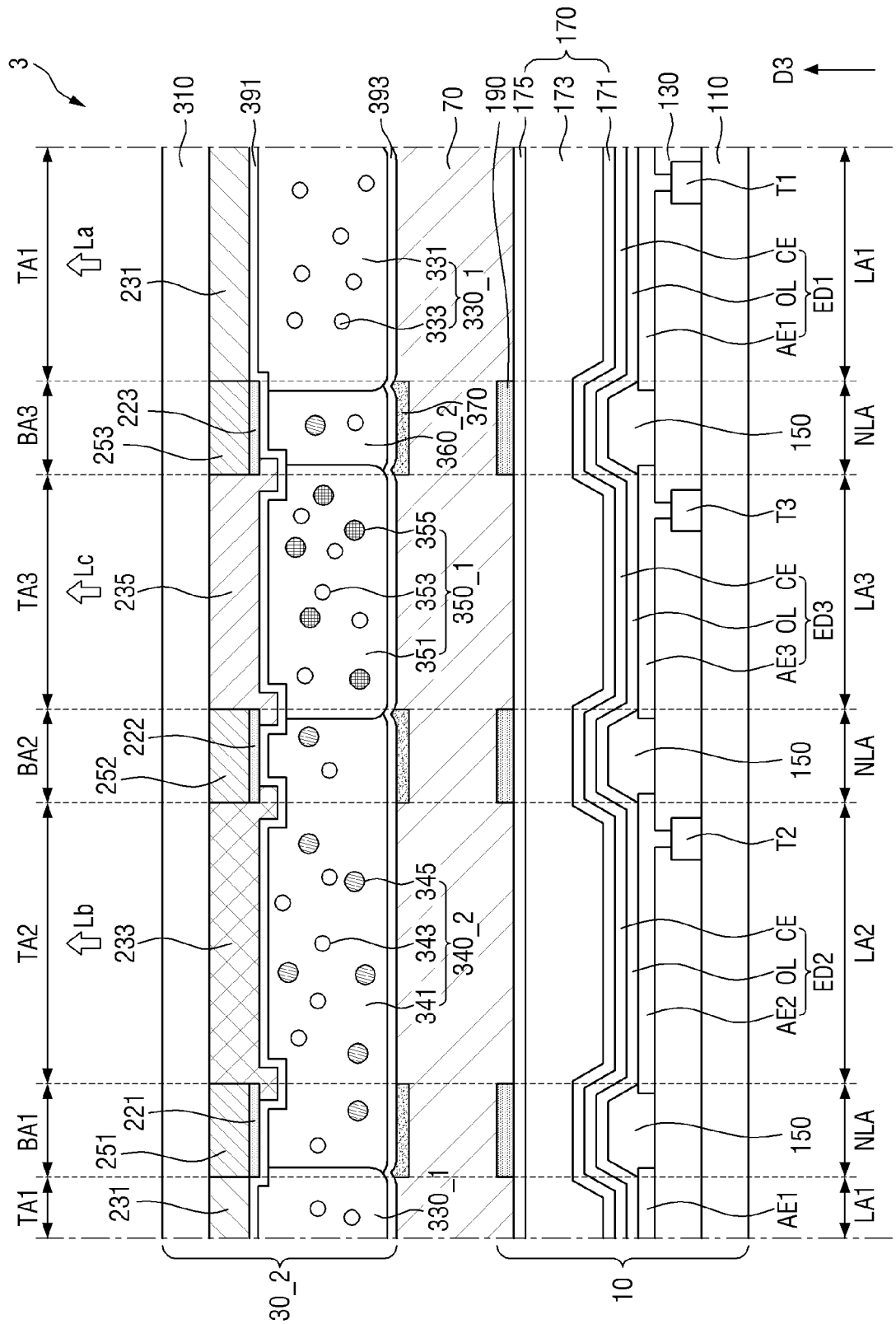
FIG. 17 is a cross-sectional view of a display device according to another embodiment of the present disclosure.

FIG. 17 is a cross-sectional view of a display device according to another embodiment of the present disclosure.

Referring to FIG. 17, a color converting substrate 30_2 of a display device 3 differs from its counterpart of FIG. 16 in that planarization patterns 360_2 partially cover the bottom surfaces of their respective neighboring light transmission patterns 330_1 and second wavelength converting patterns 3501, and first wavelength converting patterns 340_2 partially cover the bottom surfaces of their respective neighboring light transmission patterns 330_1 and second wavelength converting patterns 350_1.

Specifically, in the color converting substrate 30_2 of the display device 3, the planarization patterns 360_2 may overlap with their respective neighboring light transmission patterns 330_1 and second wavelength converting patterns 350_1 in the first light transmission area TA1 or in the third light transmission area TA3, and the first wavelength converting patterns 340_2 may overlap with their respective neighboring light transmission patterns 330_1 and second wavelength converting patterns 350_1 in the first light transmission area TA1 or in the third light transmission area TA3.

The embodiment of FIG. 17 forms the light transmission patterns 330_1 first, then forms second wavelength converting patterns 350_1, and then forms the first wavelength converting patterns 340_2 and the planarization patterns 360_2 at the same time. In some embodiments, the order in which the light transmission patterns 330_1 and the second wavelength converting patterns 350_1 are formed may be reversed.

Figure 18:
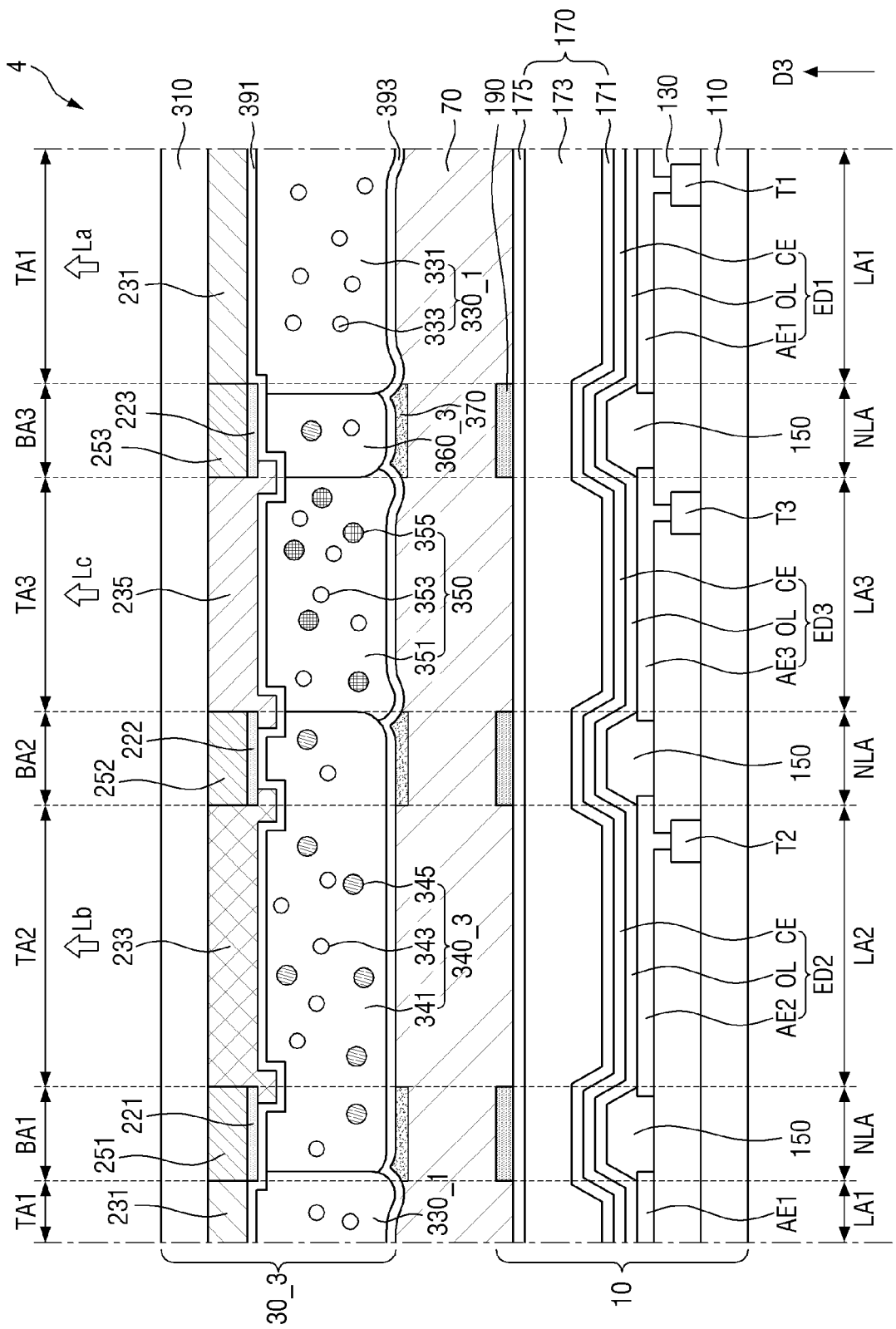
FIG. 18 is a cross-sectional view of a display device according to another embodiment of the present disclosure.
Figure 19:
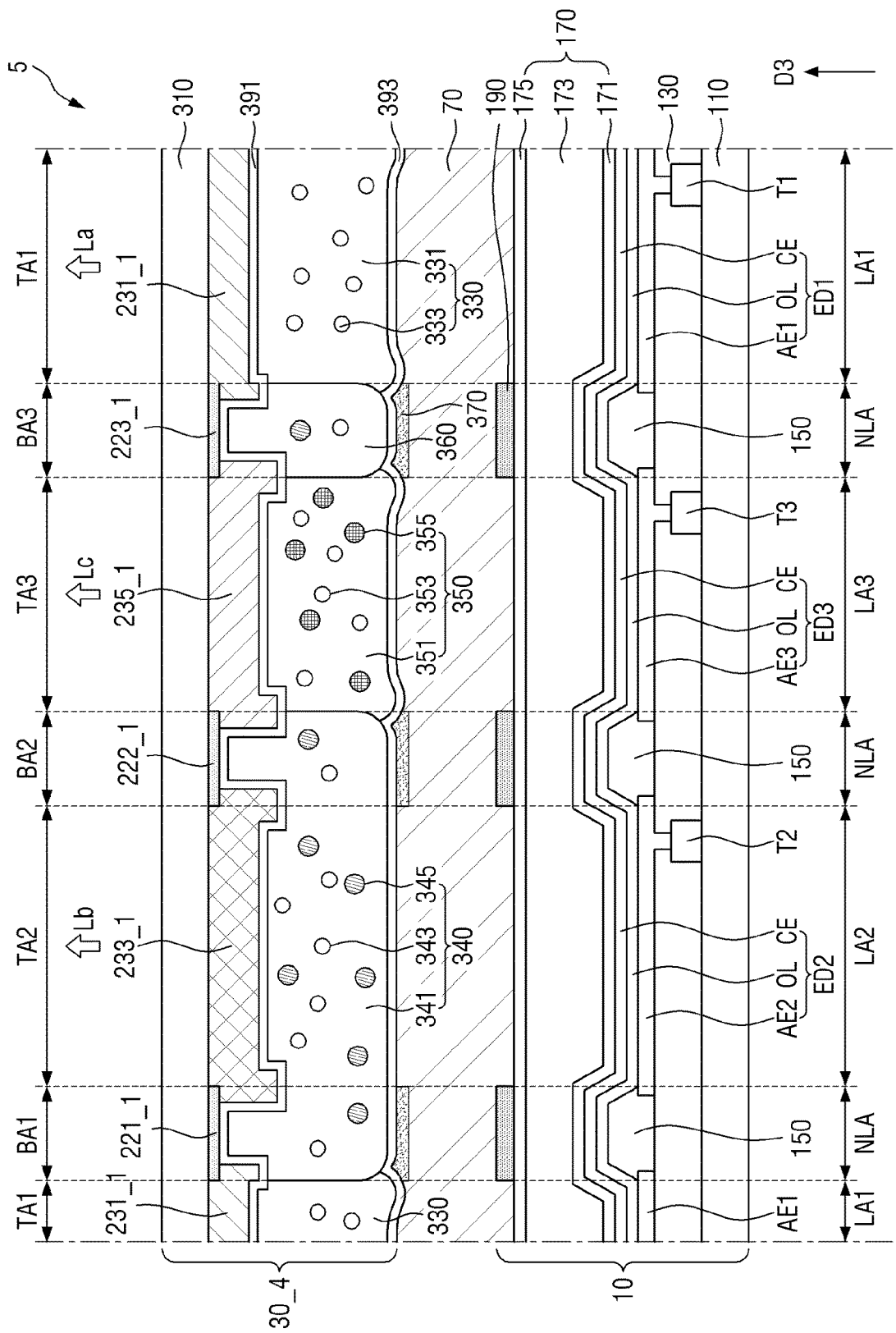
FIGS. 19 through 23 are cross-sectional views of display devices according to another embodiment of the present disclosure.
Figure 20:
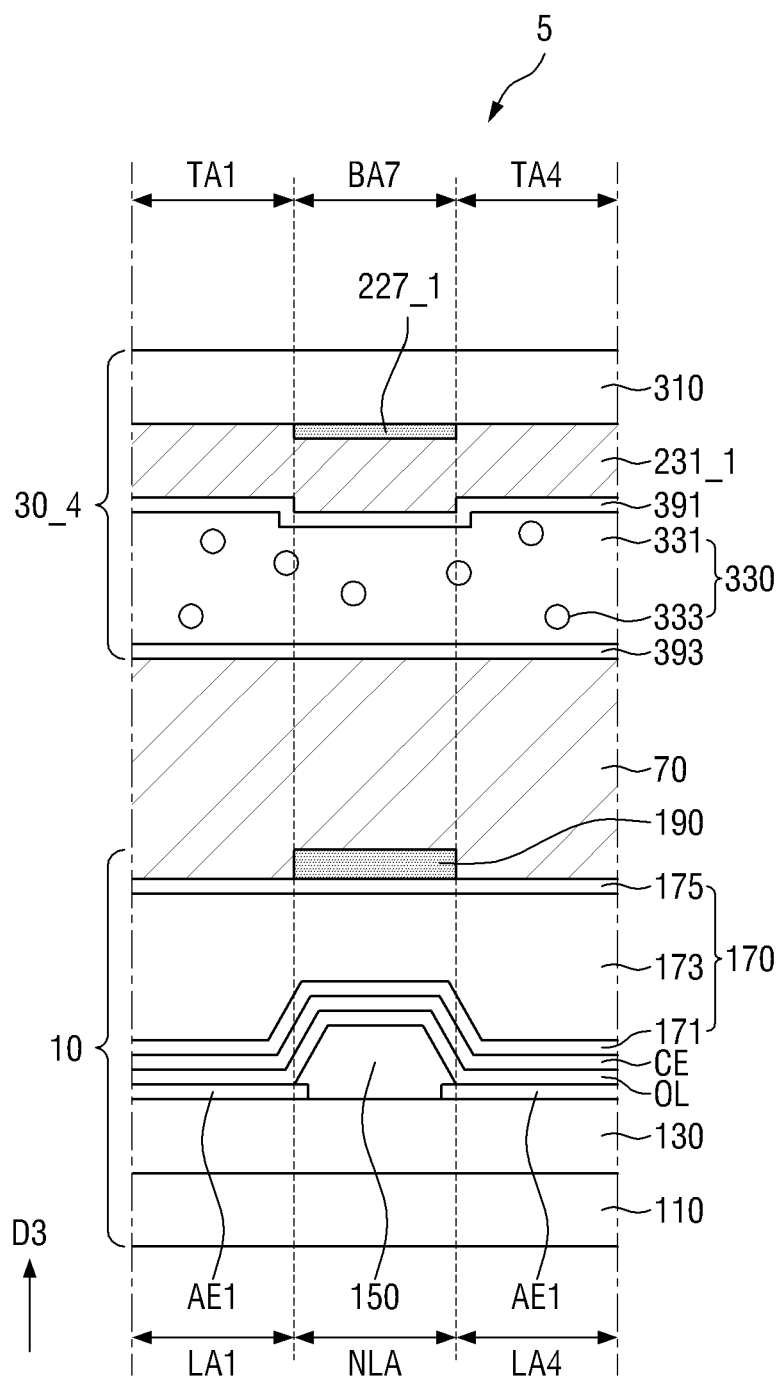
Figure 21:
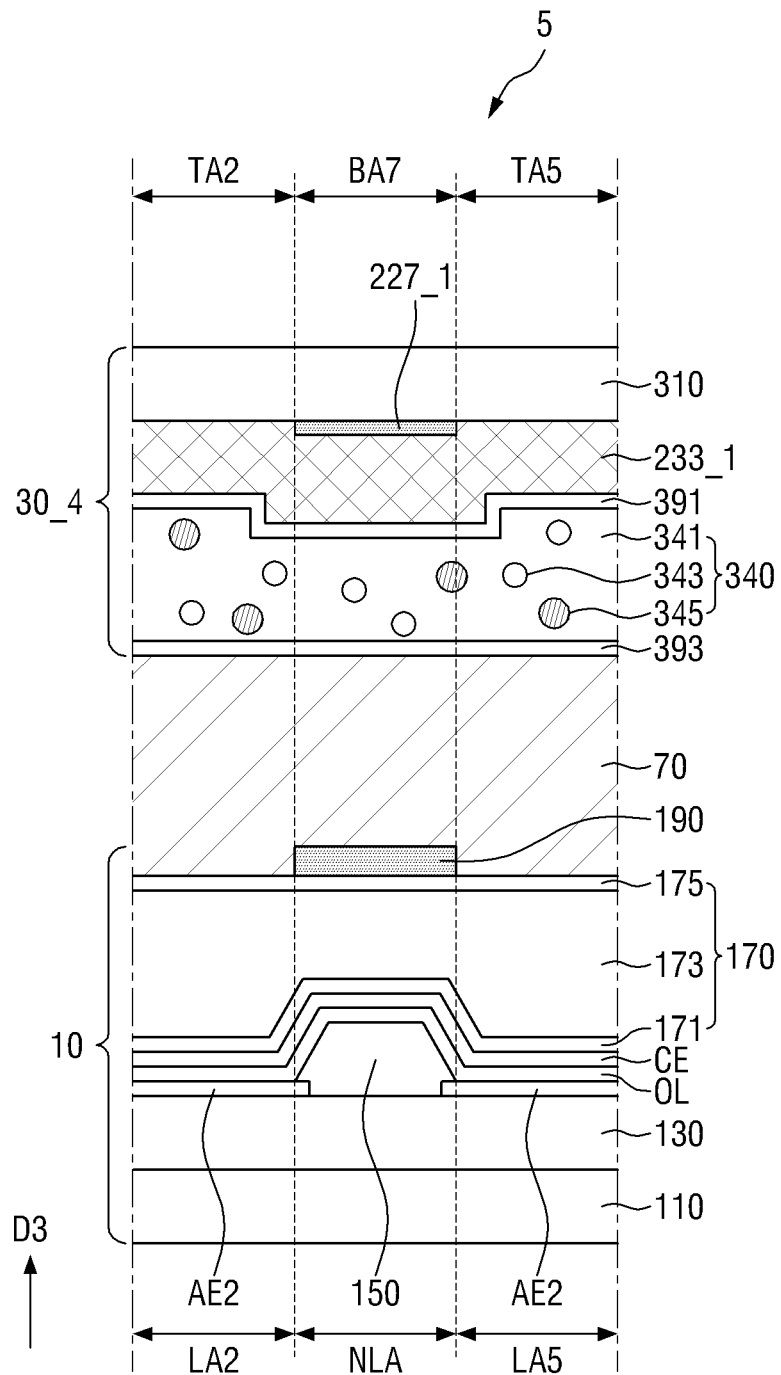
Figure 22:
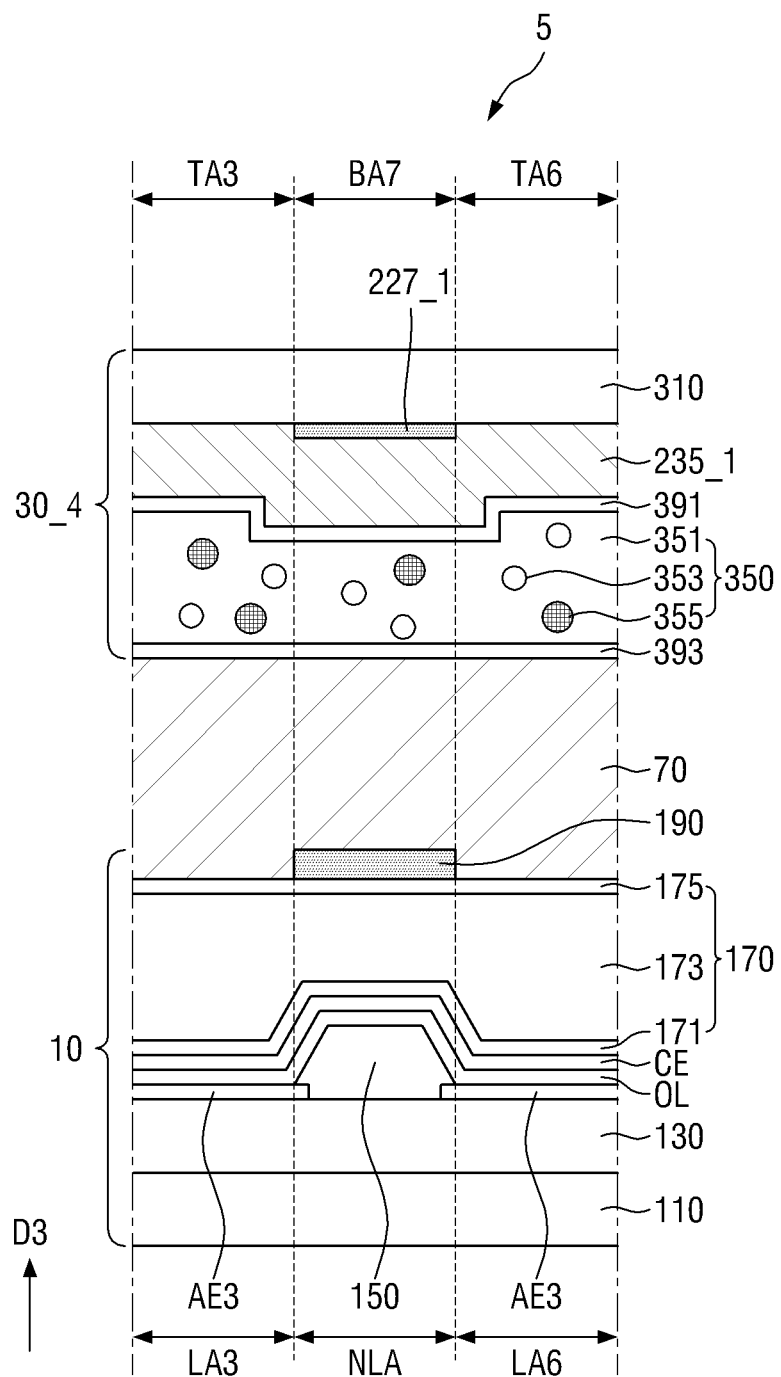
Figure 23:
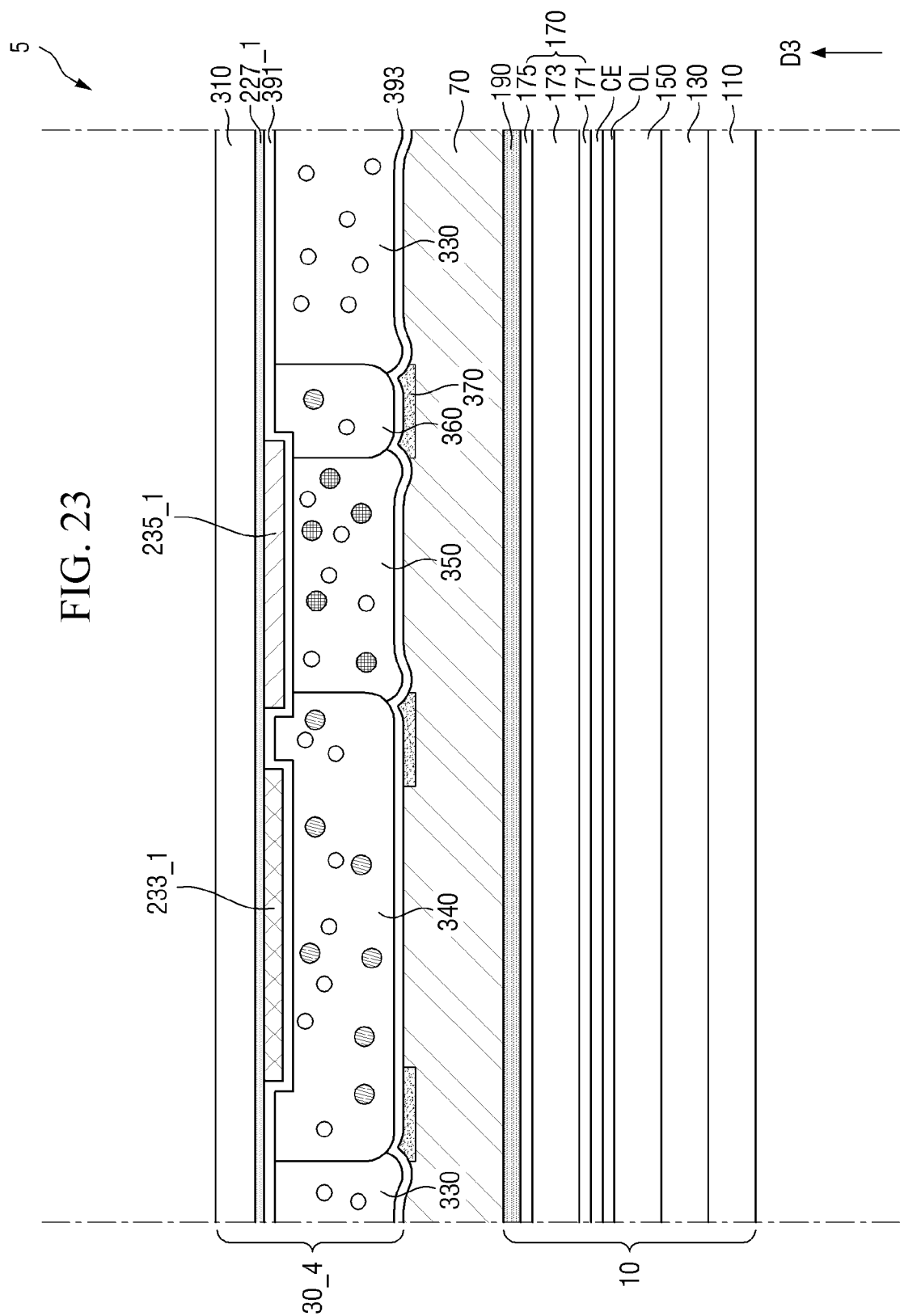

FIG. 18 is a cross-sectional view of a display device according to another embodiment of the present disclosure.

Referring to FIG. 18, a color converting substrate 30_3 of a display device 4 differs from its counterpart of FIG. 17 in that second wavelength converting patterns 350 partially cover the bottom surfaces of their respective neighboring planarization patterns 360_3 and the bottom surfaces of their respective neighboring first wavelength converting patterns 340_3.

Specifically, in the color converting substrate 30_3 of the display device 4, the second wavelength converting patterns 350 may overlap with their respective neighboring planarization patterns 360_3 in the third light blocking area BA3 and with their respective neighboring first wavelength converting patterns 340_3 in the second light blocking area BA2.

The embodiment of FIG. 18 forms light transmission patterns 330_1 first, then forms the first wavelength converting patterns 340_3 and the planarization patterns 3603, and then forms the second wavelength converting patterns 350.

Figure 24:
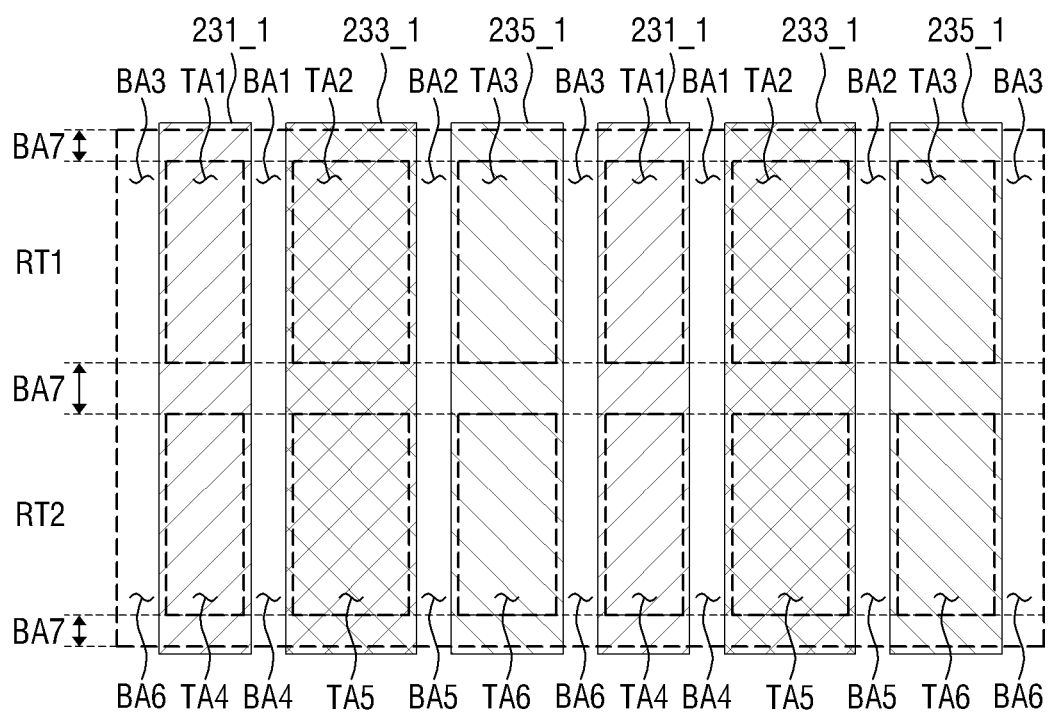
FIG. 24 is a plan view illustrating the layout of first color filters, second color filters, and third color filters in a color converting substrate of a display device according to another embodiment of the present disclosure.
Figure 25:
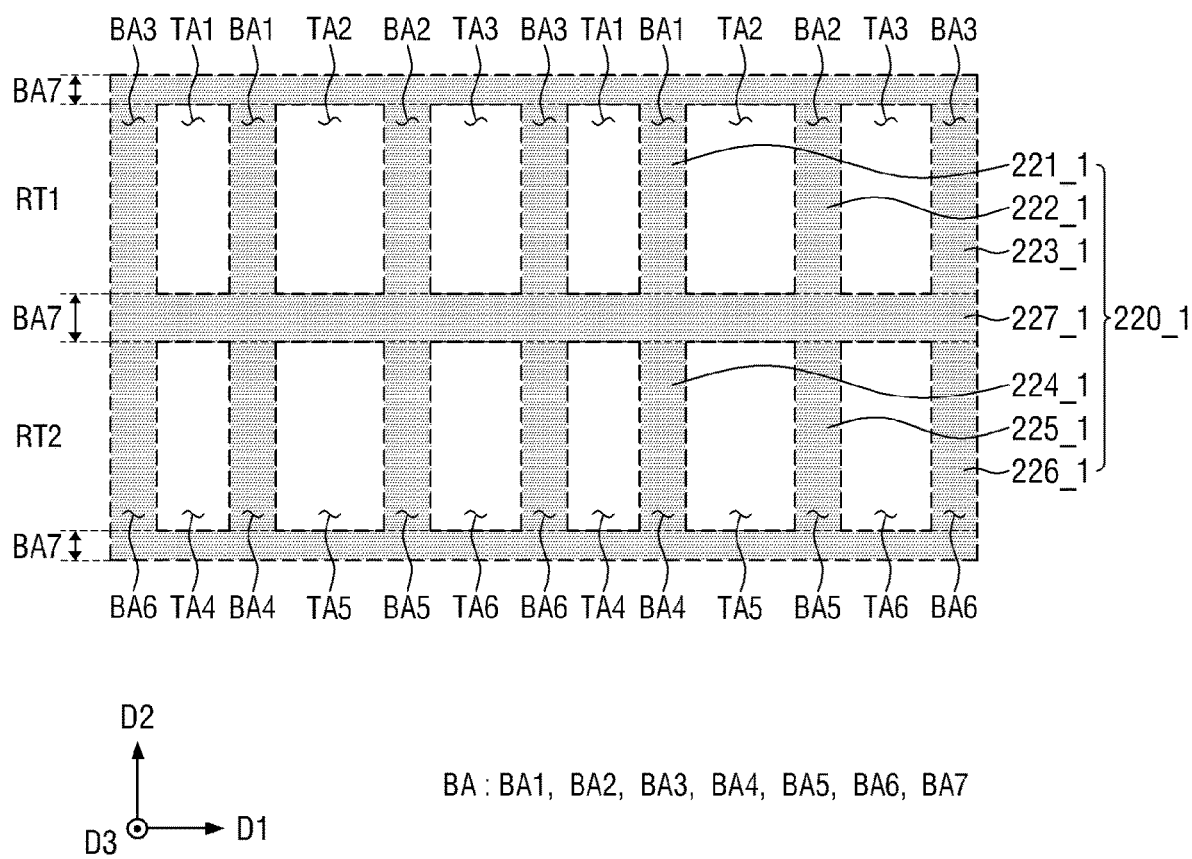
FIG. 25 is a plan view illustrating the layout of lower light blocking members in a color converting substrate of a display device according to another embodiment of the present disclosure.

FIGS. 19 through 23 are cross-sectional views of a display device according to another embodiment of the present disclosure, FIG. 24 is a plan view illustrating the layout of first color filters, second color filters, and third color filters in a color converting substrate of the display device according to another embodiment of the present disclosure, and FIG. 25 is a plan view illustrating the layout of lower light blocking members in a color converting substrate of the display device according to another embodiment of the present disclosure.

Referring to FIGS. 19 through 25, a color converting substrate 304 of a display device 5 differs from its counterpart of the display device 1 in that it does not include color patterns 250.

Specifically, in the color converting substrate 30_4 of the display device 5, lower light blocking members 220_1 (i.e., 221_1 through 227_1) may be interposed between a second base portion 310 and first wavelength converting patterns 340 and between the second base portion 310 and planarization patterns 360.

The lower light blocking members 220_1 may be in direct contact with the second base portion 310. The lower light blocking members 220_1 have substantially the same planar shape as the lower light blocking members 220 of FIG. 12, and thus, a detailed description thereof will be omitted.

Figure 26:
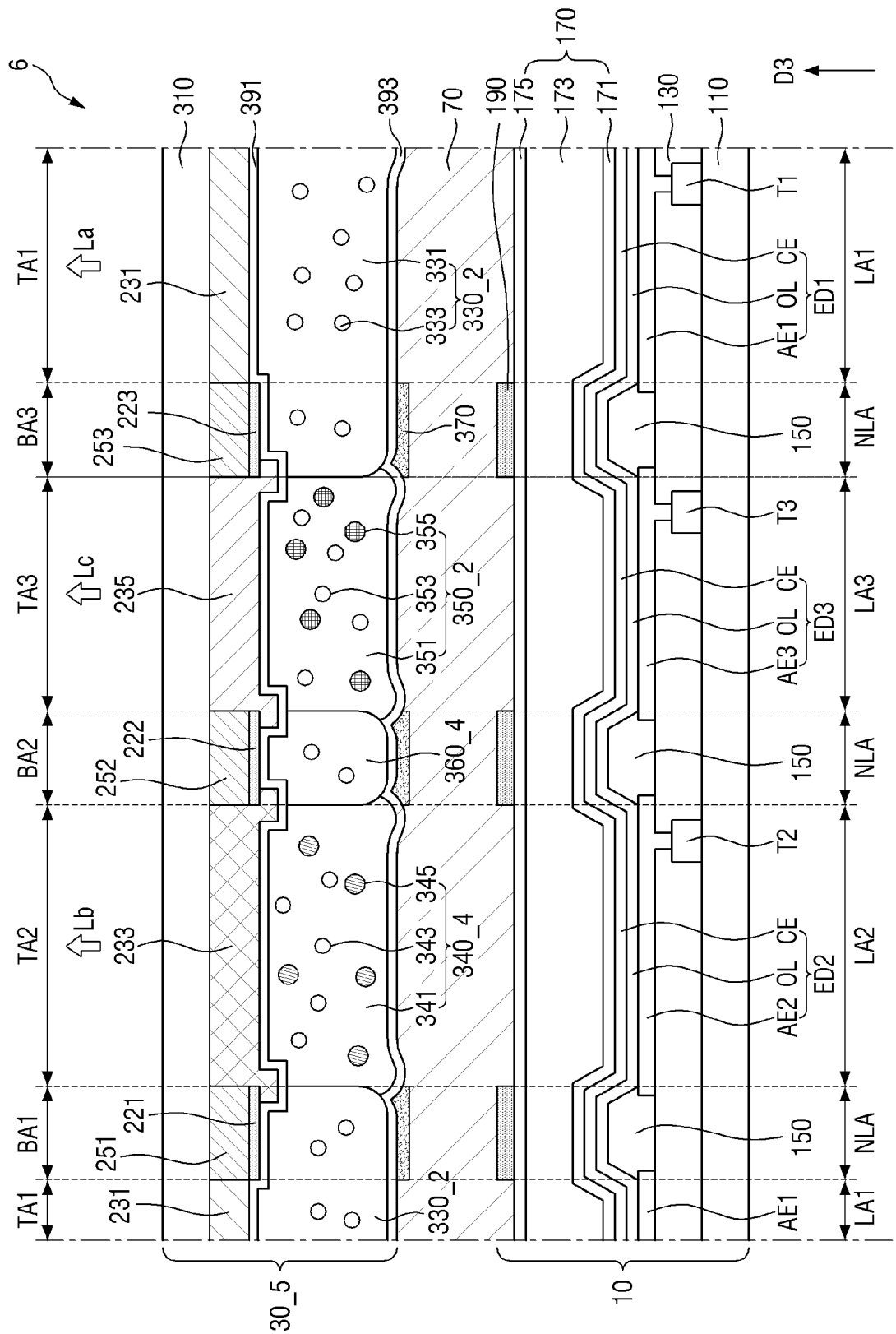
FIGS. 26 and 27 are cross-sectional views of a display device according to another embodiment of the present disclosure.
Figure 27:
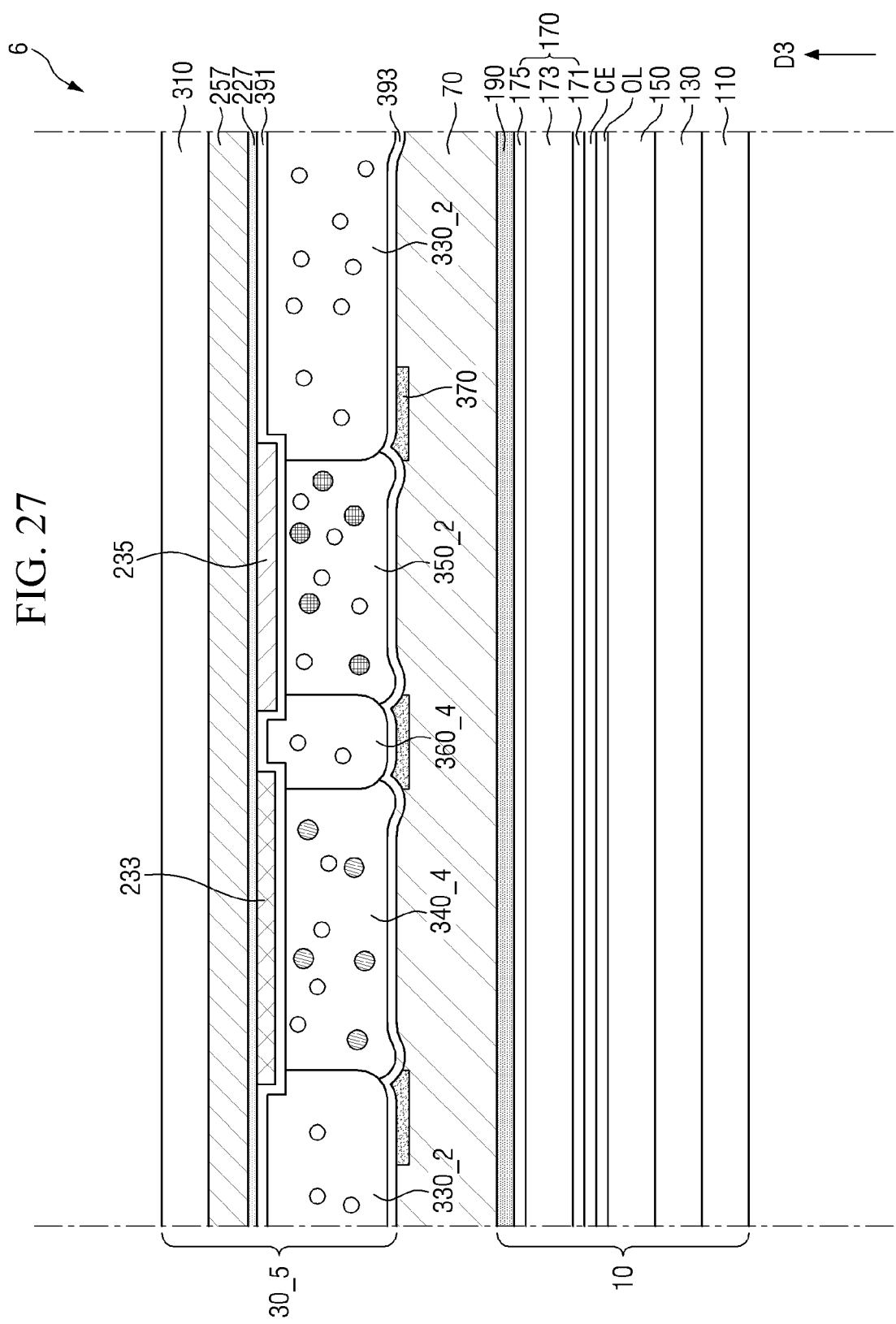
Figure 28:
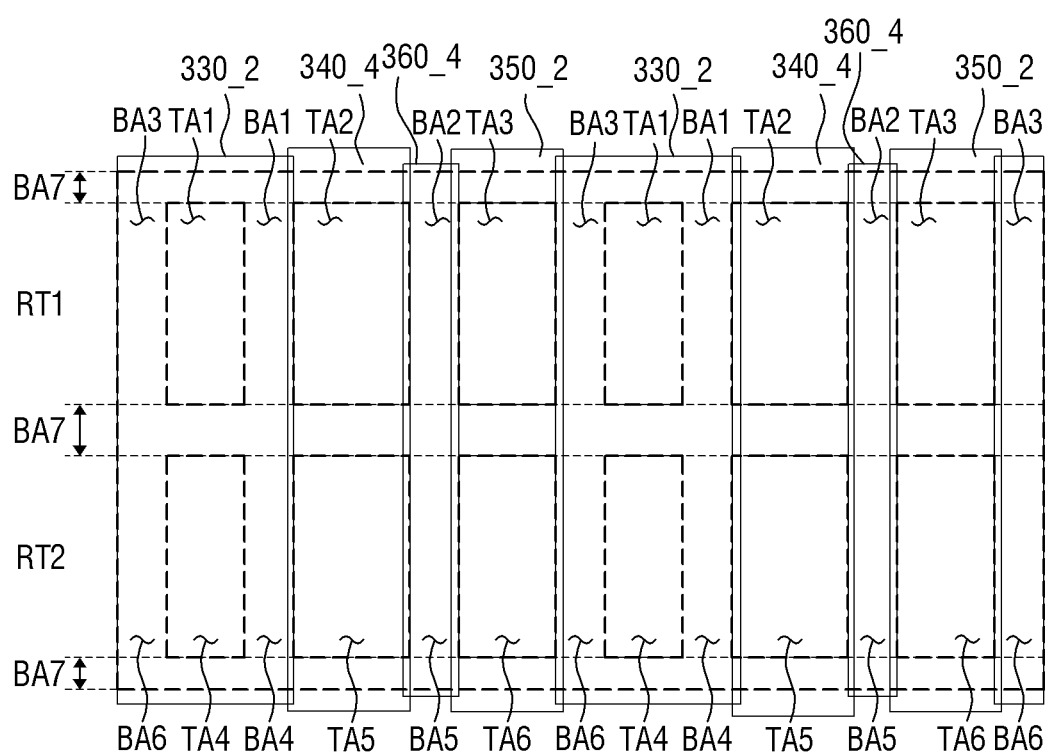
FIG. 28 is a plan view illustrating the layout of first wavelength converting patterns, second wavelength converting patterns, light transmission patterns, planarization patterns, and upper light blocking members in a color converting substrate of a display device according to another embodiment of the present disclosure.

FIGS. 26 and 27 are cross-sectional views of a display device according to another embodiment of the present disclosure, and FIG. 28 is a plan view illustrating the layout of first wavelength converting patterns, second wavelength converting patterns, light transmission patterns, planarization patterns, and upper light blocking members in a color converting substrate of the display device according to another embodiment of the present disclosure.

Referring to FIGS. 26 through 28, a color converting substrate 30_5 of a display device 6 differs from the color converting substrate 30 of the display device 1 in that light transmission patterns 330_2 are positioned on a first capping layer 391 to extend further into third light blocking areas BA3, sixth light blocking areas BA6, first light blocking areas BA1, and fourth light blocking areas BA4, which are adjacent to first light transmission areas TA1 or fourth light transmission areas TA4, and planarization patterns 360_4 include the same material as the light transmission patterns 330_2. The light transmission patterns 330_2 and the planarization patterns 360_4 may be formed by the same process.

The light transmission patterns 330_2 may be disposed to overlap with their respective neighboring first wavelength converting patterns 340_4 and their respective neighboring second wavelength converting patterns 350_2 in a plan view. The planarization patterns 360_4, which include the same material as the light transmission patterns 330_2, may be disposed to overlap with their respective neighboring first wavelength converting patterns 340_4 and their respective neighboring second wavelength converting patterns 350_2 in a plan view.

The light transmission patterns 330_2 may be partially covered by the bottom surfaces of their respective neighboring first wavelength converting patterns 340_4 and the bottom surfaces of their respective neighboring second wavelength converting patterns 350_2, and the planarization patterns 360_4, which include the same material as the light transmission patterns 330_2, may be partially covered by the bottom surfaces of their respective neighboring first wavelength converting patterns 340_4 and the bottom surfaces of their respective neighboring second wavelength converting patterns 350_2.

The light transmission patterns 3302 may be in direct contact with the bottom surfaces of their respective neighboring first wavelength converting patterns 340_4 and the bottom surfaces of their respective neighboring second wavelength converting patterns 350_2, and the planarization patterns 360_4, which include the same material as the light transmission patterns 330_2, may be in direct contact with the bottom surfaces of their respective neighboring first wavelength converting patterns 340_4 and the bottom surfaces of their respective neighboring second wavelength converting patterns 350_2.

The light transmission patterns 330_2 and the planarization patterns 360_4 may be formed first, and then, the first wavelength converting patterns 340_4 or the second wavelength converting patterns 350_2 may be formed.

However, the present disclosure is not limited to this. As already mentioned above with regard to the formation of the light transmission patterns 330, the planarization patterns 360_4 the first wavelength converting patterns 340_4, and the second wavelength converting patterns 350_2 of the color converting substrate 30_5 of the display device 6, the order in which to form the light transmission patterns 330_2, the planarization patterns 360_4, the first wavelength converting patterns 340_4, and the second wavelength converting patterns 350_2 may vary, and it may also vary whose bottom surfaces the light transmission patterns 330_2, the planarization patterns 360_4, the first wavelength converting patterns 340_4, and the second wavelength converting patterns 350_2 are in direct contact with.

Figure 29:
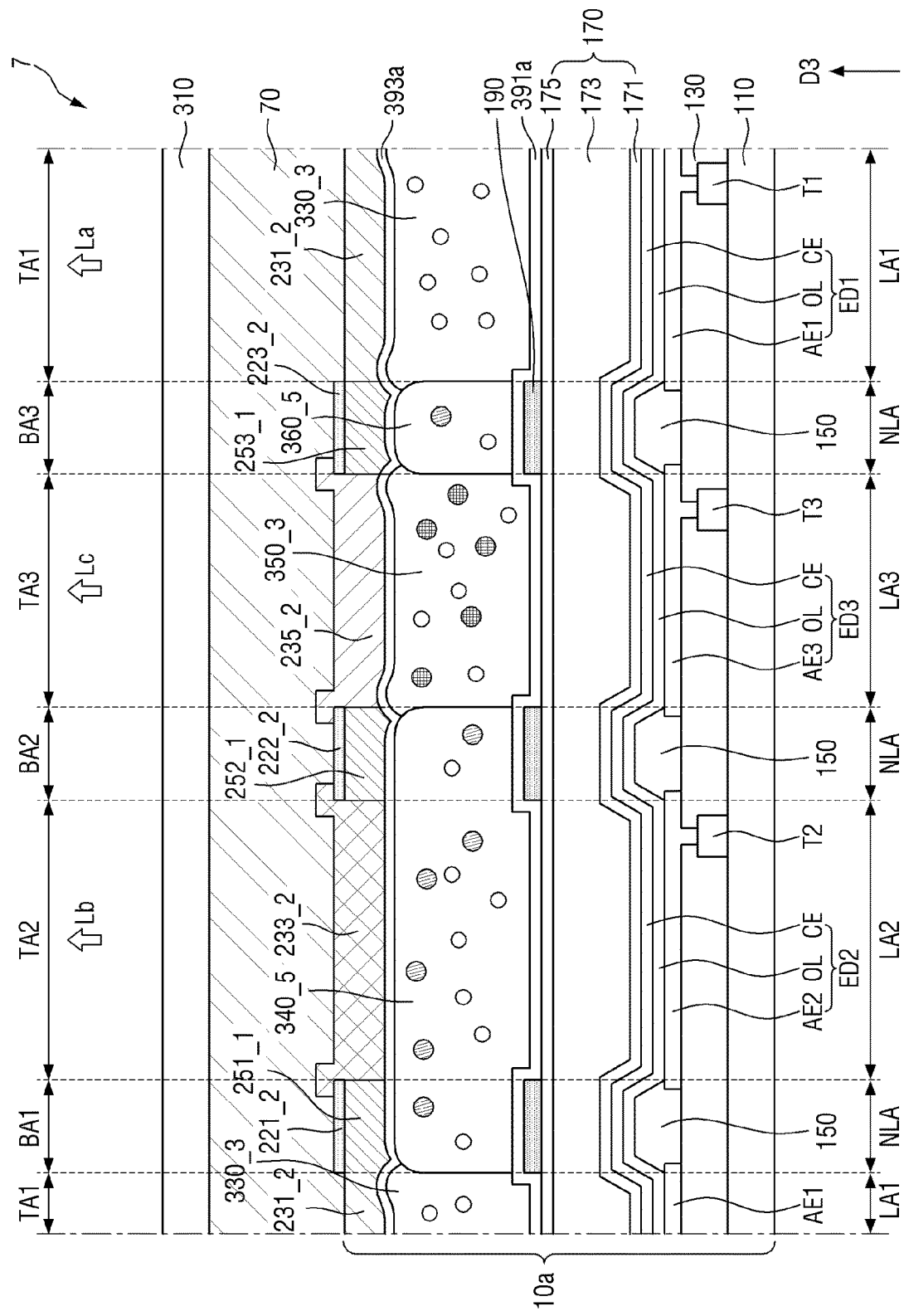
FIG. 29 is a cross-sectional view of a display device according to another embodiment of the present disclosure.

FIG. 29 is a cross-sectional view of a display device according to another embodiment of the present disclosure.

Referring to FIG. 29, a display device 7 differs from its counterpart of FIG. 5 in that a display substrate 10a includes light transmission patterns 3303, wavelength converting patterns (340_5 and 350_3), planarization patterns 3605, color filters (231_2, 233_2, and 235_2), color patterns (251_1, 2521, and 253_1), and light-blocking members (221_2, 222_2, and 223_2).

Specifically, the display substrate 10a of the display device 7 includes all the elements of the color converting substrate 30 of FIG. 5, except for the second base portion 310. The display device 7 is substantially the same as its counterpart of FIG. 5 and thus will hereinafter be described, focusing mainly on the differences with its counterpart of FIG. 5.

The display substrate 10a will hereinafter be described.

Display light blocking members 190, which are as already described above with reference to FIG. 5, may be disposed on a thin-film encapsulation layer 170.

A first capping layer 391a, which covers the display light blocking members 190, may be further disposed on the thin-film encapsulation layer 170. In this case, the first capping layer 391a may be in contact with the thin-film encapsulation layer 170 and the display light blocking members 190.

The light transmission patterns 3303, the wavelength converting patterns (340_5 and 350_3), and the planarization patterns 360_5 may be positioned on the first capping layer 391a.

The light transmission patterns 330_3 may be positioned in first light-emitting areas LA1, first wavelength converting patterns 3405 may be positioned in second light-emitting areas LA2, second wavelength converting patterns 350_3 may be positioned in third light-emitting areas LA3, and the planarization patterns 360_5 may be positioned in third light blocking areas BA3. The first wavelength converting patterns 3405 may be further positioned in their neighboring light blocking areas (BA1 and BA2).

In some embodiments, the light transmission patterns 330_3, first wavelength converting patterns 340_5, second wavelength converting patterns 3503, and the planarization patterns 360_5 may be formed as stripes, as illustrated in FIG. 14.

The formation of the light transmission patterns 3303, first wavelength converting patterns 340_5, second wavelength converting patterns 350_3, and the planarization patterns 360_5, the order in which to form the light transmission patterns 330_3, first wavelength converting patterns 340_5, second wavelength converting patterns 3503, and the planarization patterns 360_5, and whose top surfaces the light transmission patterns 3303, first wavelength converting patterns 340_5, second wavelength converting patterns 3503, and the planarization patterns 360_5 are in contact with are substantially the same as described above with reference to FIG. 5, and thus, detailed descriptions thereof will be omitted.

A second capping layer 393a may be positioned on the light transmission patterns 330_3 the first wavelength converting patterns 340_5, the second wavelength converting patterns 350_3, and the planarization patterns 360_5. The second capping layer 393a may cover the light transmission patterns 330_3, the first wavelength converting patterns 340_5, the second wavelength converting patterns 3503, and the planarization patterns 360_5. The second capping layer 393a is as already described above, and thus, a detailed description thereof will be omitted.

The color filters (231_2, 233_2, and 235_2) and the color patterns (251_1, 252_1, and 253_1) may be positioned on the second capping layer 393a. First color filters 231_2 may be positioned in the first light-emitting areas LA1, second color filters 233_2 may be positioned in the second light-emitting areas LA2, and third color filters 235_2 may be positioned in the third light-emitting areas LA3. The color patterns (251_1, 252_1, and 253_1) may be positioned in a non-light-emitting areas NLA. The color patterns (251_1, 252_1, and 253_1) may be disposed to overlap with the display light blocking members 190 in a plan view and may be arranged in a lattice shape, as illustrated in FIG. 11. The color patterns (251_1, 252_1, and 253_1) are substantially the same as the color patterns 250 of the display device 1, and thus, a detailed description thereof will be omitted.

Light blocking members (221_2, 222_2, and 223_2) may be positioned on the color patterns (251_1, 252_1, and 253_1). The light blocking members (221_2, 222_2, and 223_2) may be positioned in the non-light-emitting areas NLA and may block the transmission of light. In some embodiments, the light blocking members (221_2, 222_2, and 223_2) may be arranged in a lattice shape, as illustrated in FIG. 12.

A second base portion 310 may be disposed on the display substrate 10*a*. The display substrate 10*a* and the second base portion 310 may face each other. A filler 70 may be positioned between the display substrate 10*a* and the second base portion 310.

The second base portion 310 and the filler 70 may not be provided.

In the case of the display device 7, alignment error between members in each light-emitting area (e.g., alignment error between light-emitting elements and wavelength converting patterns or between a pixel-defining film and light blocking members) can be reduced.

Figure 35:
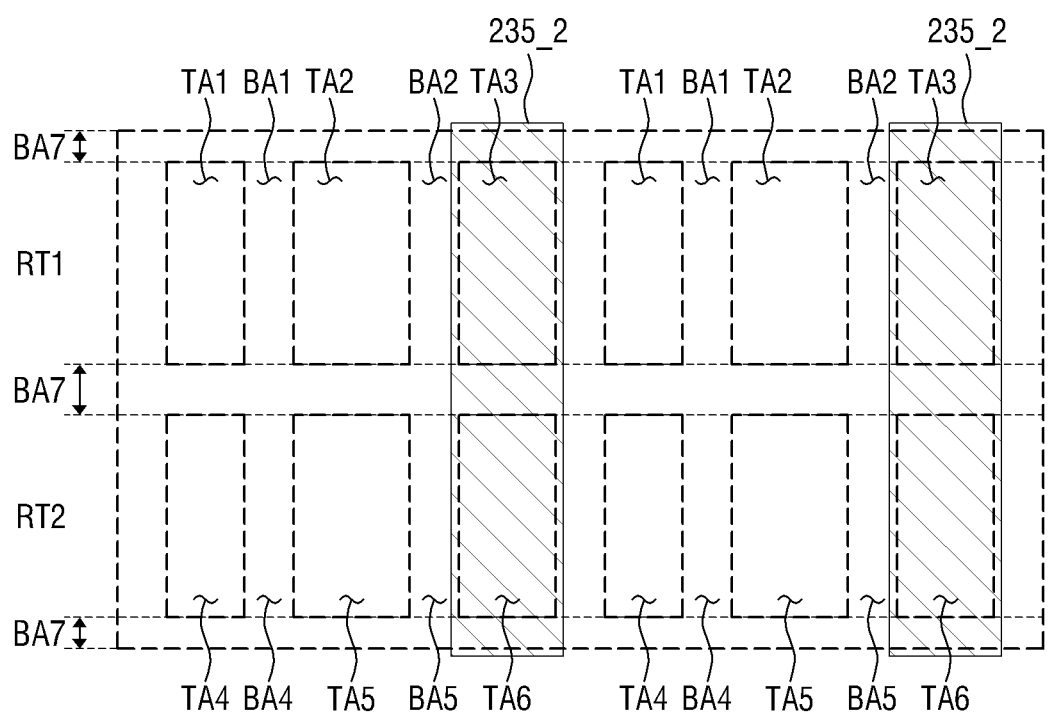
FIG. 35 is a plan view illustrating the layout of third color filters in a display device according to another embodiment of the present disclosure.
Figure 36:
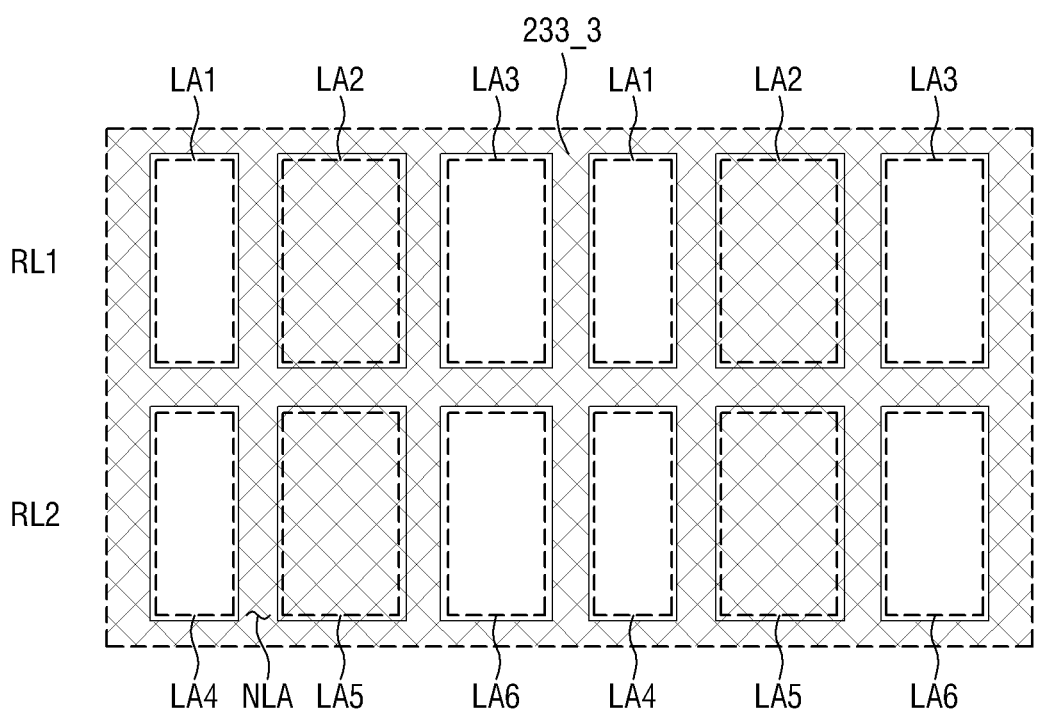
FIG. 36 is a plan view illustrating the layout of second color filters in the display device according to another embodiment of the present disclosure.
Figure 37:
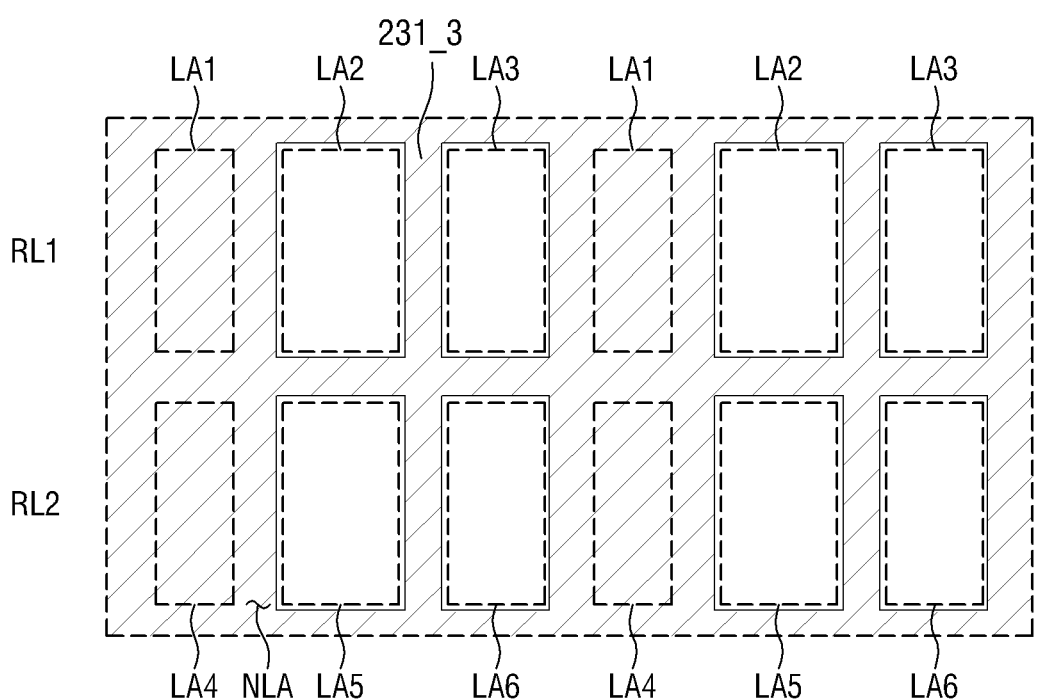
FIG. 37 is a plan view illustrating the layout of first color filters in the display device according to another embodiment of the present disclosure.

FIGS. 30 through 34 are cross-sectional views of display devices according to other embodiments of the present disclosure, FIG. 35 is a plan view illustrating the layout of third color filters in a display device according to another embodiment of the present disclosure, FIG. 36 is a plan view illustrating the layout of second color filters in the display device according to another embodiment of the present disclosure, and FIG. 37 is a plan view illustrating the layout of first color filters in the display device according to another embodiment of the present disclosure.

Referring to FIGS. 30 through 37, a display substrate 10*b* of a display device 8 differs from its counterpart of FIG. 29 in that lower light blocking members 220_2 are not provided and second color filters 233_3 are further disposed in their neighboring non-light-emitting areas NLA.

Specifically, the display substrate 10*b* of the display device 8 may not include lower light blocking members 220_2, the second color filters 233_3 may be further disposed in their neighboring non-light-emitting areas NLA, and first color filters 231_3 may be further disposed in their neighboring non-light-emitting areas NLA. As illustrated in FIG. 37, the first color filters 231_3 may be disposed in first light-emitting areas LA1 and fourth light-emitting areas LA4 and in the non-light-emitting areas NLA, but not in second light-emitting areas LA2, fifth light-emitting areas LA5, third light-emitting areas LA3, and sixth light-emitting areas LA6, and the second color filters 233_3 may be disposed in the second light-emitting areas LA2 and the fifth light-emitting areas LA5 and in the non-light-emitting areas NLA, but not in the first light-emitting areas LA1, the fourth light-emitting areas LA4, the third light-emitting areas LA3, and the sixth light-emitting areas LA6.

Figure 30:
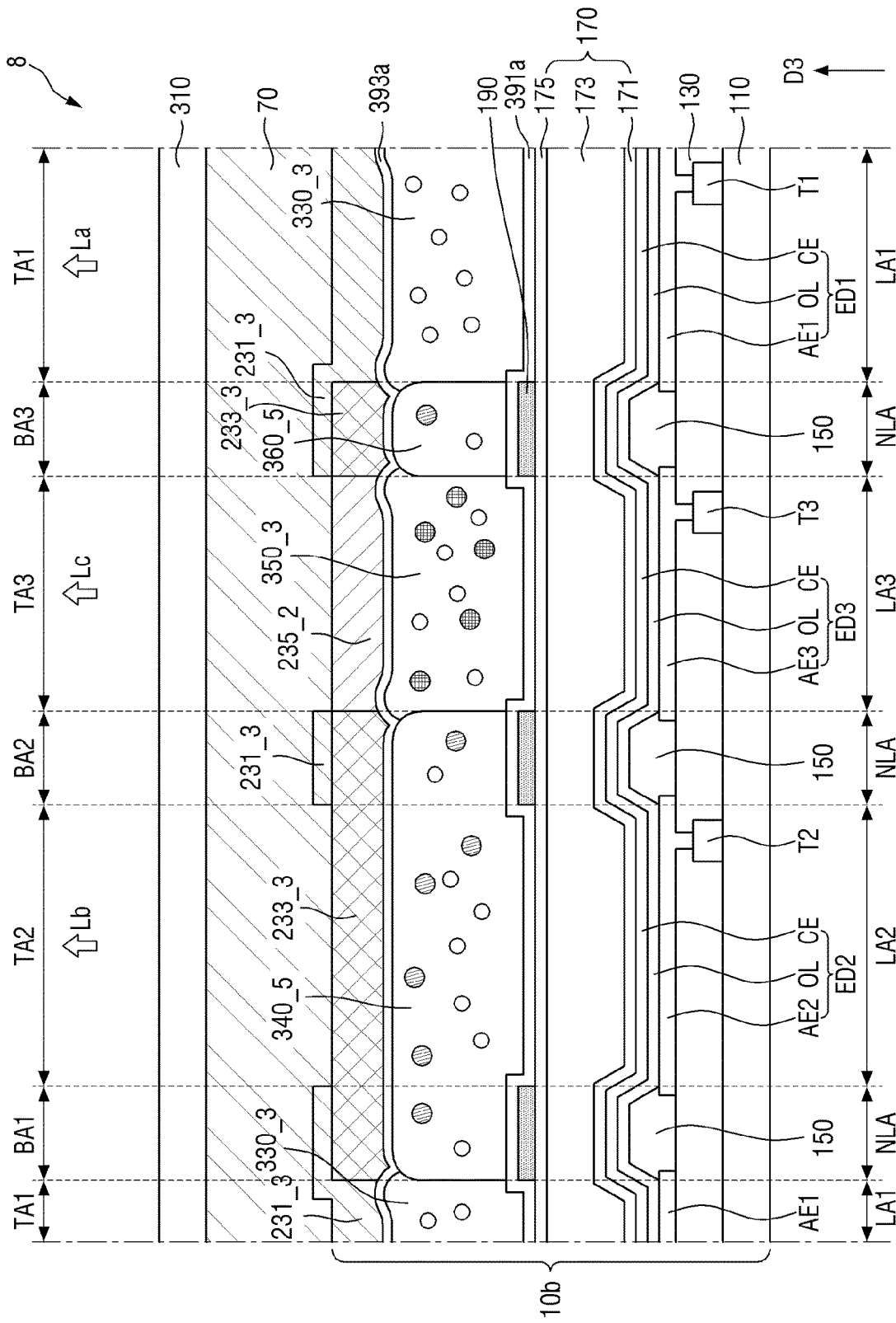
FIGS. 30 through 34 are cross-sectional views of display devices according to other embodiments of the present disclosure.
Figure 31:
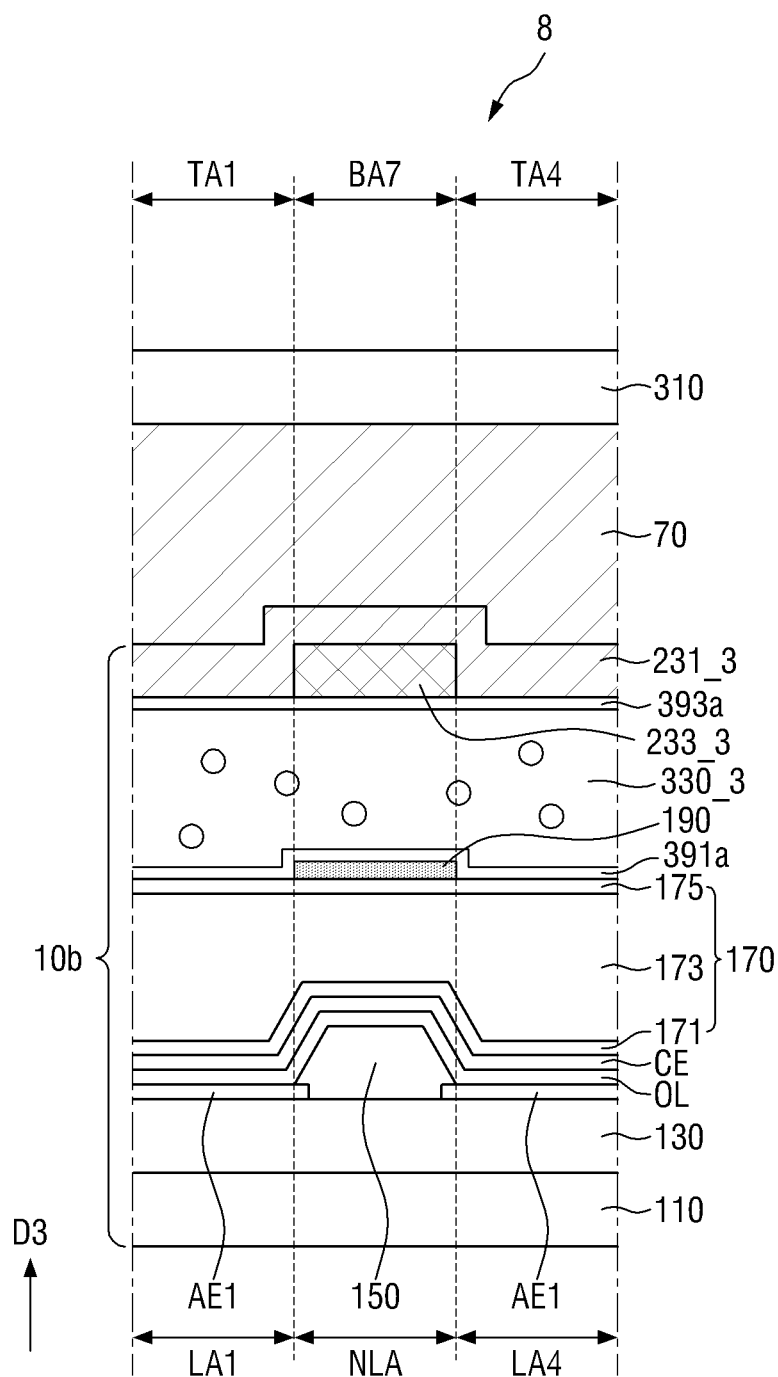
Figure 32:
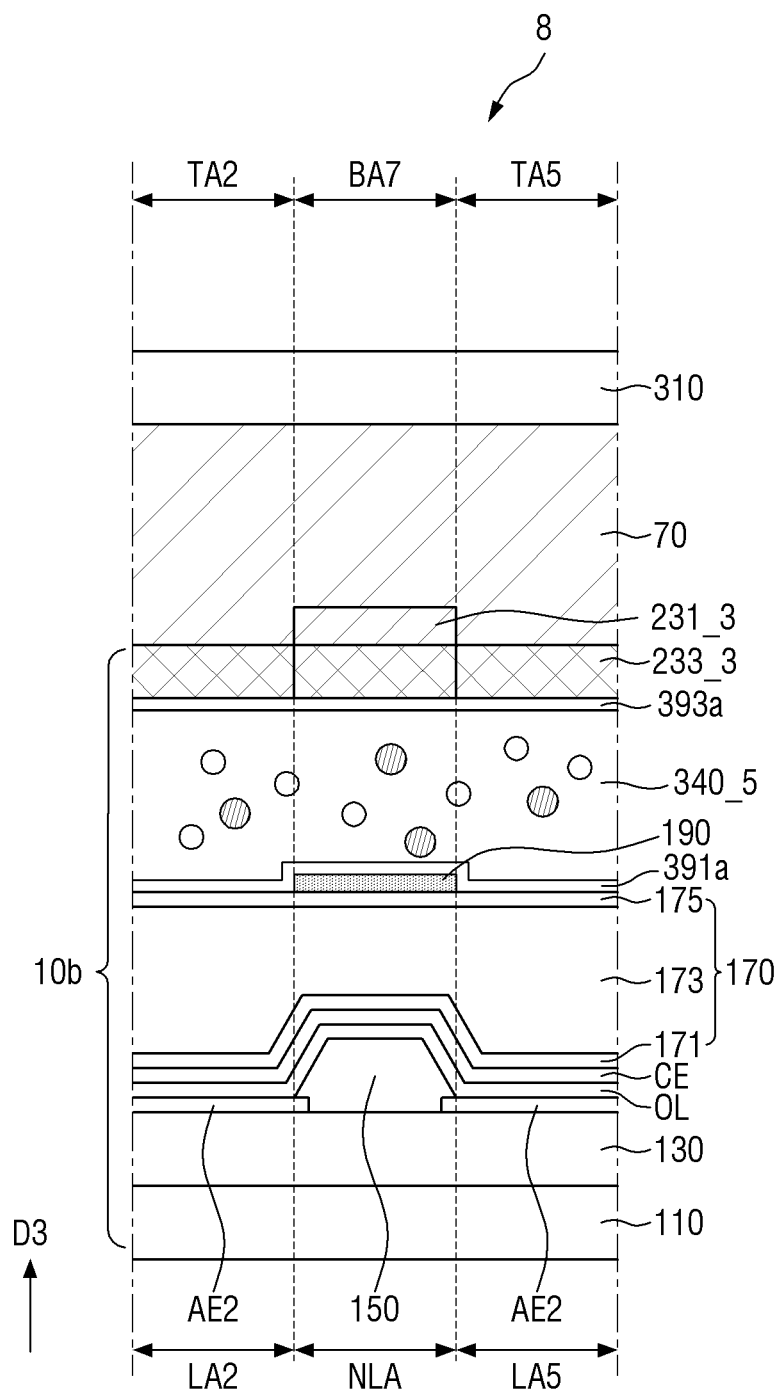
Figure 33:
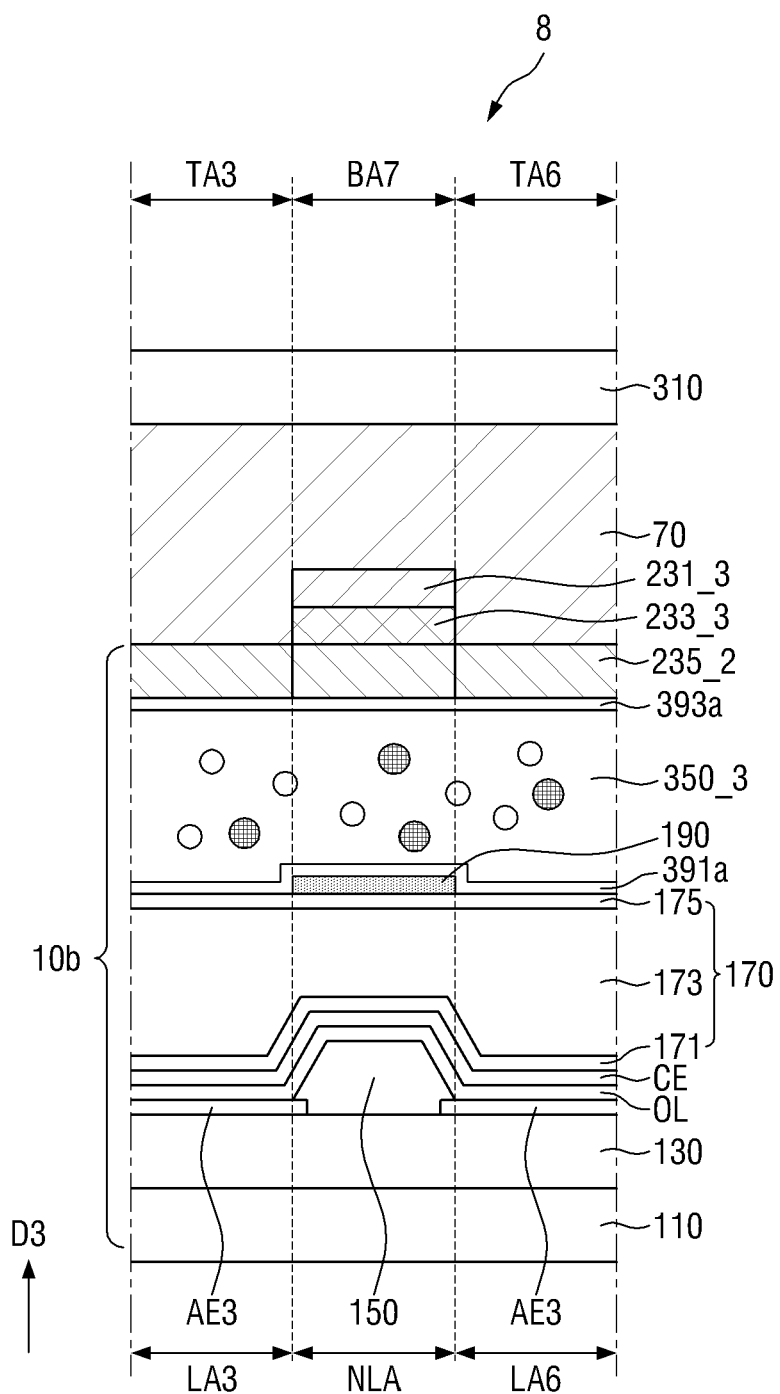
Figure 34:
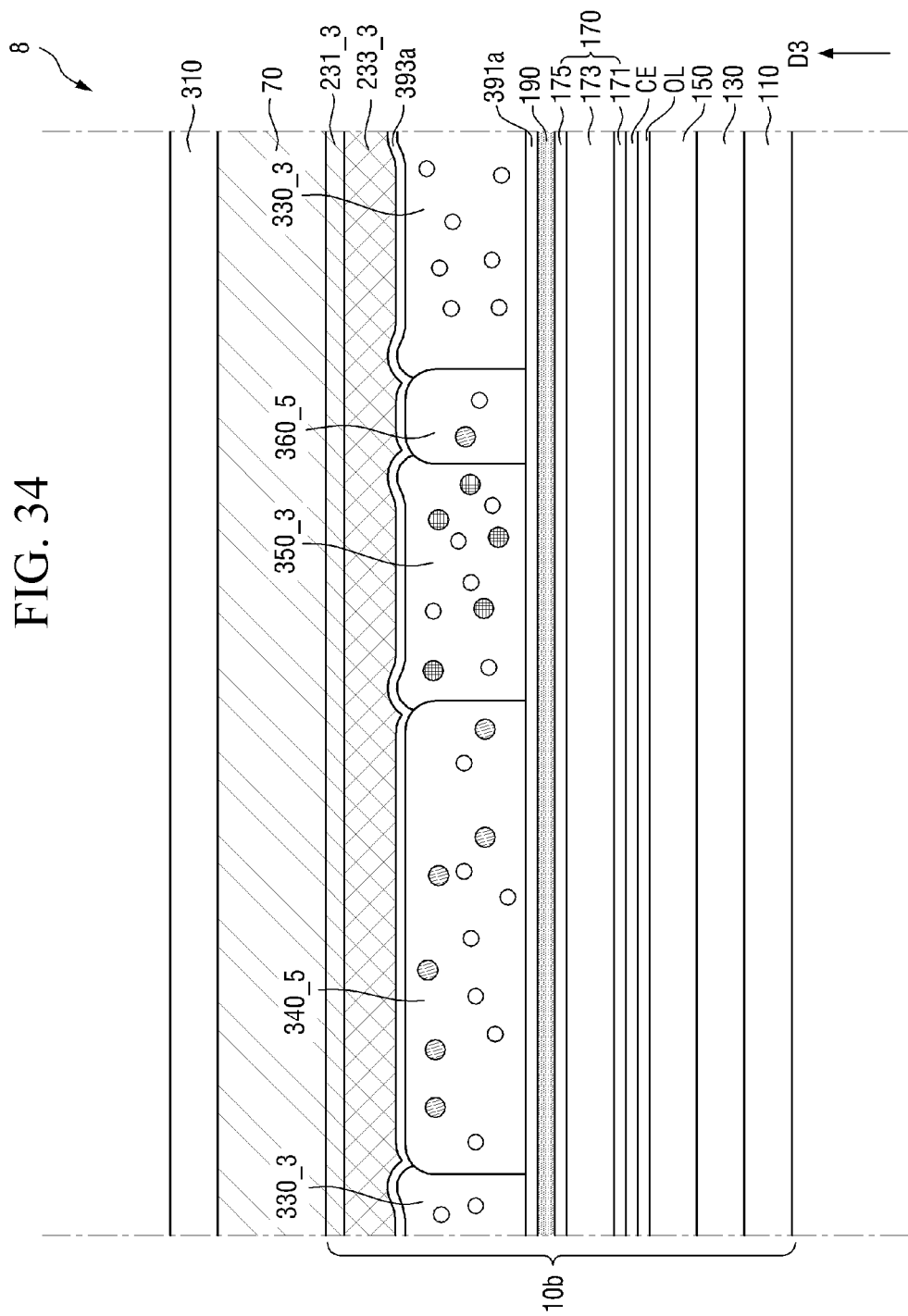

As illustrated in FIGS. 30 through 34, the second color filters 233_3 may be disposed to overlap with the first color filters 231_3, in the non-light-emitting areas NLA. The first color filters 231_3 may cover, and be in direct contact with, the top surfaces of the second color filters 233_3, in the non-light-emitting areas NLA. First color filters 231_3 disposed in the first light-emitting areas LA1 and first color filters 2313 disposed to overlap with the second color filters 233_3, in the non-light-emitting area NLA, may be integrally formed with, and physically connected to, one another, as illustrated in FIG. 30. According to the embodiment of FIGS. 30 through 34, as the first color filters 231_3 and the second color filters 233_3 are stacked, the transmission of light can be blocked in the non-light-emitting areas NLA.

Figure 38:
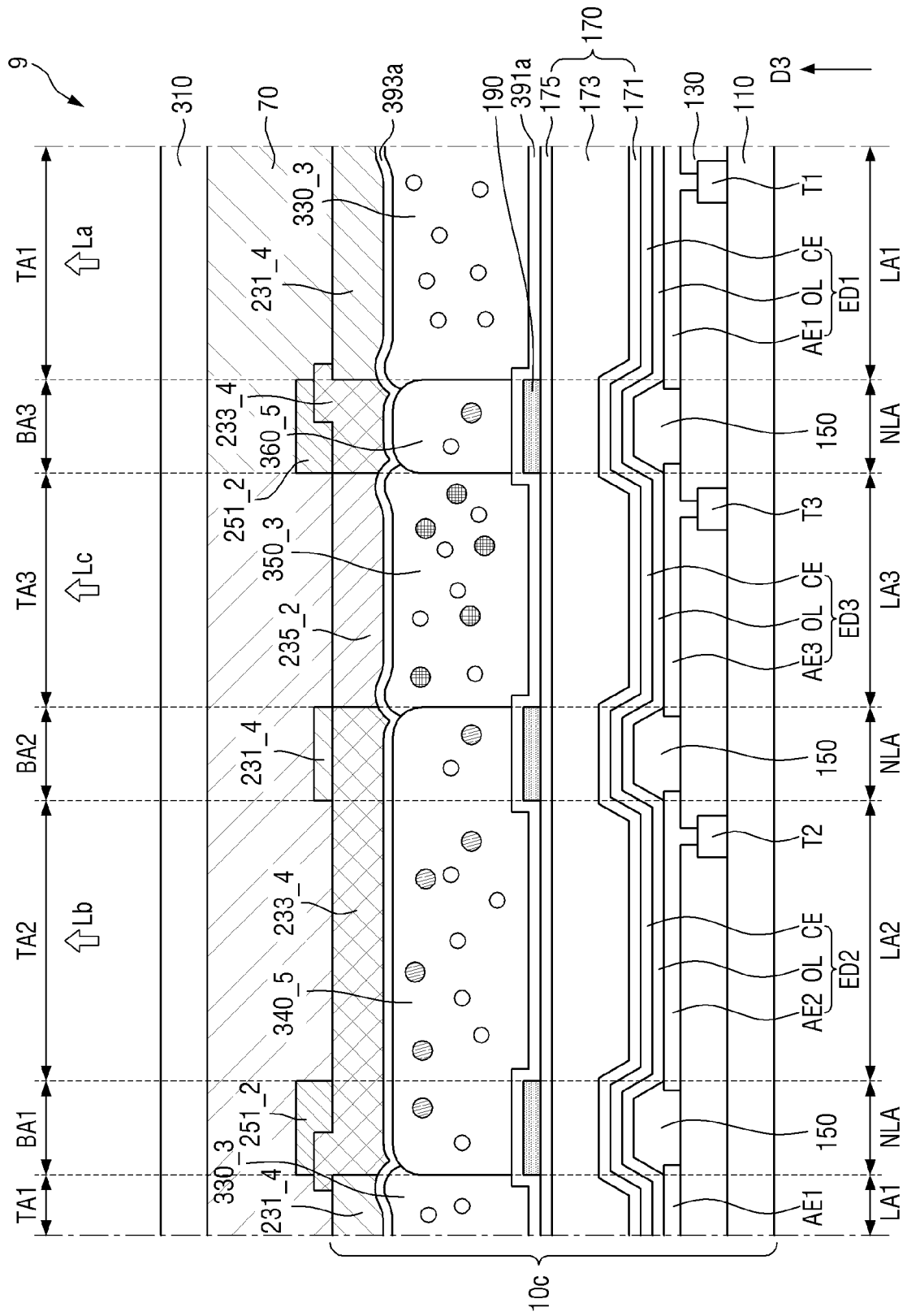
FIG. 38 is a cross-sectional view of a display device according to another embodiment of the present disclosure.

FIG. 38 is a cross-sectional view of a display device according to another embodiment of the present disclosure.

Referring to FIG. 38, a display substrate 10*c* of a display device 9 differs from its counterpart of FIG. 37 in that first color filters 231_4 disposed in non-light-emitting areas NLA to overlap with second color filters 251_2 (or color patterns) in a plan view, and first color filters 231_4 disposed in first light-emitting areas LA1 are physically spaced apart from one another.

Specifically, the first color filters 231_4 disposed in the non-light-emitting areas NLA to overlap with the second color filters 251_2 (or color patterns) in a plan view and the first color filters 231_4 disposed in the first light-emitting areas LA1 may be physically spaced apart from one another. Also, the first color filters 2314 may extend further into the first light-emitting areas LA1 to be disposed in parts of the first light-emitting areas LA1 adjacent to the non-light-emitting areas NLA.

Figure 39:
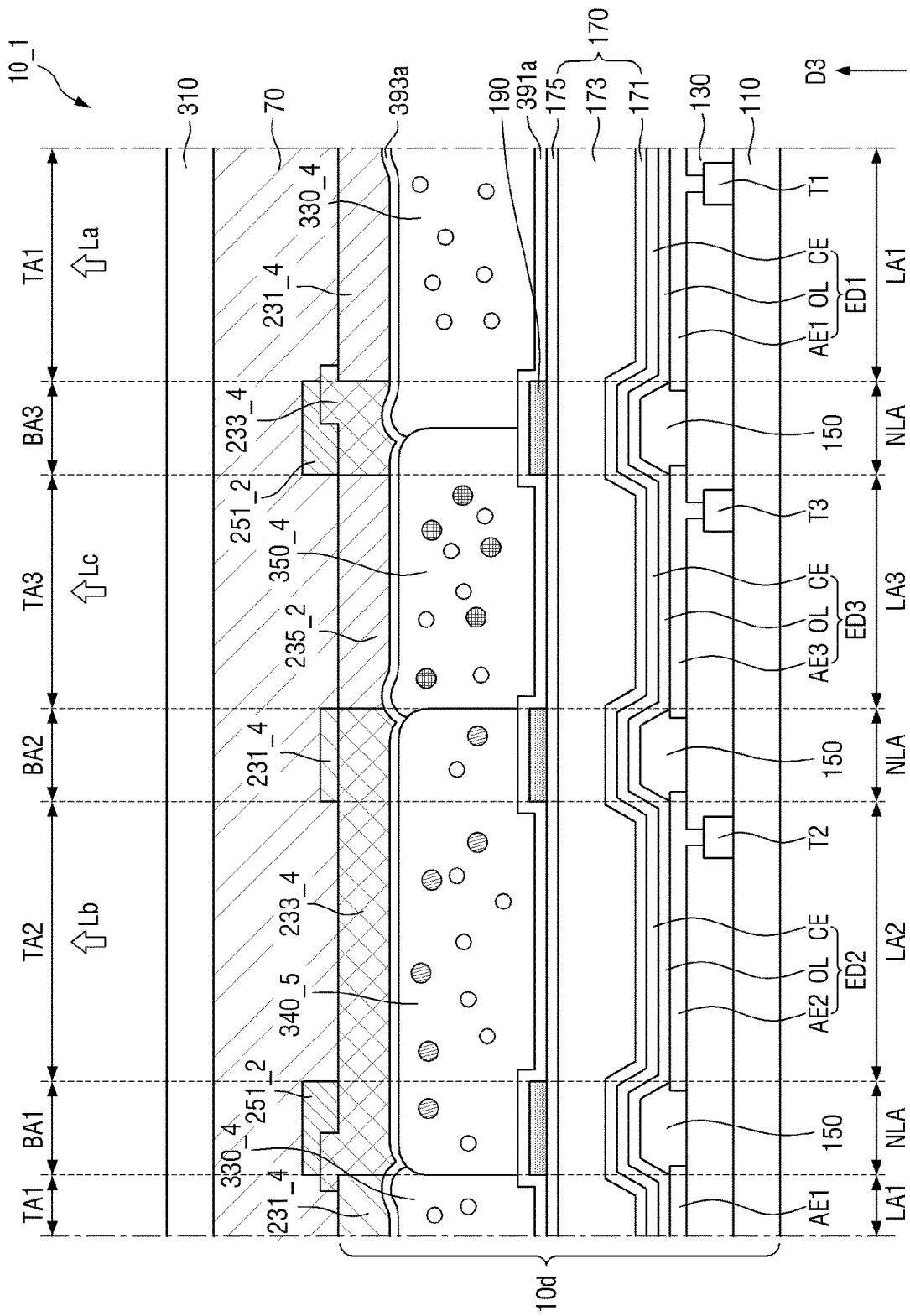
FIG. 39 is a cross-sectional view of a display device according to another embodiment of the present disclosure.

FIG. 39 is a cross-sectional view of a display device according to another embodiment of the present disclosure.

Referring to FIG. 39, a display substrate 10*d* of a display device 10_1 differs from its counterpart of FIG. 38 in that planarization patterns are not provided in non-light-emitting areas LNA, between second wavelength converting patterns 350_4 and light transmission patterns 330_4.

Specifically, the light transmission patterns 330_4 may be disposed to overlap with the second wavelength converting patterns 350_4 and the non-light-emitting areas NLA between the second wavelength converting patterns 350_4 and the light transmission patterns 330_4 in a plan view. The light transmission patterns 330_4 may partially cover, and be in direct contact with, the top surfaces of the second wavelength converting patterns 350_4.

Figure 40:
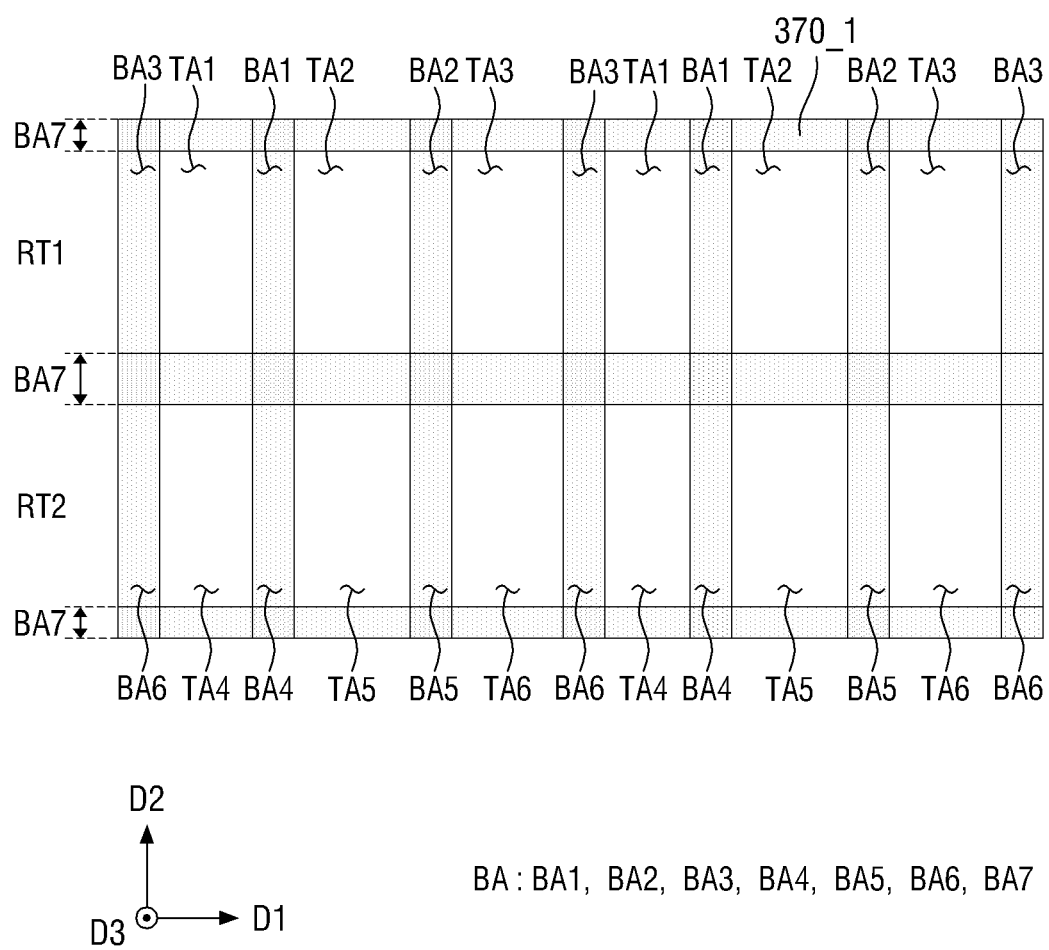
FIG. 40 is a plan view illustrating the layout of upper light blocking members in a color converting substrate of a display device according to another embodiment of the present disclosure.
Figure 41:
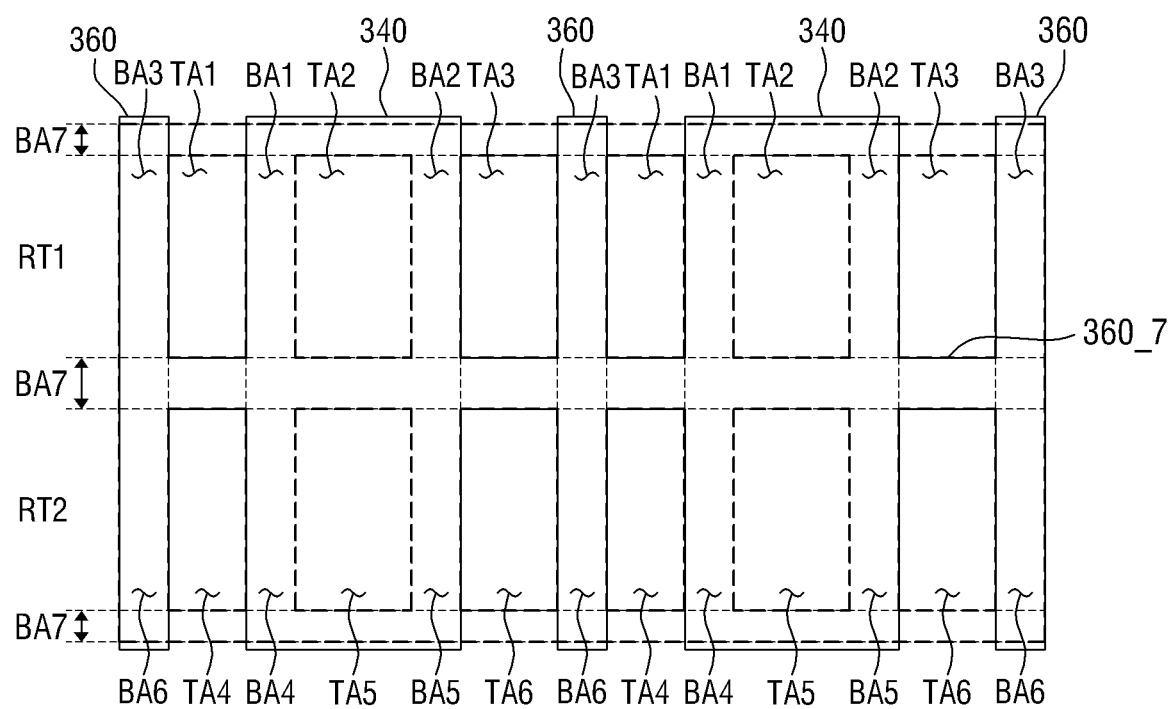
FIG. 41 is a plan view illustrating the layout of first wavelength converting patterns, first wavelength converting patterns, and first planarization patterns in the display device according to another embodiment of the present disclosure.

FIG. 40 is a plan view illustrating the layout of upper light blocking members in a color converting substrate of a display device according to another embodiment of the present disclosure, and FIG. 41 is a plan view illustrating the layout of first wavelength converting patterns, first wavelength converting patterns, and first planarization patterns in the display device according to another embodiment of the present disclosure.

Referring to FIGS. 40 and 41, the embodiment of FIGS. 40 and 41 differs from the embodiment of FIG. 14 in that upper light blocking members 370_1 and planarization patterns (360_7 and 360) form a lattice shape in a plan view.

Specifically, the upper light blocking members 370_1 may form a lattice shape in a plan view. The upper light blocking members 370_1 may be further disposed in seventh light blocking areas BA7.

As illustrated in FIG. 41, planarization patterns 360 may be formed as stripes extending in a first direction D1, and planarization patterns 360_7 may be further disposed in the seventh light blocking areas BA7 to generally form a lattice shape in a plan view, together with the planarization patterns 360.

FIG. 42 is a cross-sectional view of a display device according to another embodiment of the present disclosure.

Referring to FIG. 42, the embodiment of FIG. 42 differs from the embodiment of FIG. 29 in that display light blocking members 190 are not provided.

Specifically, a display substrate 10*e* of a display device 11 may not include display light blocking members 190.

As planarization patterns 360_5 are disposed in non-light-emitting areas NLA, first wavelength converting patterns 340_5 and light transmission patterns 330_3 are disposed to overlap with one another in a plan view, and the first wavelength converting patterns 340_5 and second wavelength converting patterns 350_3 are disposed to overlap with one another in a plan view, the colors of beams of light emitted from neighboring light-emitting areas LA can be prevented from being mixed.

While the subject matter of the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims, and equivalents thereof. The exemplary embodiments should be considered in a descriptive sense only and not for purposes of limitation.

What is claimed is:

1. A color converting substrate comprising:
a base portion having, defined thereon, a first light transmission area, a first light blocking area, and a second light transmission area, which are sequentially arranged along a first direction;
a first wavelength converting pattern positioned on the base portion and configured to wavelength-convert light of a first color into light of a second color;
a second wavelength converting pattern positioned on the base portion and configured to wavelength-convert the light of the first color into light of a third color; and
a light transmission pattern positioned on the base portion and configured to transmit the light of the first color therethrough,
wherein
one of the first wavelength converting pattern, the second wavelength converting pattern, and the light transmission pattern is disposed in the first light-blocking area,
another one of the first wavelength converting pattern, the second wavelength converting pattern, and the light transmission pattern is disposed in the first light transmission area,
yet another one of the first wavelength converting pattern, the second wavelength converting pattern, and the light transmission pattern is disposed in the second light transmission area,
a third light transmission area, which is spaced apart, along the first direction, from the first light blocking area with the first light transmission area interposed therebetween, is further defined on the base portion, and
the first wavelength converting pattern is disposed in the third light transmission area of the base portion.

2. The color converting substrate of claim 1, wherein
the first wavelength converting pattern is disposed in the first light blocking area,
the second wavelength converting pattern is disposed in the first light transmission area, and
the light transmission pattern is disposed in the second light transmission area.

3. The color converting substrate of claim 2, further comprising:
an upper light blocking member disposed in the first light blocking area of the base portion to overlap with the first wavelength converting pattern in a plan view,
wherein the first wavelength converting pattern is disposed between the upper light blocking member and the base portion.

4. The color converting substrate of claim 1, wherein
a second light blocking area is further defined on the base portion, between the third light transmission area and the first light transmission area,
the first wavelength converting pattern is further disposed in the second light blocking area of the base portion, and
the upper light blocking member is disposed to overlap with the first wavelength converting pattern, in the second light blocking area of the base portion in the plan view.

5. The color converting substrate of claim 4, wherein
a third light blocking area, which is spaced apart, along the first direction, from the second light blocking area with the third light transmission area interposed therebetween, is further defined on the base portion, and
the first wavelength converting pattern is disposed in the third light blocking area of the base portion.

6. The color converting substrate of claim 5, wherein each of the light transmission areas and each of the light blocking areas are formed as stripes extending in a second direction intersecting the first direction.

7. The color converting substrate of claim 6, wherein
the first color is blue,
the second color is red, and
the third color is green.

8. The color converting substrate of claim 7, further comprising:
a lower light blocking member disposed in the first, second, and third light blocking areas of the base portion to overlap with the first wavelength converting pattern in the plan view, in each of the light blocking areas,
wherein the lower light blocking member is disposed between the base portion and the first wavelength converting pattern.

9. The color converting substrate of claim 8, wherein
the lower light blocking member is disposed directly on the base portion.

10. The color converting substrate of claim 8, further comprising:
a color filter layer disposed between the base portion and the lower light blocking member,
wherein the color filter layer includes a blue color filter, which is disposed in the first light transmission area, a green color filter, which is disposed in the second light transmission area, and a red color filter, which is disposed in the third light transmission area.

11. The color converting substrate of claim 10, wherein the blue color filter is further disposed in the first, second, and third light blocking areas and is in direct contact with the lower light blocking member, in each of the light blocking areas.

12. The color converting substrate of claim 6, wherein
the first and second wavelength converting patterns are in contact with each other, and
the first wavelength converting pattern and the light transmission pattern are in contact with each other.

13. The color converting substrate of claim 12, wherein the second wavelength converting pattern and the light transmission pattern partially cover a bottom surface of the first wavelength converting pattern.

14. The color converting substrate of claim 12, wherein
the first wavelength converting pattern partially covers a bottom surface of the second wavelength converting pattern, and
the light transmission pattern partially covers a bottom surface of the first wavelength converting pattern.

15. The color converting substrate of claim 12, wherein the first wavelength converting pattern partially covers bottom surfaces of the light transmission pattern and the second wavelength converting pattern.

16. The color converting substrate of claim 12, wherein
the first wavelength converting pattern partially covers a bottom surface of the light transmission pattern, and
the second wavelength converting pattern partially covers a bottom surface of the first wavelength converting pattern.

17. The color converting substrate of claim 5, wherein
a fourth light blocking area, which extends in a second direction intersecting the first direction and is arranged along the first direction, is further defined on the base portion,
the first wavelength converting pattern and the upper light blocking member are further disposed in the fourth light blocking area of the base portion, and
each of the first wavelength converting pattern and the upper light blocking member forms a lattice shape in the plan view.

18. The color converting substrate of claim 1, wherein
the light transmission pattern is disposed in the first light blocking area,
the first wavelength converting pattern is disposed in the first light transmission area, and
the second wavelength converting pattern is disposed in the second light transmission area.

19. The color converting substrate of claim 18, further comprising:
an upper light blocking member disposed in the first light blocking area of the base portion to overlap with the light transmission pattern in a plan view,
wherein
the light transmission pattern is disposed between the upper light blocking member and the base portion,
a third light transmission area, which is spaced apart, in the first direction, from the first light blocking area with the first light transmission area interposed therebetween, is further defined on the base portion, and
the light transmission pattern is disposed in the third light transmission area of the base portion.

20. The color converting substrate of claim 19, wherein
a second light blocking area, which is between the third light transmission area and the first light transmission area, and a third light blocking area, which is spaced apart, in the first direction, from the first light blocking area with the second light transmission area interposed therebetween, are further defined on the base portion,
the light transmission pattern is further disposed in the second light blocking area of the base portion, and
the upper light blocking member is disposed to overlap with the first wavelength converting pattern, in the second light blocking area of the base portion.

21. A display device comprising:
a display substrate;
a color converting substrate facing the display substrate; and
a filler disposed between the color converting substrate and the display substrate,
wherein
the display substrate includes a first base portion and light-emitting elements disposed on the first base portion,
the color converting substrate includes a second base portion having, defined thereon, a first light transmission area, a first light blocking area, and a second light transmission area, which are sequentially arranged along a first direction, a first wavelength converting pattern positioned on the second base portion and configured to wavelength-convert light of a first color into light of a second color, a second wavelength converting pattern positioned on the second base portion and configured to wavelength-convert the light of the first color into light of a third color, and a light transmission pattern positioned on the second base portion and configured to transmit the light of the first color therethrough,
the first wavelength converting pattern is disposed in the first light blocking area,
the second wavelength converting pattern is disposed in the first light transmission area,
the light transmission pattern is disposed in the second light transmission area,
a third light transmission area, which is spaced apart, along the first direction, from the first light blocking area with the first light transmission area interposed therebetween, is further defined on the base portion, and
the first wavelength converting pattern is disposed in the third light transmission area of the base portion.

22. The display device of claim 21, further comprising:
an upper light blocking member disposed in the first light blocking area of the base portion to overlap with the first wavelength converting pattern in a plan view,
wherein
the first wavelength converting pattern is disposed between the upper light blocking member and the base portion.

23. The display device of claim 22, further comprising:
a thin-film encapsulation layer disposed between the light-emitting elements and the filler.

24. A display device comprising:
a base portion having, defined thereon, a first light transmission area, a first light blocking area, and a second light transmission area, which are sequentially arranged along a first direction;
light-emitting elements disposed on the base portion;
a first wavelength converting pattern positioned on the base portion and configured to wavelength-convert light of a first color into light of a second color;
a second wavelength converting pattern positioned on the base portion and configured to wavelength-convert the light of the first color into light of a third color; and
a light transmission pattern positioned on the base portion and configured to transmit the light of the first color therethrough,
wherein
the first wavelength converting pattern is disposed in the first light blocking area,
the second wavelength converting pattern is disposed in the first light transmission area, and
the light transmission pattern is disposed in the second light transmission area,
a third light transmission area, which is spaced apart, in the first direction, from the first light blocking area with the first light transmission area interposed therebetween, is further defined on the base portion, and
the first wavelength converting pattern is disposed in the third light transmission area of the base portion.

25. The display device of claim 24, wherein
a second light blocking area, which is between the third light transmission area and the first light transmission area, is further defined on the base portion, and
the first wavelength converting pattern is further disposed in the second light blocking area of the base portion.

26. The display device of claim 25, wherein
a third light blocking area, which is spaced apart, in the first direction, from the second light blocking area with the third light transmission area interposed therebetween, is further defined on the base portion, and the first wavelength converting pattern is disposed in the third light blocking area of the base portion.

27. The display device of claim 26, wherein each of the light transmission areas and each of the light blocking areas are formed as stripes extending in a second direction intersecting the first direction.

28. The display device of claim 27, wherein
the first color is blue,
the second color is red, and
the third color is green.

29. The display device of claim 28, further comprising:
a first color filter spaced apart from the light-emitting elements with the first wavelength converting pattern interposed therebetween, in the first light blocking area,
a second color filter spaced apart from the light-emitting elements with the second wavelength converting patterns interposed therebetween, in the first light transmission area, and
a third color filter spaced apart from the light-emitting elements with the light transmission pattern interposed therebetween, in the second light transmission area,
wherein the third color filter extends into the first light blocking area and is disposed to overlap with the first color filter in a plan view.

30. The display device of claim 29, wherein in the second light blocking area, the third color filter is disposed on the first color filter to overlap with the first color filter in the plan view.

31. The display device of claim 29, wherein in the third light blocking area, the third color filter is disposed on the first color filter to overlap with the first color filter in the plan view.

32. The display device of claim 31, wherein
the third light blocking area, the third light transmission area, the second light blocking area, the first light transmission area, the first light blocking area, and the second light transmission area are repeatedly arranged, and
the third color filter in the third light blocking area and the third color filter in the second light transmission area adjacent to the third light blocking area are physically connected.

33. The display device of claim 31, wherein
the third light blocking area, the third light transmission area, the second light blocking area, the first light transmission area, the first light blocking area, and the second light transmission area are repeatedly arranged,
the first color filter in the third light blocking area extends into the second light transmission area adjacent to the third light blocking area, and
the third color filter in the third light blocking area and the third color filter in the second light transmission area adjacent to the third light blocking area are physically spaced apart from each other.

* * * * *